United States Patent
Matsuyama et al.

(10) Patent No.: US 11,257,676 B2
(45) Date of Patent: Feb. 22, 2022

(54) GALLIUM NITRIDE BASED SEMICONDUCTOR DEVICE AND MANUFACTURING METHOD OF GALLIUM NITRIDE BASED SEMICONDUCTOR DEVICE

(71) Applicant: FUJI ELECTRIC CO., LTD., Kanagawa (JP)

(72) Inventors: Hideaki Matsuyama, Hino (JP); Shinya Takashima, Hachioji (JP); Katsunori Ueno, Matsumoto (JP); Ryo Tanaka, Hino (JP); Masaharu Edo, Tokorozawa (JP); Daisuke Mori, Hino (JP); Hirotaka Suda, Hachioji (JP); Hideaki Teranishi, Hachioji (JP); Chizuru Inoue, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/021,036

(22) Filed: Jun. 28, 2018

(65) Prior Publication Data
US 2019/0006184 A1    Jan. 3, 2019

(30) Foreign Application Priority Data
Jan. 19, 2018  (JP) .............................. JP2018-007211

(51) Int. Cl.
| | |
|---|---|
| *H01L 21/28* | (2006.01) |
| *H01L 21/02* | (2006.01) |
| *H01L 29/51* | (2006.01) |
| *H01L 29/66* | (2006.01) |
| *H01L 29/78* | (2006.01) |

(Continued)

(52) U.S. Cl.
CPC ...... *H01L 21/28264* (2013.01); *H01L 21/022* (2013.01); *H01L 21/0228* (2013.01);
(Continued)

(58) Field of Classification Search
CPC ......... H01L 21/28264; H01L 21/02164; H01L 21/02178; H01L 21/022; H01L 21/02214;
(Continued)

(56) References Cited

U.S. PATENT DOCUMENTS

| | | | |
|---|---|---|---|
| 2013/0168690 A1 | 7/2013 | Ikarashi | |
| 2015/0279982 A1* | 10/2015 | Yamamoto | ........ H01L 29/42316 257/76 |
| 2018/0061954 A1* | 3/2018 | Watanabe | ............. H01L 29/513 |

FOREIGN PATENT DOCUMENTS

| | | |
|---|---|---|
| JP | 2013140866 A | 7/2013 |
| WO | 2016151704 A1 | 9/2016 |

* cited by examiner

*Primary Examiner* — Sue A Purvis
*Assistant Examiner* — Scott Stowe

(57) ABSTRACT

A gallium nitride based semiconductor device is provided, where when a thickness of a transition layer is defined as the followings, the thickness of the transition layer is less than 1.5 nm: (i) a distance between a depth position at which an atomic composition of nitrogen element constituting the gallium nitride based semiconductor layer is ½ relative to that at a position on the GaN based semiconductor layer side sufficiently away from the transition layer, and a depth position at which an atomic composition of a metal element is ½ of a value of a maximum if an atomic composition of the metal element constituting an insulating layer has the maximum, or a depth position at which an atomic composition of the metal element is ½ relative to that at a position on the insulating layer side sufficiently away from the transition layer if not having the maximum.

19 Claims, 35 Drawing Sheets

(51) Int. Cl.
H01L 29/423 (2006.01)
H01L 29/24 (2006.01)
H01L 29/267 (2006.01)
H01L 29/20 (2006.01)
H01L 29/08 (2006.01)
H01L 29/207 (2006.01)
H01L 21/265 (2006.01)
H01L 21/266 (2006.01)
H01L 21/225 (2006.01)

(52) U.S. Cl.
CPC .......... *H01L 21/02164* (2013.01); *H01L 21/02178* (2013.01); *H01L 21/02214* (2013.01); *H01L 21/02244* (2013.01); *H01L 21/02255* (2013.01); *H01L 21/02274* (2013.01); *H01L 21/02315* (2013.01); *H01L 21/02389* (2013.01); *H01L 21/02634* (2013.01); *H01L 29/0886* (2013.01); *H01L 29/2003* (2013.01); *H01L 29/24* (2013.01); *H01L 29/267* (2013.01); *H01L 29/4236* (2013.01); *H01L 29/513* (2013.01); *H01L 29/517* (2013.01); *H01L 29/66522* (2013.01); *H01L 29/66666* (2013.01); *H01L 29/66712* (2013.01); *H01L 29/66734* (2013.01); *H01L 29/78* (2013.01); *H01L 29/7802* (2013.01); *H01L 29/7813* (2013.01); *H01L 29/7827* (2013.01); *H01L 21/0254* (2013.01); *H01L 21/0262* (2013.01); *H01L 21/02299* (2013.01); *H01L 21/02579* (2013.01); *H01L 21/2258* (2013.01); *H01L 21/266* (2013.01); *H01L 21/26546* (2013.01); *H01L 29/207* (2013.01)

(58) Field of Classification Search
CPC ......... H01L 21/02255; H01L 21/02274; H01L 21/02634
See application file for complete search history.

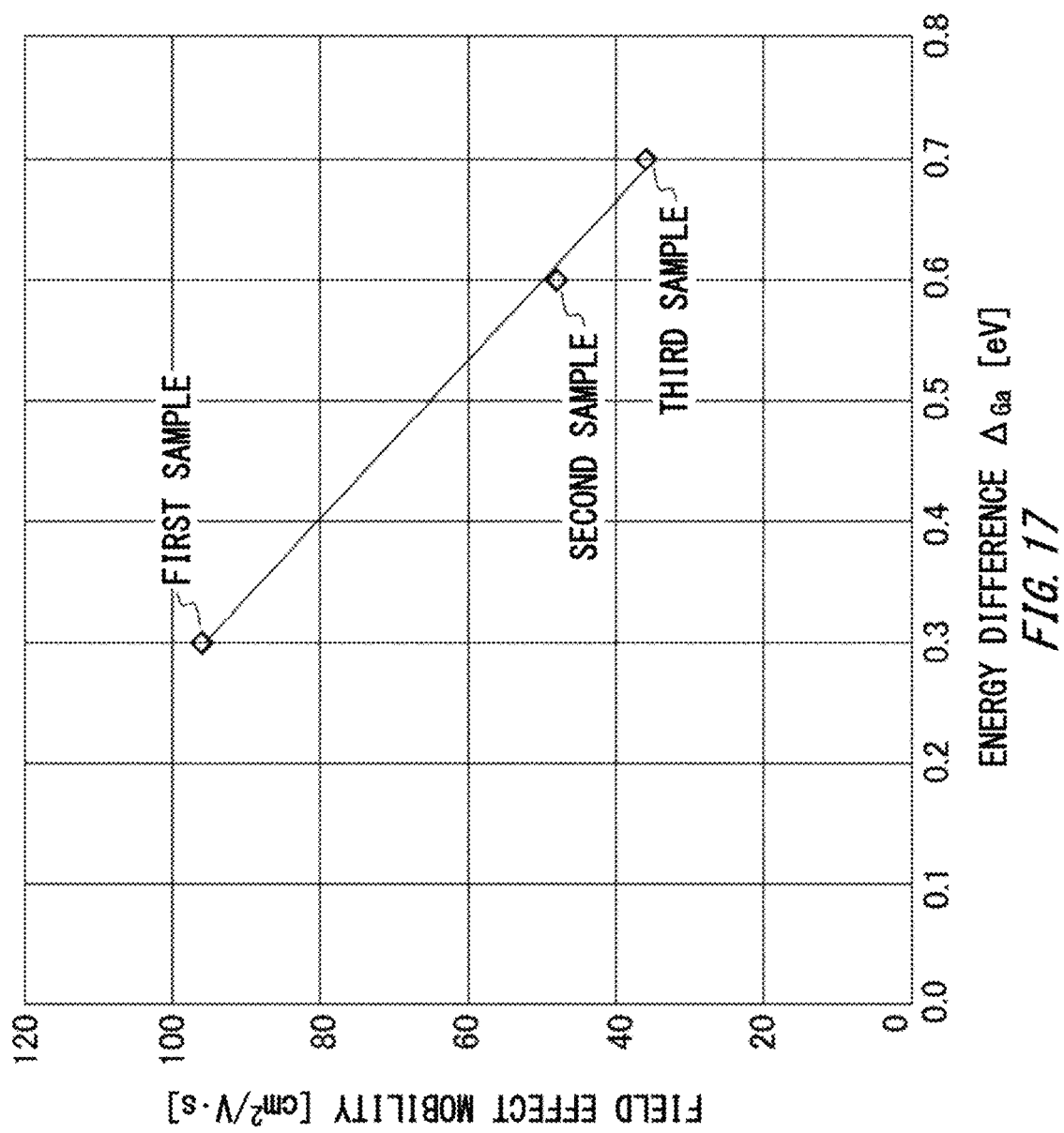

GALLIUM NITRIDE BASED SEMICONDUCTOR DEVICE AND MANUFACTURING METHOD OF GALLIUM NITRIDE BASED SEMICONDUCTOR DEVICE

The contents of the following Japanese patent applications are incorporated herein by reference:
NO. 2017-128625 filed on Jun. 30, 2017,
NO. 2018-007211 filed on Jan. 19, 2018, and
NO. 2018-122176 filed on Jun. 27, 2018.

BACKGROUND

1. Technical Field

The present invention relates to a gallium nitride based semiconductor device and a manufacturing method of the gallium nitride based semiconductor device.

2. Related Art

It has been known that to suppress formation of an interface state, in an interface region between a nitride semiconductor layer and an aluminum oxide layer, a number of tetra-coordinated Al atoms is set to be equal to or more than 30 atom %, and is less than 50 atom % relative to a total number of Al atoms (for example, refer to Patent Document 1). Also, it has been known that an oxide layer in which Ga oxide is included is provided between the nitride semiconductor and an insulating film (for example, refer to Patent Document 2).

PRIOR ART LITERATURE

Patent Document

[Patent Document 1] Japanese Patent Application Publication No. 2013-140866
[Patent Document 2] PCT International Publication No. WO2016/151704

A relation between a thickness of a transition layer formed between the gallium nitride based semiconductor layer and the insulating layer, and field effect mobility of the gallium nitride based semiconductor layer right under the transition layer has not been clarified.

SUMMARY

In a first aspect of the present invention, a gallium nitride based semiconductor device is provided. The gallium nitride based semiconductor device may include a gallium nitride based semiconductor layer of a first conductivity type, an insulating layer and a transition layer. The insulating layer may be provided on the gallium nitride based semiconductor layer. The insulating layer may include a metal element. The transition layer may be provided in the vicinity of a boundary between the gallium nitride based semiconductor layer and the insulating layer. The transition layer may be constituted of elements of the gallium nitride based semiconductor layer and the insulating layer. When a thickness of the transition layer is defined as the followings, the thickness of the transition layer may be less than 1.5 nm: (i) a distance between a depth position at which an atomic composition of nitrogen element constituting the gallium nitride based semiconductor layer is ½ relative to an atomic composition of nitrogen element at a position on the gallium nitride based semiconductor layer side sufficiently away from the transition layer, and a depth position on the gallium nitride based semiconductor layer side at which an atomic composition of the metal element constituting the insulating layer is ½ of a value of the maximum if an atomic composition of the metal element constituting the insulating layer has the maximum in an atomic composition distribution, or a depth position at which an atomic composition of the metal element constituting the insulating layer is ½ relative to an atomic composition of the metal element at a position on the insulating layer side sufficiently away from the transition layer if an atomic composition of the metal element constituting the insulating layer does not have the maximum in an atomic composition distribution;
or (ii) a thickness of a layer that is provided in contact with a front surface of the gallium nitride based semiconductor layer having a crystal structure and is prescribed by a contrast different from that of both of the gallium nitride based semiconductor layer and the insulating layer in a transmission electron microscope image.

In a second aspect of the present invention, a manufacturing method of the gallium nitride based semiconductor device in the first aspect including a gallium nitride based semiconductor layer, an insulating layer and a transition layer is provided. The manufacturing method of the gallium nitride based semiconductor device may include a step of forming a gallium nitride based semiconductor layer of a first conductivity type, a step of forming an aluminum containing layer on the gallium nitride based semiconductor layer as an insulating layer, and a step of forming a silicon oxide layer on the aluminum containing layer.

In a third aspect of the present invention, a manufacturing method of the gallium nitride based semiconductor device in the first aspect including a gallium nitride based semiconductor layer, an insulating layer and a transition layer is provided. The manufacturing method of the gallium nitride based semiconductor device may include a step of forming a gallium nitride based semiconductor layer of a first conductivity type, and a step of forming a silicon oxide layer on the gallium nitride based semiconductor layer as an insulating layer.

In a fourth aspect of the present invention, a gallium nitride based semiconductor device is provided. The gallium nitride based semiconductor device may include a gallium nitride based semiconductor layer, a metal oxide layer and a transition layer. The metal oxide layer may be provided on the gallium nitride based semiconductor layer. The transition layer may be provided between the gallium nitride based semiconductor layer and the metal oxide layer. The transition layer may include gallium oxide. A difference between a peak binding energy of a peak-like waveform of photoelectrons emitted from a 2p orbital of gallium atoms obtained by performing a photpelectron spectroscopic analysis on an interface region between the gallium nitride based semiconductor layer and the metal oxide layer, and a peak binding energy of a peak-like waveform of photoelectrons emitted from a 2p orbital of gallium atoms of the gallium nitride based semiconductor layer only may be equal to or less than 0.6 eV.

The summary clause does not necessarily describe all necessary features of the embodiments of the present invention. The present invention may also be a sub-combination of the features described above.

BRIEF DESCRIPTION OF THE DRAWINGS

FIG. 17 shows a relation between a difference $\Delta_{Ga}$ between a peak binding energy of a Ga 2p spectrum and a binding energy of a Ga—N bond component, and the field effect mobility.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
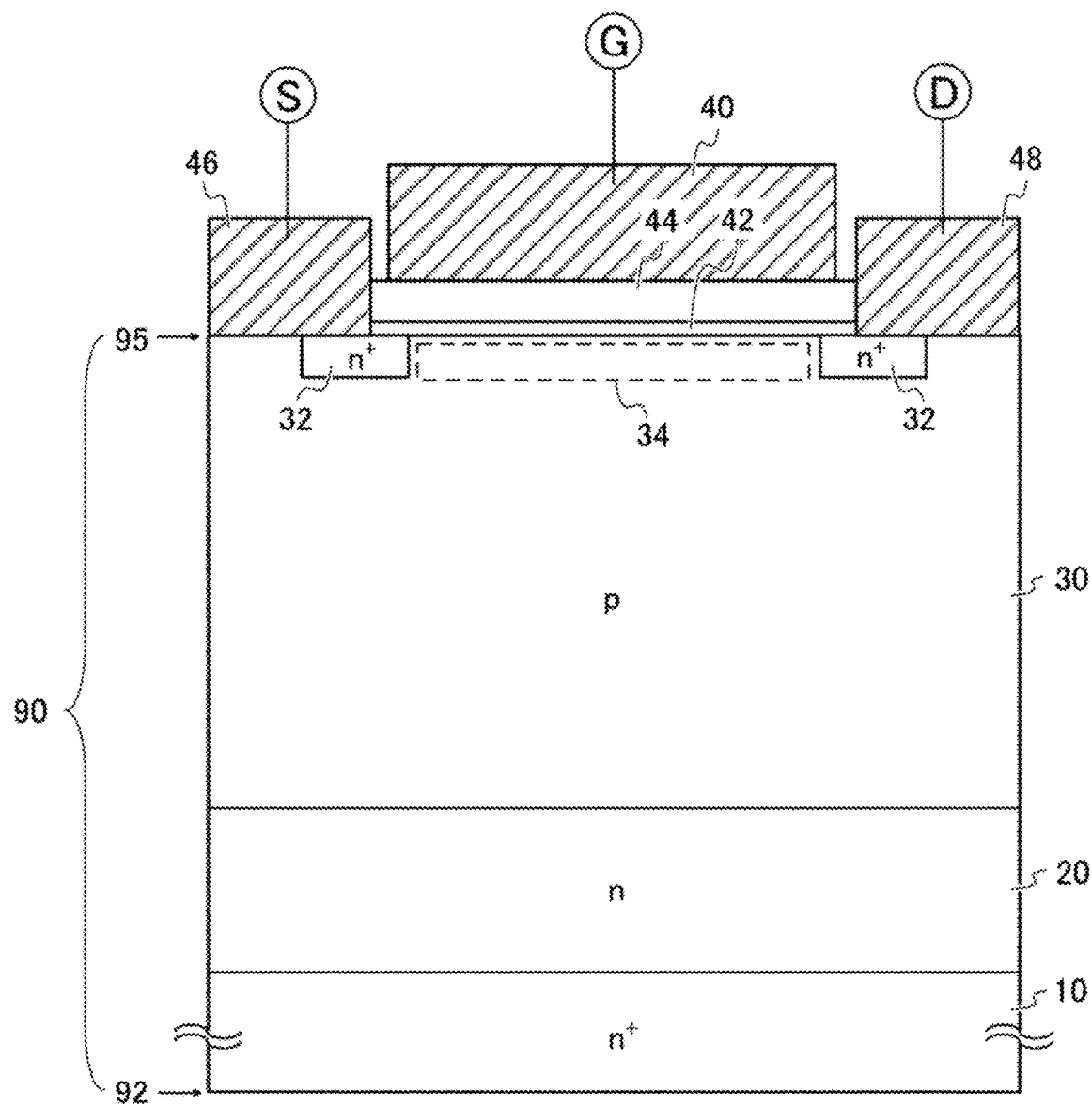
FIG. 1 shows a cross-section view of a lateral MOSFET 100 in the first embodiment.
Figure 2A:
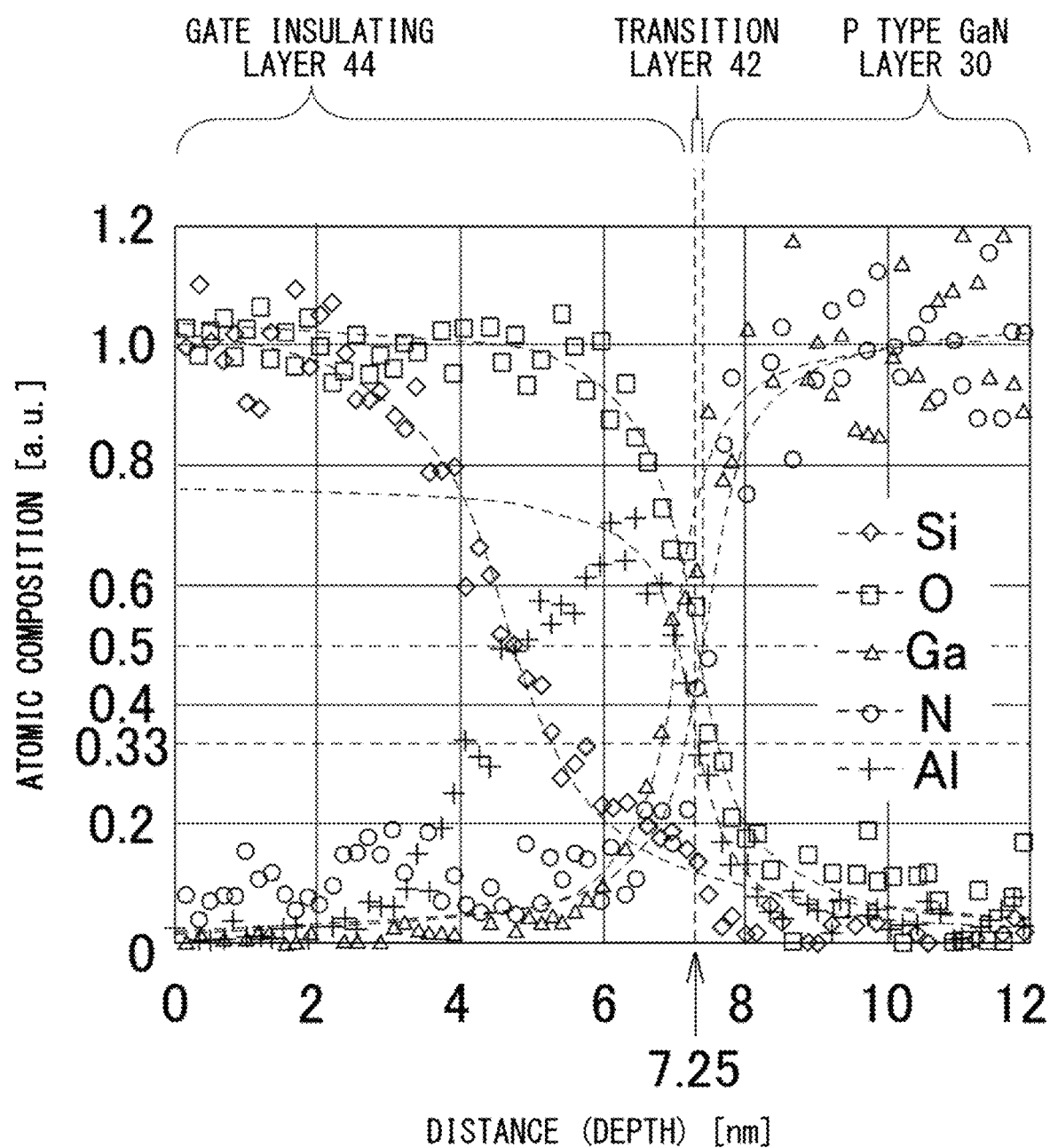
FIG. 2A shows a dependence of atomic composition on depth position analyzed by EDX in sample No. 1.
Figure 2B:
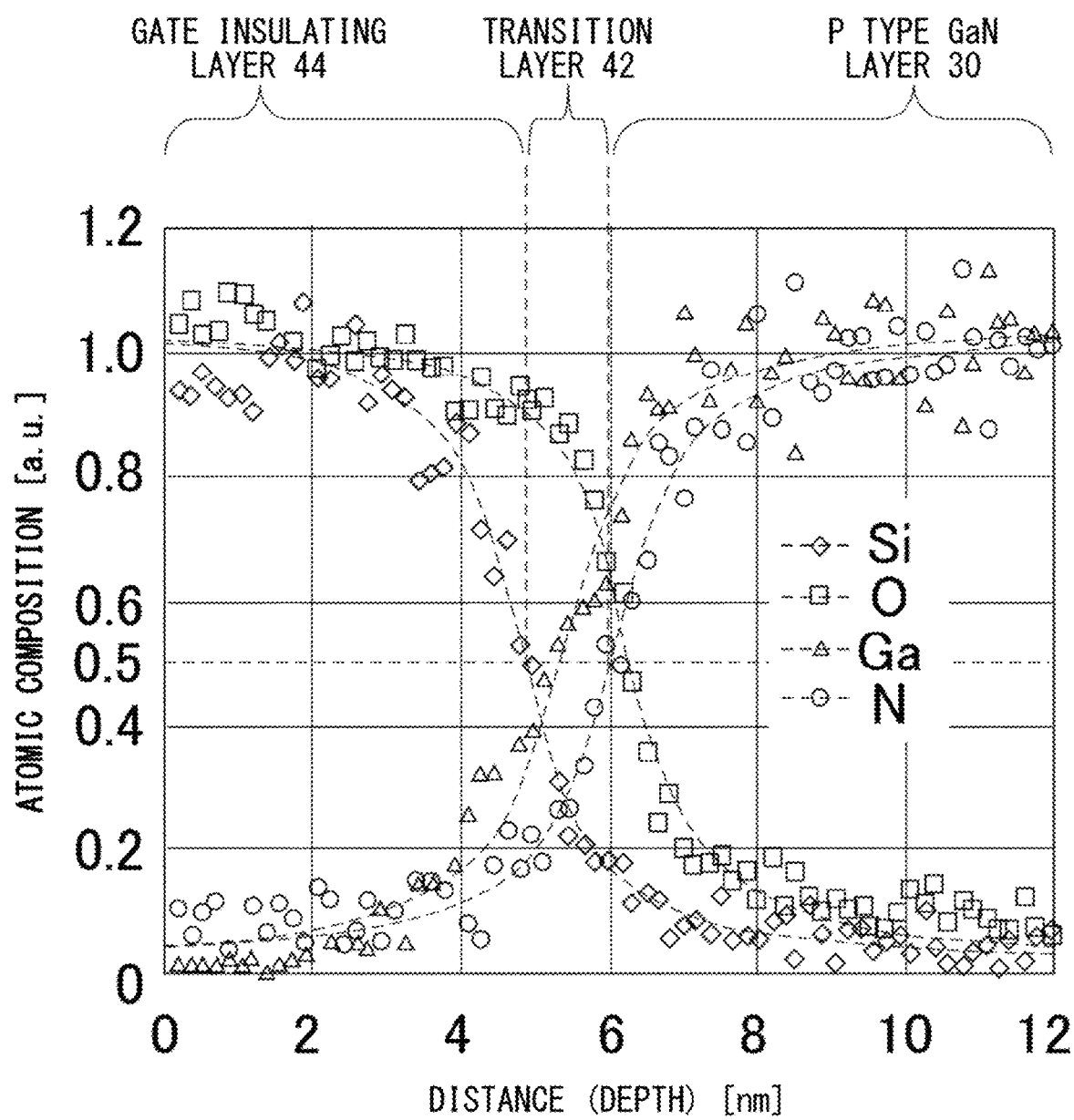
FIG. 2B shows a dependence of atomic composition on depth position analyzed by EDX in sample No. 2.
Figure 2C:
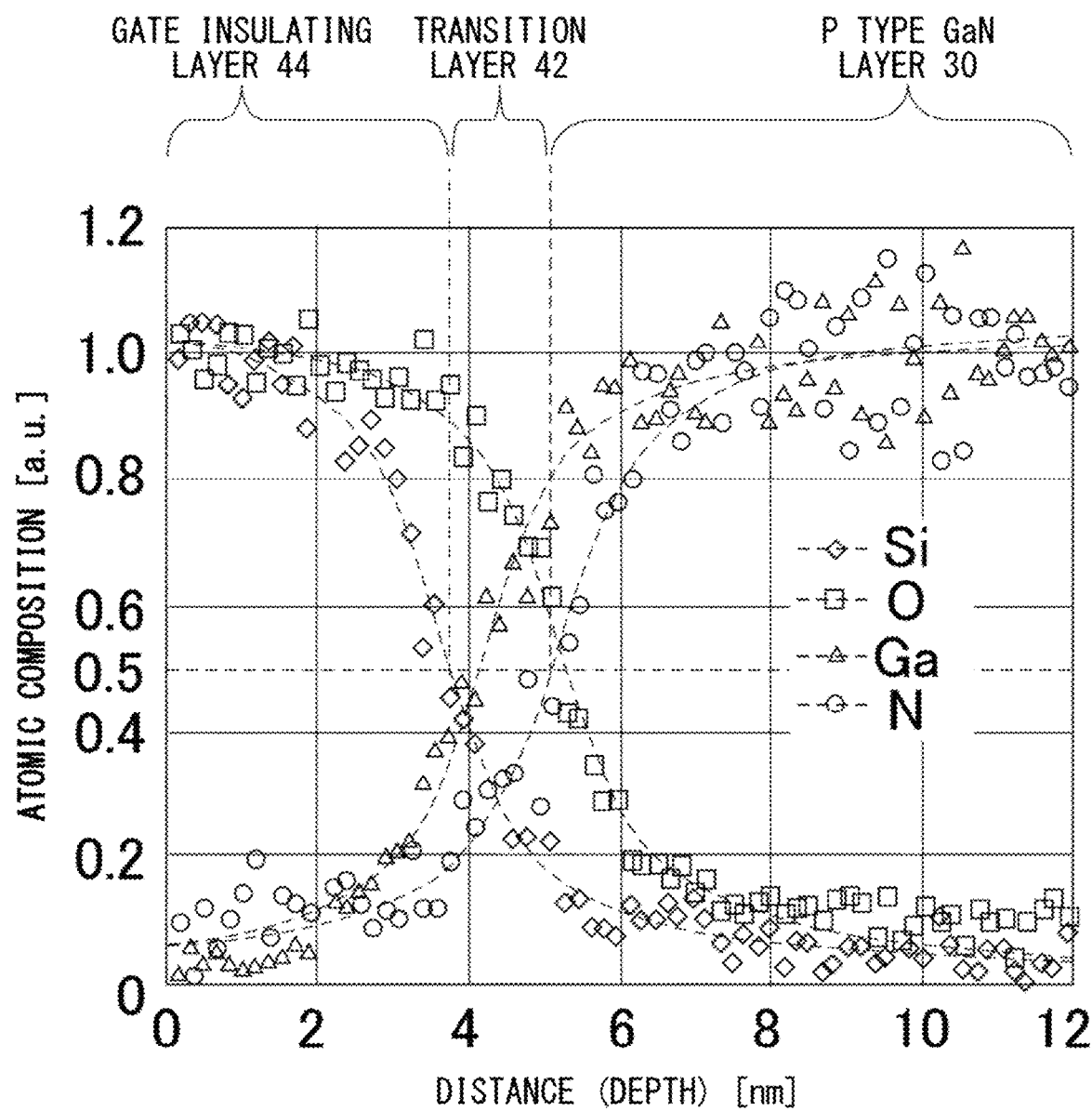
FIG. 2C shows a dependence of atomic composition on depth position analyzed by EDX in sample No. 3.
Figure 2D:
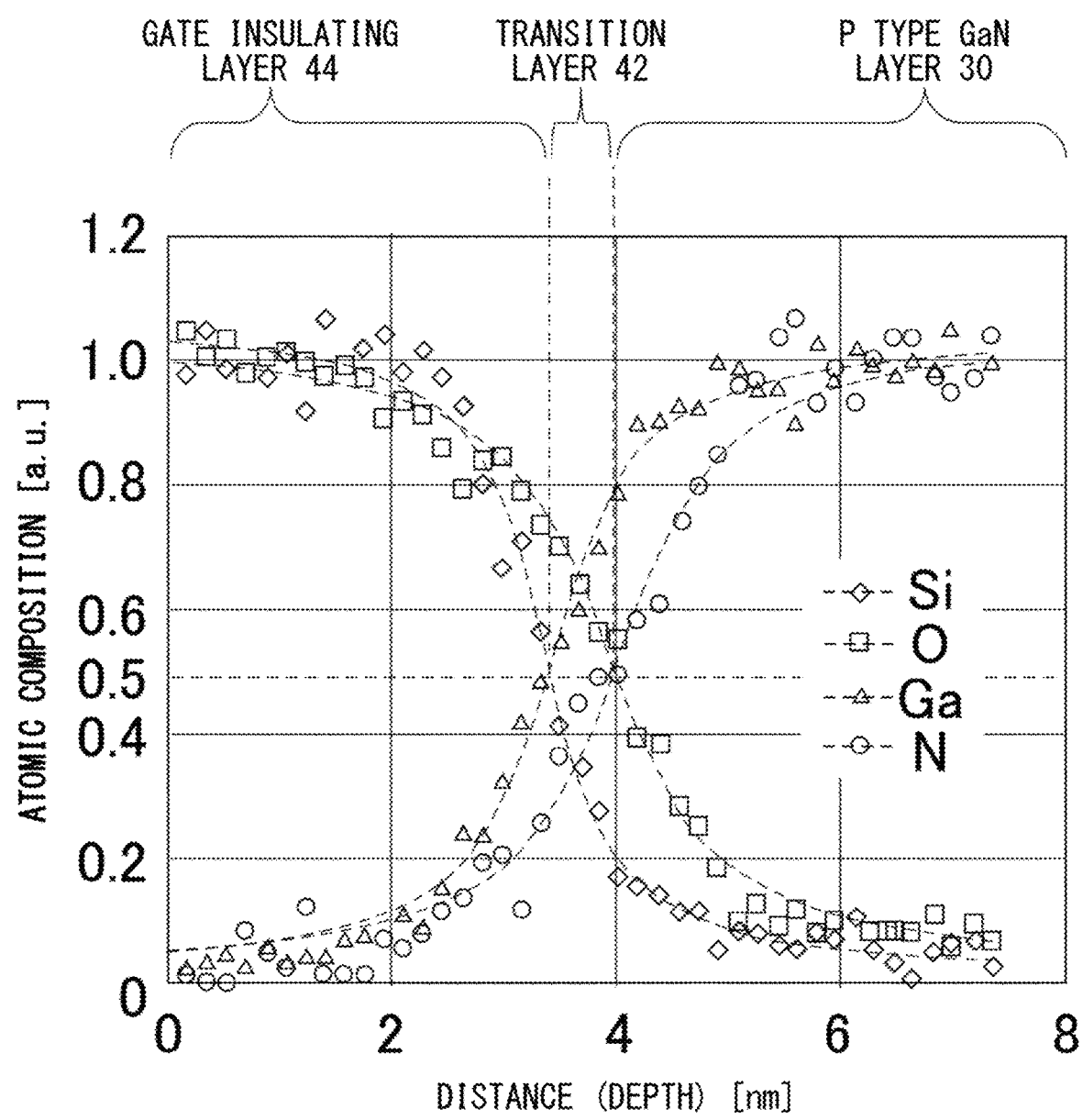
FIG. 2D shows a dependence of atomic composition on depth position analyzed by EDX in sample No. 4.

FIG. 1 shows a cross-section view of a lateral Metal Oxide Semiconductor Field Effect Transistor (MOSFET) 100 in a first embodiment. A front surface 95 and a back surface 92 of a gallium nitride (GaN) based semiconductor 90 may be parallel to an X-Y plane. FIG. 1 is a cross section obtained by cutting a part of the lateral MOSFET 100 by an X-Z plane. In the present example, an X-axis direction and a Y-axis direction are directions perpendicular to each other, and a Z-axis direction is a direction perpendicular to the X-Y plane. The X, Y and Z axes form a so-called right-handed system.

In the present example, a positive direction of the Z-axis direction may be referred to as "upward", and a negative direction of the Z-axis direction may be referred to as "downward". However, the terms "upward" and "downward" do not necessarily mean a vertical direction to the ground. That is, the "upward" and "downward" directions are not limited to the gravity direction. The terms "upward" and "downward" are merely convenient expressions for specifying a relative position relation of substrates, layers, regions, films and the like.

The lateral MOSFET 100 of the present example is formed by using a GaN based semiconductor chip with a size of 10 mm×10 mm in the X-Y plane. The lateral MOSFET 100 is one example of a GaN based semiconductor device. The structure shown in FIG. 1 may be a unit structure of the lateral MOSFET 100. The unit structure may extend in the Y-axis direction and be repeatedly provided in the X-axis direction. A plurality of the unit structures may be arranged to configure an approximately rectangular shape in an X-Y plane view. A region in which the plurality of the unit structures are provided may also be referred to as an active region. In the periphery of the active region, an edge terminal structure having a function to prevent electric field concentration in the active region may be provided. The edge terminal structure may include one or more of a guard ring structure, a field plate structure and a Junction Termination Extension (JTE) structure.

In the present example, each of a substrate and layers configuring the GaN based semiconductors 90 is the GaN semiconductor. However, each of the substrate and layers may also further include one or more elements of aluminum (Al) element and indium (In) element. That is, each of the substrate and layers configuring the GaN based semiconductors 90 may also be a mixed crystal semiconductor including small amounts of Al element and In element, that is, $Al_xIn_yGa_{1-x-y}N$ ($0 \leq x < 1$, $0 \leq y < 1$). However, in the present example, each of the substrate and layers configuring the GaN based semiconductor 90 is the GaN semiconductor of $Al_xIn_yGa_{1-x-y}N$, where x=y=0.

The GaN based semiconductor 90 of the present example includes a GaN substrate 10, an n type GaN layer 20 and a p type GaN layer 30. The GaN substrate 10 may be a so-called c-surface GaN substrate. A c-axis direction of the GaN substrate 10 may be parallel to the Z-axis direction. Also, the GaN substrate 10 may be a low-dislocation free-standing substrate having a threading dislocation density of less than 1E+7 $cm^{-2}$. Note that E means a power of 10, and for example, 1E+7 means $10^7$. The GaN substrate 10 of the present example is an $n^+$ type substrate having a length (that is, a thickness) of 350 μm in the Z-axis direction. In the present example, a lower surface of the GaN substrate 10 is referred to as a back surface 92 of the GaN based semiconductor 90.

The n type GaN layer 20 may be epitaxially formed on the GaN substrate 10. The n type GaN layer 20 of the present example has a thickness of 1 μm and includes Si element of 2E+16 $cm^{-3}$ as n type impurities. Note that the n type GaN layer 20 is one example of the gallium nitride based semiconductor layer of a second conductivity type.

The p type GaN layer 30 may be epitaxially formed on the n type GaN layer 20. The p type GaN layer 30 of the present example has a thickness of 4 μm and includes Mg of 1E+17 $cm^{-3}$ as p type impurities. Note that the p type GaN layer 30 is one example of the gallium nitride based semiconductor layer of the first conductivity type. In the present example, an upper surface of the p type GaN layer 30 is referred to as a front surface 95 of the GaN based semiconductor 90.

In the present example, the first conductivity type is taken as the p type and the second conductivity type is taken as the n type. However, in another example, the first conductivity type may also be taken as the n type and the second conductivity type may also be taken as the p type. Note that the letter "n" or "p" respectively means that electrons or holes serve as majority carriers. For the superscript "+" or "−" added to the right of the letter "n" or "p", the superscript "+" means a higher carrier concentration than when not added, and the superscript "−" means a lower carrier concentration than when not added.

The p type impurities to the GaN semiconductor may be one or more types of elements of Mg (magnesium), Ca (calcium), Be (beryllium) and Zn (zinc). In the present example, Mg element is used as the p type impurities. Also, the n type impurities to the GaN semiconductor may be one or more types of elements of Si (silicon), Ge (germanium) and O (oxygen). In the present example, Si element is used as the n type impurities.

The p type GaN layer 30 has a pair of $n^+$ type GaN regions 32 spaced apart from each other in the X-axis direction. In the present example, an upper portion of the $n^+$ type GaN region 32 is exposed on the front surface 95. The $n^+$ type GaN region 32 may be provided up to a predetermined depth position that is shallower than a bottom of the p type GaN layer 30. In one example, the $n^+$ type GaN region 32 is provided up to a depth position of 0.1 μm from the front surface 95.

The lateral MOSFET 100 of the present example further includes a gate electrode 40, a transition layer 42, a gate insulating layer 44, a source electrode 46 and a drain electrode 48. The gate electrode 40, the gate insulating layer 44, the transition layer 42 and the p type GaN layer 30 may configure a Metal Oxide Semiconductor (MOS) structure.

The gate insulating layer 44 is provided on the p type GaN layer 30. More specifically, the gate insulating layer 44 is provided to an upper portion of a channel forming region 34 that is positioned between a pair of the $n^+$ type GaN regions 32 and to an upper portion of a part of the $n^+$ type GaN region 32 that is adjacent to the channel forming region 34. Note that the gate insulating layer 44 is one example of the insulating layer.

To remove an oxide layer from the front surface 95 of the p type GaN layer 30 and of the $n^+$ type GaN regions 32 before forming the gate insulating layer 44, the front surface 95 is etched by using dilute hydrofluoric acid. Subsequently, the gate insulating layer 44 is formed on the front surface 95. The gate insulating layer 44 may be a metal oxide layer. Note that as described below, the metal element in the present specification includes Si element. That is, the $SiO_2$ layer in the present specification is a metal oxide layer.

The gate insulating layer 44 may include at least any one of a silicon oxide ($SiO_2$) layer and an aluminum oxide layer. The gate insulating layer 44 may also include the aluminum oxide layer, and the $SiO_2$ layer that is at least partially positioned on the aluminum oxide layer. Note that in the present specification, the gate insulating layer 44 formed of the oxide of metal other than gallium as described above may be referred to as a metal oxide layer. The gate insulating layer 44 of the present example is the $SiO_2$ layer or a laminate of the aluminum oxide layer and the $SiO_2$ layer. The $SiO_2$ layer has a band gap wider than that of the aluminum oxide layer and has excellent withstand voltage characteristics. On the other hand, the aluminum oxide layer is easily crystallized by thermal treatment and has a poor insulation property compared to the $SiO_2$ layer. Even if taking the manufacturing process into account, the aluminum oxide is difficult to be wet etched compared to the $SiO_2$ layer. For that reason, in the present example, the gate insulating layer 44 is not taken as a single layer of the aluminum oxide, and is taken as a laminate of a lower layer of a relatively thin aluminum oxide layer and an upper layer of a relatively thick $SiO_2$ layer.

In the present example, the transition layer 42 is provided in the vicinity of the boundary between the gate insulating layer 44 and the p type GaN layer 30. The thickness of the transition layer 42 is less than 1.5 nm, for example. The transition layer 42 is also a natural oxide layer of GaN and a boundary layer generated due to dissimilar-material bond between the gate insulating layer 44 and the p type GaN layer 30. Note that in the present specification, the transition layer 42 may also be referred to as a degradation layer. As described below, the inventors of the present application figured out that the larger the thickness of the transition layer 42, the smaller the field effect mobility of the channel forming region 34. That is, it was figured out that by making the thickness of the transition layer 42 small, the field effect mobility can be made large.

Although it is not limited to a particular consideration only, it is considered that if the thickness of the transition layer 42 becomes large, an upper portion of the p type GaN layer 30 (that is, a region near the front surface 95) loses the p type characteristics and does not respond to the electric field. For the GaN semiconductor, Si element and O element are donor impurities, and also for the $GaO_X$ semiconductor being a wide-gap semiconductor, Si element is the donor impurities. It is considered that the transition layer 42 is a layer having a GaN semiconductor layer formed into the n type and a $GaO_X$ semiconductor layer. In the present specification, the $GaO_X$ semiconductor is, for example, a semiconductor containing at least any one of GaO having a ratio of a number of atoms of gallium element to a number of atoms of oxygen element in the composition formula being 1:1, and $GaO_2$ having the ratio being 1:2 and $Ga_2O_3$ having the ratio being 2:3. In this manner, it is considered that if a region (transition layer 42) formed into the n type exists in the vicinity of an interface of the p type GaN layer 30, because in this region an electric charge amount does not change according to an electric field from the gate electrode 40, the field effect is weakened and the field effect mobility becomes small. Note that it is considered that the transition layer 42 is formed from a lower portion of the gate insulating layer 44 to an upper portion of the p type GaN layer 30. That is, it is considered that the transition layer 42 is formed by corroding parts of the gate insulating layer 44 and of the p type GaN layer 30.

Note that although in the above-described Patent Document 1 it has been described that a purpose of Patent Document 1 is to suppress formation of the interface state, no technical idea for a relation between the thickness of the transition layer 42 and the field effect mobility has been disclosed. Generally, as a parameter that affects the field effect mobility, the followings can be considered: (1) roughness scattering caused by a physical unevenness of the front surface 95 of the p type GaN layer 30; (2) phonon scattering caused by lattice vibration of crystal lattices in the p type GaN layer 30; (3) Coulomb scattering caused by ionized impurities in the p type GaN layer 30 and fixed charges in the gate insulating layer 44; and (4) interface charge scattering caused by electric charges trapped in an interface between the p type GaN layer 30 and the gate insulating layer 44. Patent Document 1 merely provides a technical idea to reduce the influence of the interface charge scattering caused by the electric charges trapped in the interface. On the other hand, in the present application, although it is not necessarily clear which one of the above-described (1) to (4) is dominant, the field effect mobility is made large by making the thickness of the transition layer 42 small.

The gate electrode 40 is in contact with the gate insulating layer 44 on the gate insulating layer 44. The gate electrode 40 of the present example is positioned on the gate insulating layer 44. The gate insulating layer 44 of the present example in an upper portion between the pair of the $n^+$ type GaN regions 32 is longer than a length in the X-axis direction between a pair of the $n^+$ type GaN regions 32 which are opposite to each other. In the present example, each of the source electrode 46 and the drain electrode 48 is in contact with the $n^+$ type GaN region 32 and the p type GaN layer 30 on the front surface 95. Each of the gate electrode 40, the source electrode 46 and the drain electrode 48 may be an aluminum electrode having a thickness of 200 nm.

A predetermined potential difference is formed between the source electrode 46 and the drain electrode 48, and a predetermined positive potential is supplied to the gate electrode 40, thereby forming an charge inversion region (that is, a channel) in a channel forming region 34 positioned between a pair of the $n^+$ type GaN regions 32. Accordingly, electron current flows from the source electrode 46 toward the drain electrode 48. That the predetermined positive potential is supplied to the gate electrode 40 is also referred to as that the lateral MOSFET 100 is turned on. On the other hand, if the predetermined positive potential is stopped being supplied to the gate electrode 40, the channel disappears. Accordingly, the flow of the electron current stops, that is, the lateral MOSFET 100 is turned off.

Table 1 is an experimental result showing a relation between a formation condition of the gate insulating layer 44 and a maximum value of the field effect mobility. Note that the transition layer 42 is inevitably formed during a process of forming the gate insulating layer 44. In the present experiment, among four samples having different formation conditions of the gate insulating layer 44 (samples No. 1 to No. 4), the field effect mobility for the samples No. 1 to No. 3 was measured. Note that because the sample No. 4 was held to the formation of the MOS capacitor (that is, the source electrode 46, the drain electrode 48 and the like were not formed), the field effect mobility of the sample No. 4 was not measured.

TABLE 1

| | GATE INSULATING LAYER 44 | | | |
|---|---|---|---|---|
| SAM- PLE | ALUMINUM OXIDE LAYER | $O_2$ PLASMA TREATMENT BEFORE FORMING $SiO_2$ LAYER | THERMAL TREATMENT OF GATE INSULATING LAYER 44 | MAXIMUM VALUE OF FIELD EFFCT MOBILITY ($cm^2$/Vs) |
| No. 1 | THICKNESS 4 nm | ABSENT | ABSENT | 96 |
| No. 2 | ABSENT | PRESENT | ABSENT | 48 |
| No. 3 | ABSENT | PRESENT | PRESENT | 36 |
| No. 4 | ABSENT | ABSENT | ABSENT | NOT MEAS- URED |

[SAMPLE NO. 1] The gate insulating layer 44 of the sample No. 1 has a laminated structure including a lower layer of the aluminum oxide layer and an upper layer of the $SiO_2$ layer. In the sample No. 1, the aluminum oxide layer having a thickness of 4 nm was formed in contact with the p type GaN layer 30, and subsequently, the $SiO_2$ layer having a thickness of 100 nm was formed in contact with the aluminum oxide layer. In the sample No. 1, after the $SiO_2$ layer was formed, the thermal treatment was not performed on the gate insulating layer 44. After the lateral MOSFET 100 was formed, current-voltage characteristics was measured. Specifically, a transfer conductance was obtained from a relation between a voltage $V_G$ supplied to the gate electrode 40 and current $I_d$ flowing toward the drain, to calculate field effect mobility $\mu_{FE}$. A $V_G$-$\mu_{FE}$ graph was made. A maximum value of $\mu_{FE}$ was 96 $cm^2$/V·s.

[SAMPLE NO. 2] The gate insulating layer 44 of the sample No. 2 was taken as a single layer of $SiO_2$ layer. In the sample No. 2, a front surface of the p type GaN layer 30 (that is, the front surface 95 of the GaN based semiconductor 90) was treated by $O_2$ plasma for 10 minutes, and subsequently, the $SiO_2$ layer having a thickness of 100 nm was formed. Because it has been pointed out that as a thin $GaO_X$ layer is formed on the front surface of the p type GaN layer 30, an interface state density of GaN/$SiO_2$ is reduced, it is also considered that the field effect mobility is improved according to the $O_2$ plasma. In the sample No. 2, after the $SiO_2$ layer was formed, the thermal treatment was not performed on the gate insulating layer 44. Also, after the lateral MOSFET 100 was formed, the maximum value of $\mu_{FE}$ obtained from the $V_G$-$\mu_{FE}$ graph was 48 $cm^2$/V·s.

[SAMPLE NO. 3] The gate insulating layer 44 of the sample No. 3 was taken as a single layer of the $SiO_2$ layer. In the sample No. 3, the front surface of the p type GaN layer 30 was treated by $O_2$ plasma for 10 minutes, and subsequently, the $SiO_2$ layer having a thickness of 100 nm was formed. In the sample No. 3, after the $SiO_2$ layer was formed, the thermal treatment was performed on the gate insulating layer 44. Specifically, in a nitrogen ($N_2$) gas atmosphere, the thermal treatment was performed on the GaN based semiconductor 90 and the gate insulating layer 44 for 30 minutes at a temperature of 700° C. After the lateral MOSFET 100 was formed, the maximum value of $\mu_{FE}$ obtained from the $V_G$-$\mu_{FE}$ graph was 36 cm$^2$/V·s.

[SAMPLE NO. 4] The gate insulating layer 44 of the sample No. 4 was taken as a single layer of SiO$_2$ layer. In the sample No. 4, the O$_2$ plasma treatment was not performed on the front surface of the p type GaN layer 30, the SiO$_2$ layer having the thickness of 100 nm was formed in contact with the p type GaN layer 30. Also, in the sample No. 4, after the SiO$_2$ layer was formed, the thermal treatment was not performed on the gate insulating layer 44.

Comparing the sample No. 1 to the sample No. 2, it can be said that there is a tendency that if the O$_2$ plasma treatment is performed, the field effect mobility is lowered. It is considered that there is a possibility that the O$_2$ plasma treatment facilitates the growth of the transition layer 42.

Also, compared the sample No. 2 to the sample No. 3, the field effect mobility of the sample No. 2 on which the thermal treatment of the gate insulating layer 44 is "not performed" is higher than that of the sample No. 3 on which the thermal treatment of the gate insulating layer 44 is "performed". For that reason, it can be said that the thermal treatment of the gate insulating layer 44 lowers the field effect mobility. That is, there is a possibility that the thermal treatment of the gate insulating layer 44 facilitates the growth of the transition layer 42.

Taking the result of the present experiment into account, there is a possibility that the thickness of the transition layer 42 becomes large by the O$_2$ plasma treatment and becomes large by the thermal treatment of the gate insulating layer 44. For that reason, it can be said that to make the thickness of the transition layer 42 small, it is desirable not to perform the O$_2$ plasma treatment on the front surface of the p type GaN layer 30 and the thermal treatment on the gate insulating layer 44.

FIG. 2A, FIG. 2B, FIG. 2C and FIG. 2D respectively show measurement results of depth positions [nm]-atomic compositions [a.u.] of the samples No. 1 to No. 4 by EDX. The samples No. 1 to No. 4 of FIG. 2A to FIG. 2D respectively correspond to the samples No. 1 to No. 4 of Table 1. In each graph of FIG. 2A to FIG. 2D, the horizontal axis indicates a distance (depth) [nm] from the gate insulating layer 44 to the p type GaN layer 30 in a straight line that is parallel to the Z axis and passes through the channel forming region 34. Note that the predetermined depth position in the gate insulating layer 44 is set to zero nm. Also, the vertical axis indicates the atomic composition of the material obtained by reflecting energy intensity of element/atom in the EDX (Energy dispersive X-ray spectrometry) measurement. Note that the energy intensity may correspond to a size of the number of atoms of the element in the material. However, it should be noted that the vertical axis indicates a relative atomic composition between atoms, not indicating an absolute atomic composition (atomic %). It was confirmed that the composition of the silicon oxide layer is SiO$_2$ by X-ray Photoelectron Spectroscopy (XPS), and it was confirmed that the GaN layer is GaN crystal phase by electron beam diffraction.

The gate insulating layer 44 of the present example is an oxide or a nitride of a metal element or a semiconductor element. The gate insulating layer 44 may include a metal element or a semiconductor element. In the present specification, the metal element and the semiconductor element are both described as the metal element. That is, in the present specification, the metal element includes, in addition to typical metal elements, each element of Si, Ge, tin (Sn) and lead (Pb) in the group 14, and each element of Al, Ga, In, thallium (Tl) and the like in the group 13. In the present example, one or both of Si element and Al element are used as the metal element. Note that the metal element used for the gate insulating layer 44 may also be another transition metal element.

The transition layer 42 may be constituted of the elements of the p type GaN layer 30 and the gate insulating layer 44. The transition layer 42 of the present example contains the Ga element and the N element of the p type GaN layer 30, and the Al element, the Si element and the O element of the gate insulating layer 44.

As clear from each graph of FIG. 2A to FIG. 2D, the Ga element and the N element of the p type GaN layer 30 intrude to the gate insulating layer 44 positioned in the upper portion, and the Al element, the Si element and the O element of the gate insulating layer 44 intrude to the p type GaN layer 30 positioned in the lower portion. In the transition layer 42 of the present example, the ratio of the number of atoms of the N element to the number of atoms of the Ga element is smaller than the ratio of the number of atoms of the N element to the number of atoms of the Ga element in the p type GaN layer 30. That is, in the transition layer 42, compared to the p type GaN layer 30, the Ga element is relatively richer than the N element.

In addition to this, in the transition layer 42 of the present example, if the atomic composition of the metal element constituting the gate insulating layer 44 has a maximum in the atomic composition distribution (that is, targeting on the Al element only), the ratio of the number of atoms of the O element to the number of atoms of the Al element is larger than the ratio of the number of atoms of the O element to the number of atoms of the Al element at a position of the maximum which is outside the transition layer 42. On the other hand, in the transition layer 42 of the present example, if the atomic composition of the metal element constituting the gate insulating layer 44 does not have the maximum in the atomic composition distribution (that is, targeting on the Si element only), the ratio of the number of atoms of the O element to the number of atoms of the Si element is larger than the ratio of the number of atoms of the O element to the number of atoms of the Si element in the gate insulating layer 44. That is, in the transition layer 42, compared to the depth position at which the atomic composition of the Al element has the maximum in the atomic composition distribution, the O element is relatively richer than the Al element, or compared to the gate insulating layer 44, the O element is relatively richer than the Si element.

In FIG. 2A to FIG. 2D, the metal element and the O element of the gate insulating layer 44 are standardized so that the atomic compositions in a distance (depth) being near zero are 1. Also, the Ga element and the N element of the p type GaN layer 30 are standardized so that the atomic compositions in a distance (depth) being near the maximum (for the samples No. 1 to No. 3, the depth is near 12 nm, and for the sample No. 4, the depth is near 8 nm) are 1. Also, each atomic composition distribution is fit by arctan function. However, because the aluminum oxide layer of the sample No. 1 is a layer locally provided in the vicinity of the transition layer 42, the atomic composition distribution of the Al element in a partial region close to the p type GaN layer 30 only is fit by the arctan function. Note that to easily view the drawings, the maximum value in the atomic composition distribution of the Al element of the sample No. 1 was standardized by ⅔, which is smaller than the maximum value of the other atomic compositions. Accordingly, the atomic compositions of the Al element, the Si element and the O element can be shown in a graph while maintaining a relative size relation of the atomic composition distribution.

In the present example, the relatively poor metal element (any element of Al or Si) and the N element are used to determine the thickness of the transition layer 42. If the atomic composition of the metal element constituting the gate insulating layer 44 has a maximum in the atomic composition distribution, the depth position on the p type GaN layer 30 side at which the atomic composition of the metal element having the maximum has ½ of a value of the maximum may be taken as $X_M$. In the present example, because the atomic composition of the Al element has the maximum, the depth position on the p type GaN layer 30 side at which the atomic composition of the Al element is ½ of the value of the maximum is taken as $X_M$ (the sample No. 1). On the other hand, if the atomic composition of the metal element constituting the gate insulating layer 44 does not have the maximum in the atomic composition distribution, the depth position at which the atomic composition of the metal element not having the maximum is ½ relative to the atomic composition of the metal element at a position on the gate insulating layer 44 side sufficiently away from the transition layer 42 may be taken as $X_M$. In the present example, in the samples which do not have the Al element and only have the Si element that does not have the maximum in the atomic composition distribution, the depth position at which the atomic composition is ½ relative to the atomic composition of the Si element at a position sufficiently away from the gate insulating layer 44 side is taken as $X_M$ (the samples No. 2 to No. 4). Also, the depth position at which the atomic composition of the N element constituting the p type GaN layer 30 is ½ relative to the atomic composition of the N element at a position on the p type GaN layer 30 side sufficiently away from the transition layer 42 may be taken as $X_N$. Then, a distance between the position $X_M$ and the position $X_N$ is defined as the thickness of the transition layer 42.

In the descriptions of FIG. 2A to FIG. 2D, the phrase "atomic composition of the metal element at a position on the gate insulating layer 44 side sufficiently away from the transition layer 42" means an atomic composition of the Si element in a region of the gate insulating layer 44 positioned in a portion sufficiently upper than the transition layer 42, and for example, means an atomic composition of the Si element in a region of the gate insulating layer 44 positioned in an upper portion by 3 nm or more, more preferably, in an upper portion by 5 nm or more than the transition layer 42. Also, the phrase "atomic composition of the nitrogen element at a position on the p type GaN layer 30 side sufficiently away from the transition layer 42" means an atomic composition of N in a region of the p type GaN layer 30 positioned in a portion sufficiently lower than the transition layer 42, and for example, means an atomic composition of the N element in a region of the p type GaN layer 30 positioned in a lower portion by 3 nm or more, more preferably, in a lower portion by 5 nm or more than the transition layer 42.

[SAMPLE NO. 1] In the sample No. 1, the depth position at which the atomic composition of the Al element being the metal element is ½ relative to the maximum of the atomic composition of the Al element positioned in a portion upper than the transition layer 42 was taken as $X_M$. As described above, in the sample No. 1, the atomic composition distribution of the Al element positioned in a portion upper than the transition layer 42 has the maximum. In the sample No. 1, the atomic composition distribution of the Al element has the value of the maximum in the vicinity of the depth of 6 nm. A depth position at which the atomic composition of the Al element corresponds to ½ of the value of the maximum (corresponding to approximately 0.33 in the vertical axis), which is a depth position of the p type GaN layer 30 side, was 7.25 nm. Also, the depth position at which the atomic composition of the N element constituting the p type GaN layer 30 is ½ of the atomic composition of the N element positioned in a portion sufficiently lower than the transition layer 42 was $X_N$. $X_N$-$X_M$ being a difference between $X_M$ and $X_N$ was 0.21 nm.

[SAMPLE NO. 2] In the sample No. 2, the depth position at which the atomic composition of Si element being the metal element was ½ of the atomic composition of the Si element positioned in a portion sufficiently upper than the transition layer 42 was taken as $X_M$. Note that $X_N$ was determined in a similar way to the sample No. 1. $X_N$-$X_M$ was 1.28 nm.

[SAMPLE NO. 3] In the sample No. 3, $X_M$ and $X_N$ were determined in a similar way to the sample No. 2. $X_N$-$X_M$ was 1.58 nm.

[SAMPLE NO. 4] In the sample No. 4, $X_M$ and $X_N$ were determined in a similar way to the sample No. 2. $X_N$-$X_M$ was 0.69 nm.

As clear from the results according to FIG. 2A to FIG. 2D, in the sample No. 1 provided with the aluminum oxide layer, the thickness of the transition layer 42 was the minimum. Not limited to a specific consideration, it is considered that the aluminum oxide layer reduced the intrusion of the Si atom from the $SiO_2$ layer to the p type GaN layer 30 so that the n type formation of the channel forming region 34 was reduced. For that reason, it is considered that in the sample No. 1 the field effect mobility was the highest.

It can be learned that in the samples No. 2 and No. 3 on which the $O_2$ plasma treatment was performed, the transition layers 42 having rich Ga and O became thick and the thin $GaO_X$ layer of approximately 1 nm to 2 nm was formed. However, compared to the sample No. 1, the field effect mobility was small.

Figure 3:
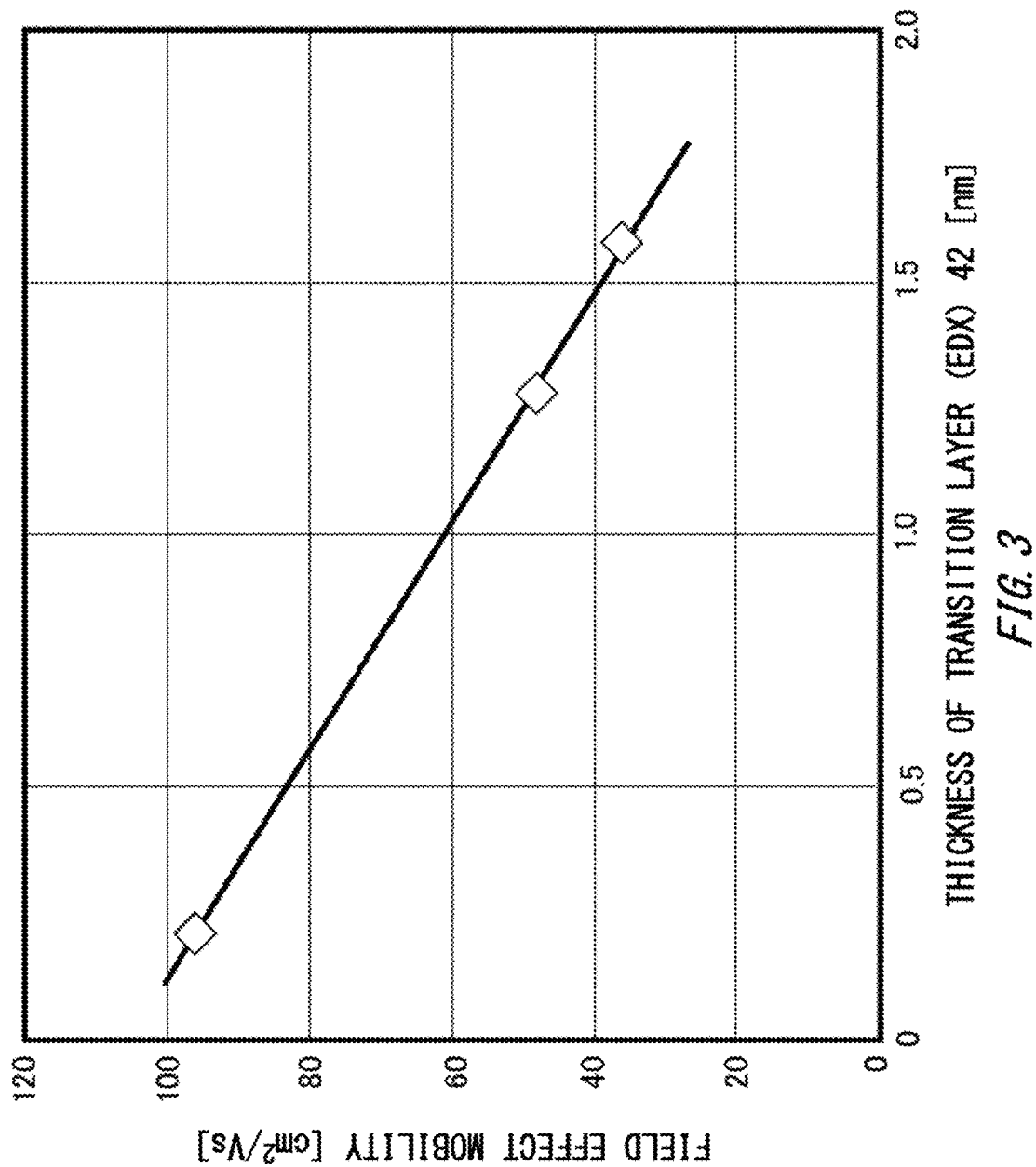
FIG. 3 is a graph showing a relation between the thickness of the transition layer 42 analyzed by EDX and the field effect mobility.

FIG. 3 is a graph showing a relation between the thickness of the transition layer 42 obtained from the EDX measurement result, and the field effect mobility. The horizontal axis indicates the thickness [nm] of the transition layer 42 determined by EDX of FIG. 2A to FIG. 2C. The vertical axis indicates a maximum value of the field effect mobility [$cm^2/V \cdot s$] shown in Table 1. As shown in FIG. 3, the relation between the thickness of the transition layer 42 and the field effect mobility was clear.

The approximately straight line in the graph of FIG. 3 indicated "field effect mobility [$cm^2/V \cdot s$]=−44×(thickness [nm] of transition layer 42)+105". It can be learned that by making the thickness of the transition layer 42 thin, the field effect mobility can be made large. Utilizing the approximately straight line, the field effect mobility is 85 $cm^2/V \cdot s$ when the thickness of the transition layer 42 is approximately 0.46 nm, the field effect mobility is 90 $cm^2/V \cdot s$ when the thickness of the transition layer 42 is approximately 0.34 nm, and the field effect mobility is 100 $cm^2/V \cdot s$ when the thickness of the transition layer 42 is approximately 0.12 nm. In this manner, by making the thickness of the transition layer 42 be 0.5 nm or less, preferably 0.4 nm or less or 0.3 nm or less, and further preferably 0.2 nm or less, a relatively high field effect mobility can be achieved. What has been described herein is the influence caused by the presence of the transition layer 42, it is considered that if the scattering such as the roughness scattering, phonon scattering, Coulomb scattering and interface charge scattering can be reduced, the field effect mobility can be further made large.

Figure 4A:
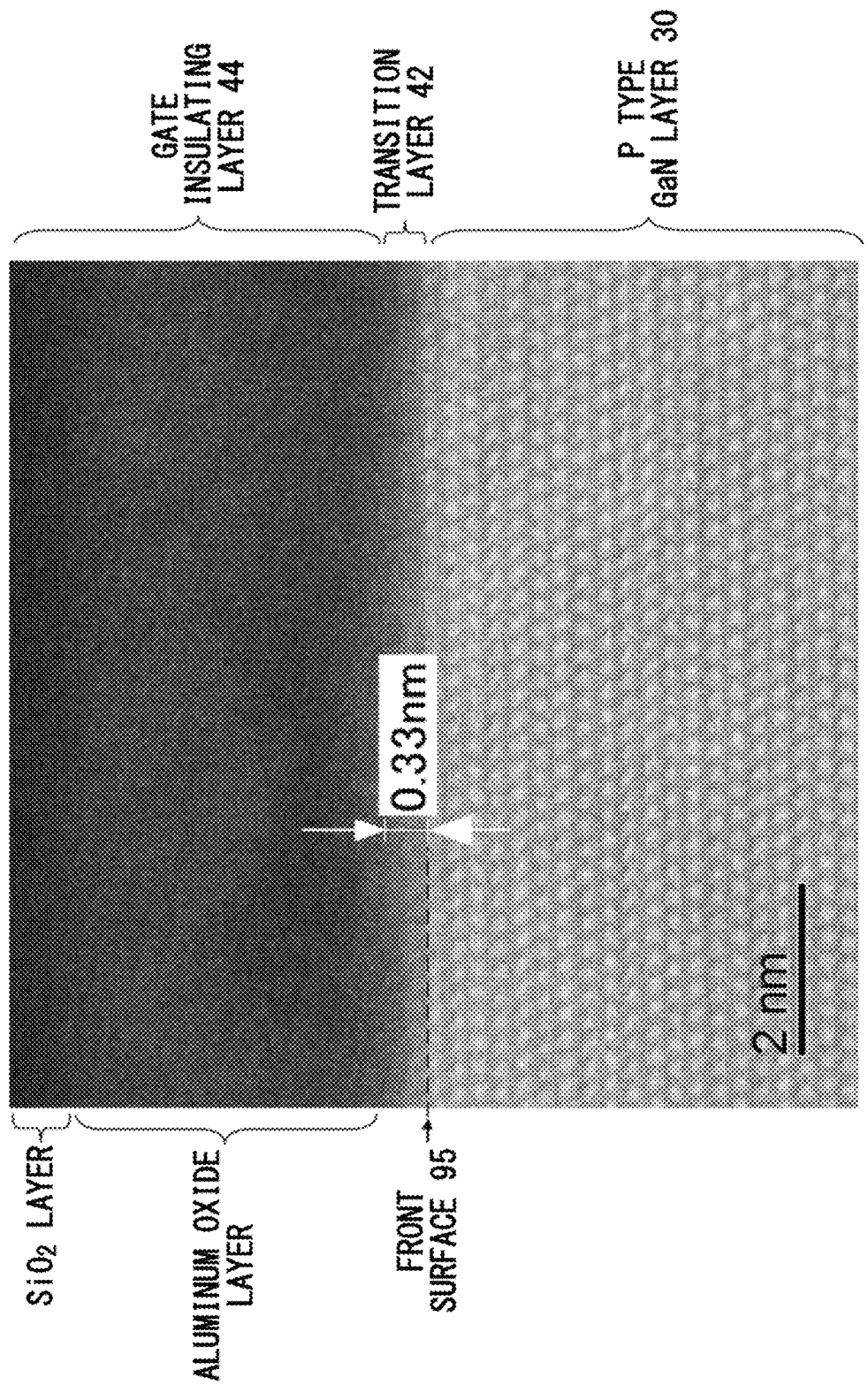
FIG. 4A shows a STEM-HAADF image of a cross section of sample No. 1.
Figure 4B:
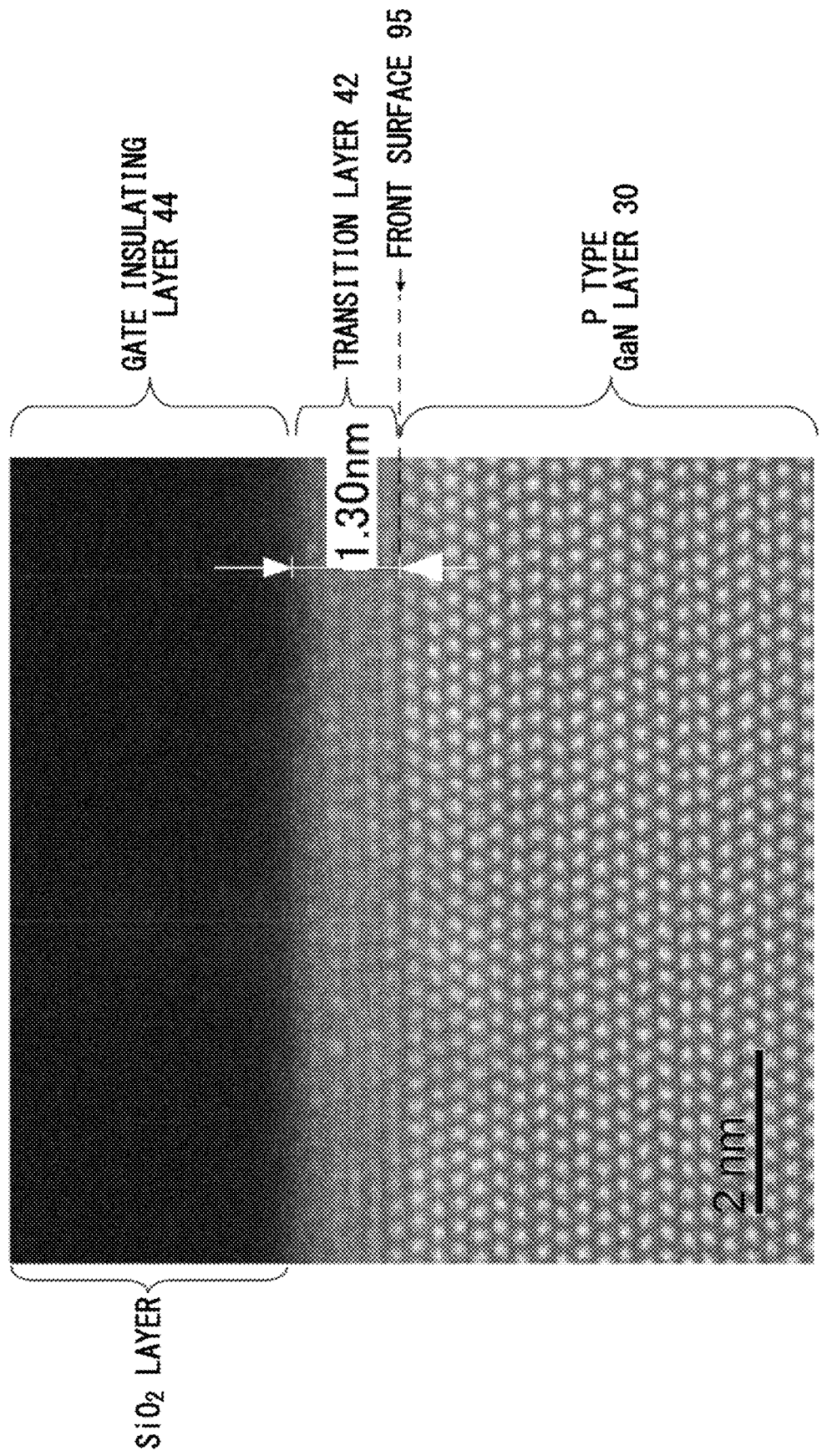
FIG. 4B shows a STEM-HAADF image of a cross section of sample No. 2.
Figure 4C:
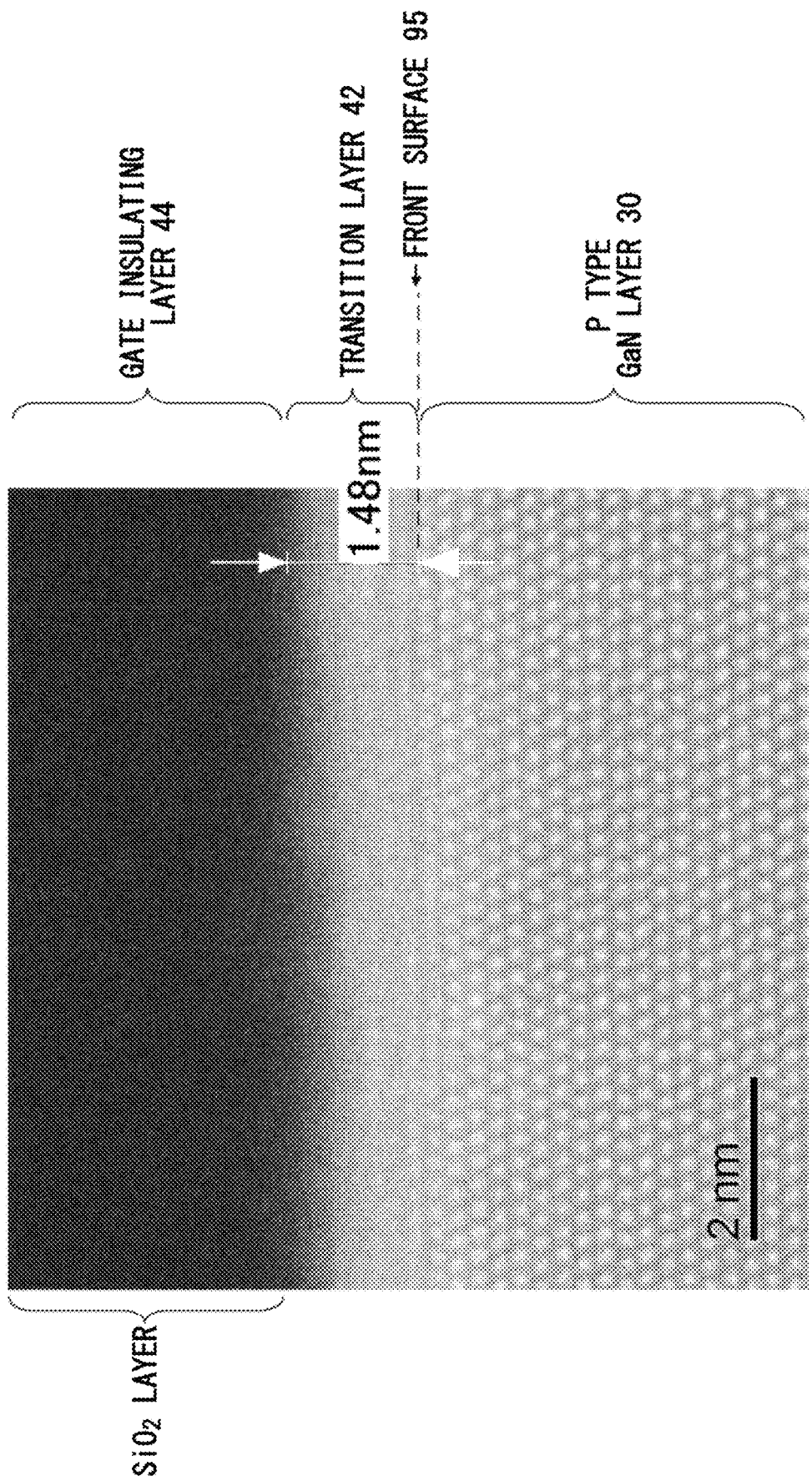
FIG. 4C shows a STEM-HAADF image of a cross section of sample No. 3.
Figure 4D:
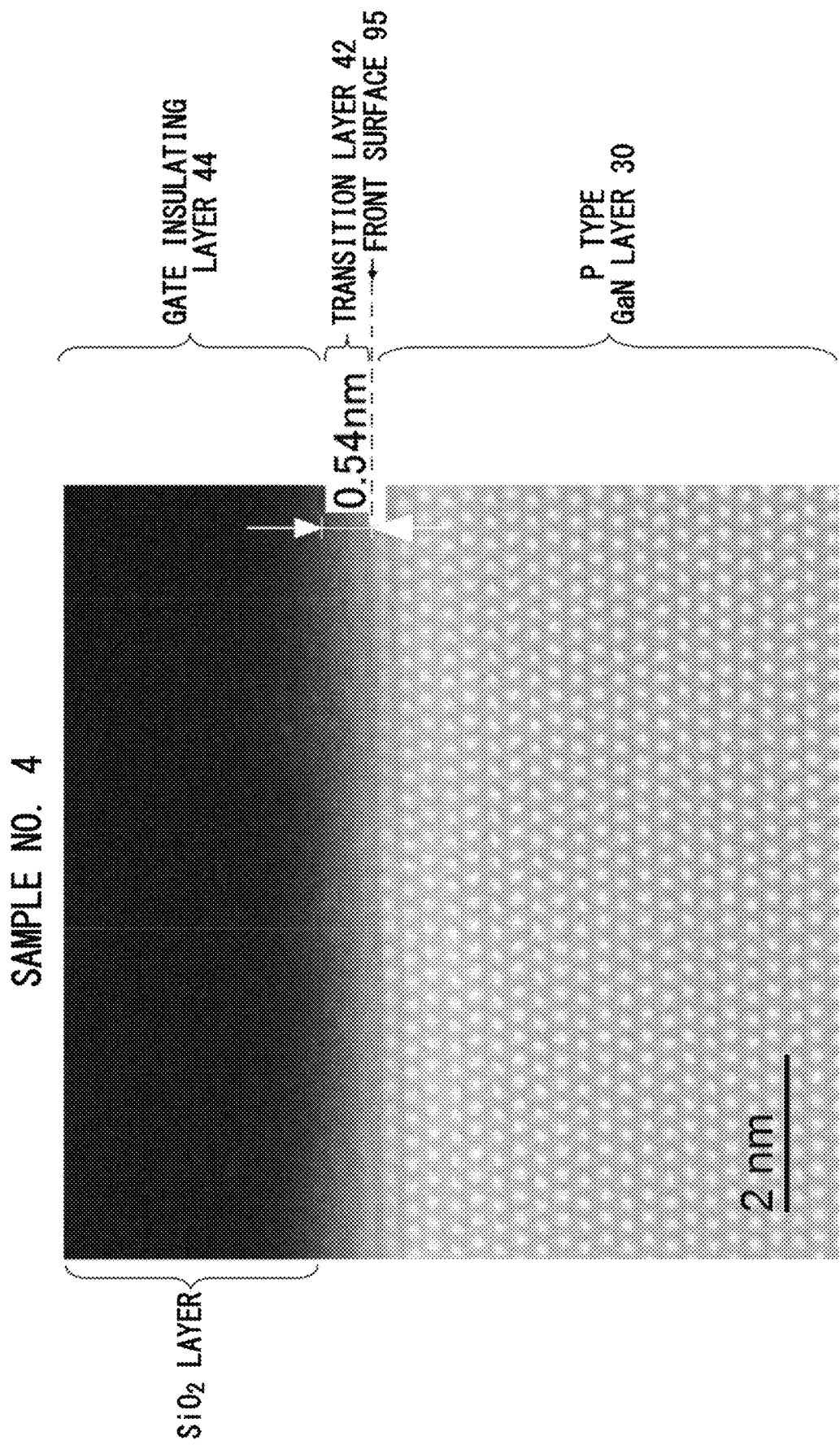
FIG. 4D shows a STEM-HAADF image of a cross section of sample No. 4.

FIG. 4A shows a Scanning Transmission Electron Microscope-High Angle Annular Dark Field (STEM-HAADF) image of a cross section of the sample No. 1 observed with a transmission electron microscope of high resolution. FIG. 4B shows a STEM-HAADF image of a cross section of the sample No. 2. FIG. 4C shows a STEM-HAADF image of a cross section of the sample No. 3. FIG. 4D shows a STEM-HAADF image of a cross section of the sample No. 4.

For the samples No. 1 to No. 4, HAADF images were used as the images observed by the transmission electron microscopy. In the present specification, these HAADF images may be expressed as the STEM-HAADF images or transmission electron microscope images. Note that in the present specification, the transmission electron microscopy and the STEM-HAADF are equivalent expressions. Each cross section indicates an a-surface (that is, (11-20) surface), and an up-and-down direction of each cross section indicates a c-axis direction (that is, <0001> direction). In the STEM-HAADF image, a relatively heavy atom tends to be displayed brightly and a relatively light atom tends to be displayed darkly. In FIG. 4A to FIG. 4D, white circular dots regularly arranged are Ga. It can be learned that the p type GaN layer 30 in the lower half portion of each of FIG. 4A to FIG. 4D is GaN crystal phase. No crystal structure is observed in the $SiO_2$ layer in the upper half portion of each of FIG. 4A to FIG. 4D, and it can be learned that the $SiO_2$ layer is amorphous phase. The aluminum oxide layer in the sample No. 1 is the amorphous phase including microcrystal.

In FIG. 4A to FIG. 4D, a thickness of a layer that is provided in contact with the front surface 95 of the p type GaN layer 30 having the crystal structure and is prescribed by a contrast different from that of both of the p type GaN layer 30 and the gate insulating layer 44 in the STEM-HAADF image is defined as the thickness of the transition layer 42. Note that in FIG. 4A to FIG. 4D, the contrast of light and darkness is shown in black and white.

As the samples No. 1, No. 2 and No. 4, arrays of Ga atoms in the transition layer 42 can be observed although the arrays are disordered. In this case, a boundary between the transition layer 42 and the p type GaN layer 30 may be taken as a depth position of the regularly-arranged arrays of Ga atoms, and a boundary between the transition layer 42 and the $SiO_2$ layer may be determined according to the presence or absence of the Ga atoms. On the other hand, although as the sample No. 3, the boundary between the transition layer 42 and the p type GaN layer 30 may be determined according to the presence or absence of the arrays of the Ga atoms if the crystal state of the transition layer 42 is close to the amorphous state, in the present example, the boundary between the transition layer 42 and the $SiO_2$ layer is determined according to the contrast difference. In any case, in the samples No. 1 to No. 4, the contrast difference among the $SiO_2$ layer, the transition layer 42 and the p type GaN layer 30 is observed.

[SAMPLE NO. 1] The thickness of the transition layer 42 of the sample No. 1 was approximately 0.33 nm. Note that in the sample No. 1, the aluminum oxide layer has been formed in contact with the transition layer 42. Note that in the GaN semiconductor, a length between Ga-Ga (that is, a length of one molecule of Ga) is approximately 0.25 nm. For that reason, the thickness of the transition layer 42 can also be expressed as a thickness of approximately 1 molecular layer of Ga in the GaN semiconductor.

[SAMPLE NO. 2] The thickness of the transition layer 42 of the sample No. 2 was approximately 1.3 nm. The thickness of the transition layer 42 of the sample No. 2 can also be expressed as a thickness of approximately 5 molecular layers of Ga in the GaN semiconductor.

[SAMPLE No. 3] The thickness of the transition layer 42 of the sample No. 3 was approximately 1.48 nm. The thickness of the transition layer 42 of the sample No. 3 can also be expressed as a thickness of approximately 6 molecular layers of Ga in the GaN semiconductor.

[SAMPLE NO. 4] The thickness of the transition layer 42 of the sample No. 4 was approximately 0.54 nm. The thickness of the transition layer 42 of the sample No. 4 can also be expressed as a thickness of approximately 2 molecular layers of Ga in the GaN semiconductor.

Table 2 summarizes a relation between the thickness of the transition layer 42 and the field effect mobility respectively for the samples No. 1 to No. 4.

TABLE 2

| SAMPLE | THICKNESS OF TRANSITION LAYER 42 [nm] | | MAXIMUM VALUE OF FIELD EFFECT MOBILITY |
|---|---|---|---|
| | EDX | STEM | |
| No. 1 | 0.21 | 0.33 | 96 $cm^2$/Vs |
| No. 2 | 1.28 | 1.27 | 48 $cm^2$/Vs |
| No. 3 | 1.58 | 1.48 | 36 $cm^2$/Vs |
| No. 4 | 0.69 | 0.54 | NOT MEASURED |

Figure 5:
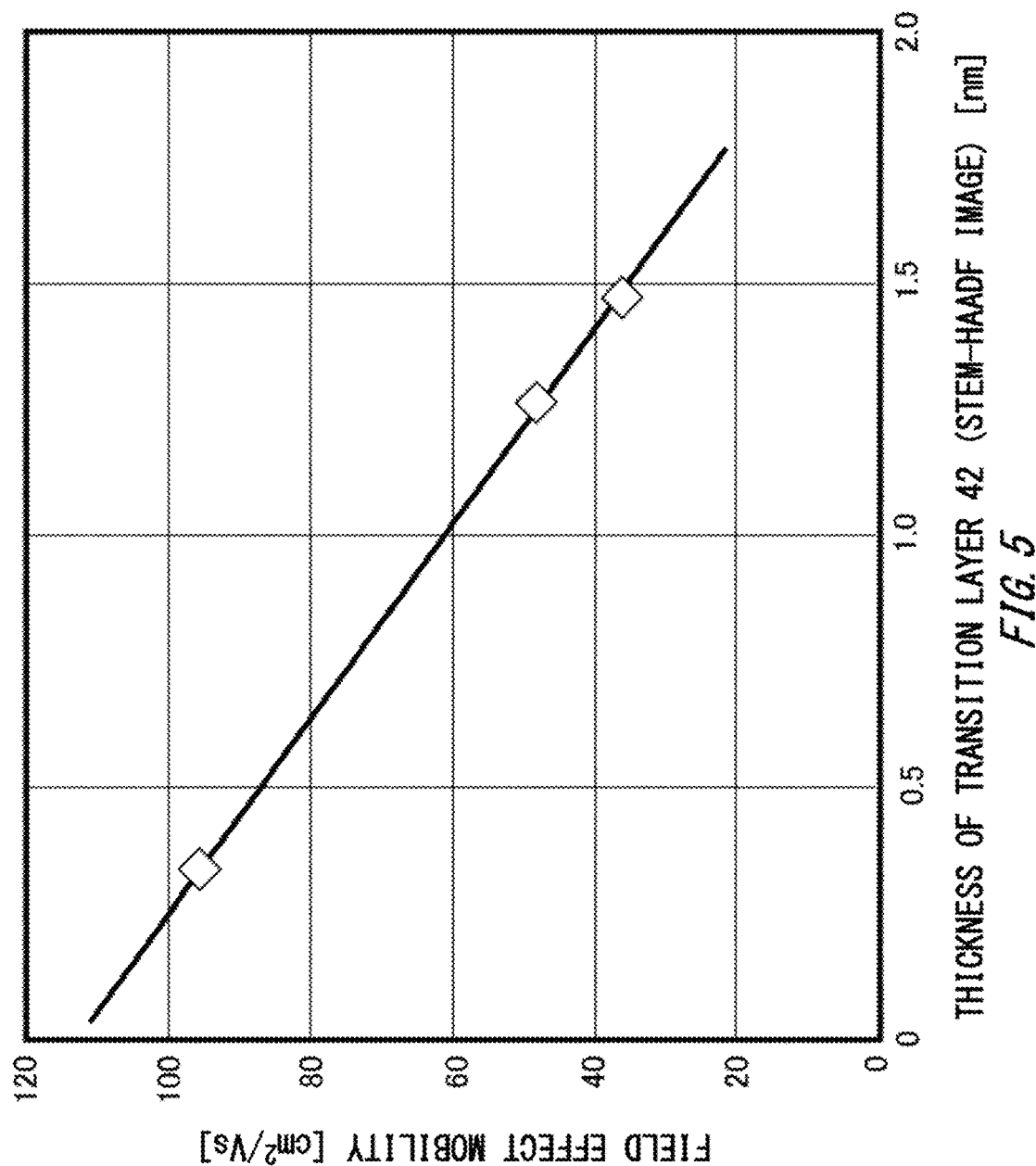
FIG. 5 is a graph showing a relation between the thickness of the transition layer 42 obtained from the STEM-HAADF images and the field effect mobility.

FIG. 5 is a graph showing a relation between the thickness of the transition layer 42 obtained from the STEM-HAADF image, and the field effect mobility. The horizontal axis indicates the thickness [nm] of the transition layer 42 measured by the STEM-HAADF of FIG. 4A to FIG. 4C. The vertical axis indicates the maximum value of the field effect mobility [$cm^2$/V·s] shown in Table 1. As shown in FIG. 5, the relation between the thickness of the transition layer 42 and the field effect mobility was clear. The measurement result shown in FIG. 5 is a relation similar to the relation between the thickness of the transition layer 42 and the field effect mobility in FIG. 3.

The fitting straight line in the graph of FIG. 5 indicated "field effect mobility [$cm^2$/V·s]=−51×(thickness [nm] of transition layer 42)+113". This is similar to the relational expression described in the description of FIG. 3. Utilizing the fitting straight line, the field effect mobility is 90 $cm^2$/V·s when the thickness of the transition layer 42 is approximately 0.45 nm, and the field effect mobility is 100 $cm^2$/V·s when the thickness of the transition layer 42 is approximately 0.26 nm. In this manner, by making the thickness of the transition layer 42 be 0.5 nm or less, preferably 0.4 nm or less, and further preferably 0.3 nm or less, a high field effect mobility can be achieved.

Figure 6:
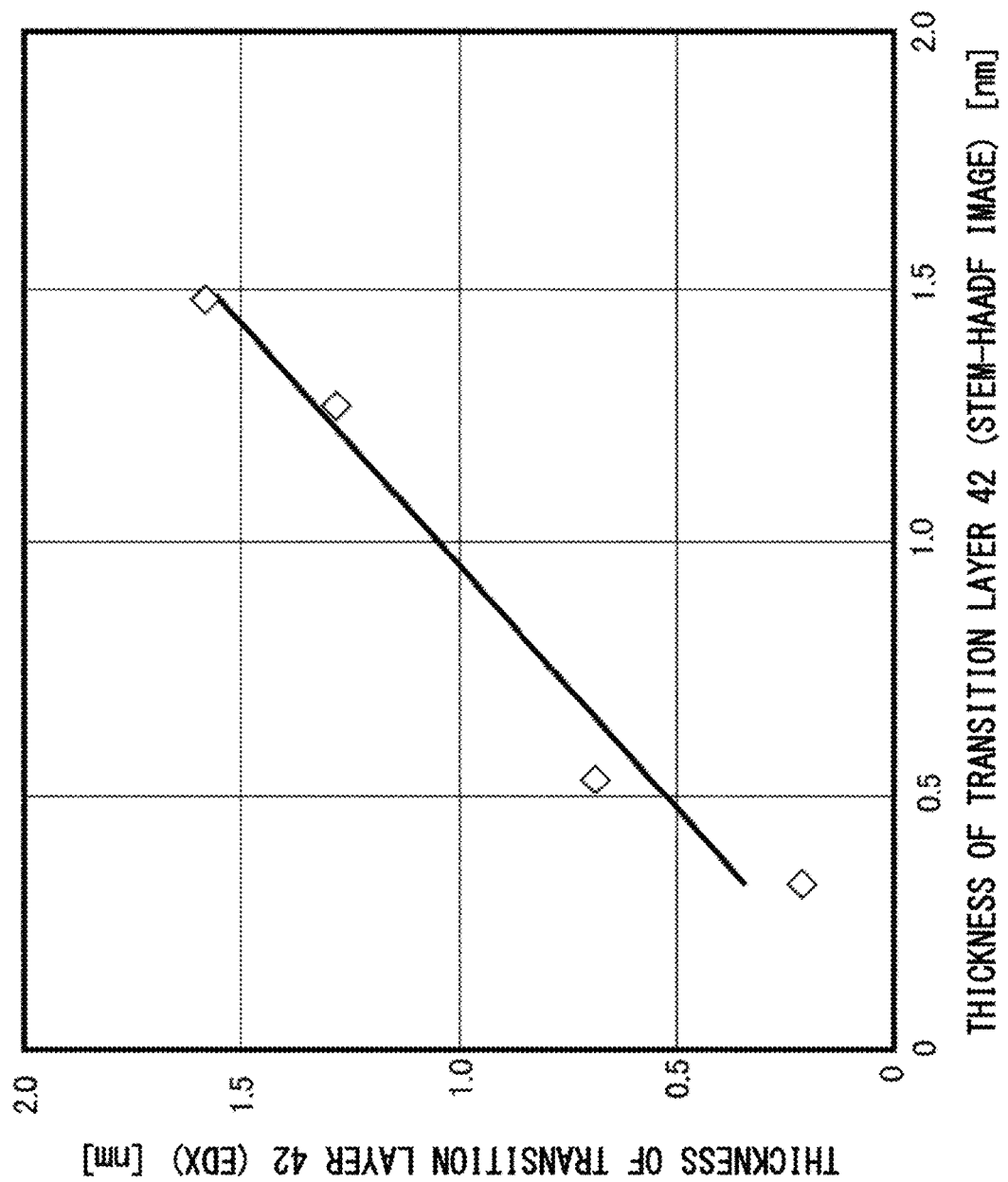
FIG. 6 is a graph showing a relation between the thickness of the transition layer 42 analyzed by EDX and the thickness of the transition layer 42 obtained from the STEM-HAADF images.

FIG. 6 is a graph showing a relation between the thickness of the transition layer 42 obtained from the measurement result of EDX, and the thickness of the transition layer 42 obtained from the STEM-HAADF image. The horizontal axis indicates the thickness [nm] of the transition layer 42 obtained from the STEM-HAADF image, and the vertical axis indicates the thickness [nm] of the transition layer 42 obtained from the measurement result of EDX. As shown in FIG. 6, the inclination of the graph is nearly 1. That is, it can be said that the quantitative evaluation by the measurement result of EDX approximately matches the evaluation obtained from the STEM-HAADF image. It can be learned that the transition layer can be derived from the contrast difference of the transmission electron microscope images.

As learned from a comparison between the samples No. 1 and No. 4, the thickness of the transition layer 42 in the sample No. 1 in which the aluminum oxide layer is provided to the gate insulating layer 44 can be made thin, compared to the sample No. 4 in which the aluminum oxide layer is not provided to the gate insulating layer 44. Because it can be learned, from the measurement results of the sample No. 2 and No. 3, that the field effect mobility can be made high if the transition layer 42 is made thin, it can be said that providing the aluminum oxide layer to the gate insulating layer 44 has a certain effect for improving the field effect mobility.

Figure 7:
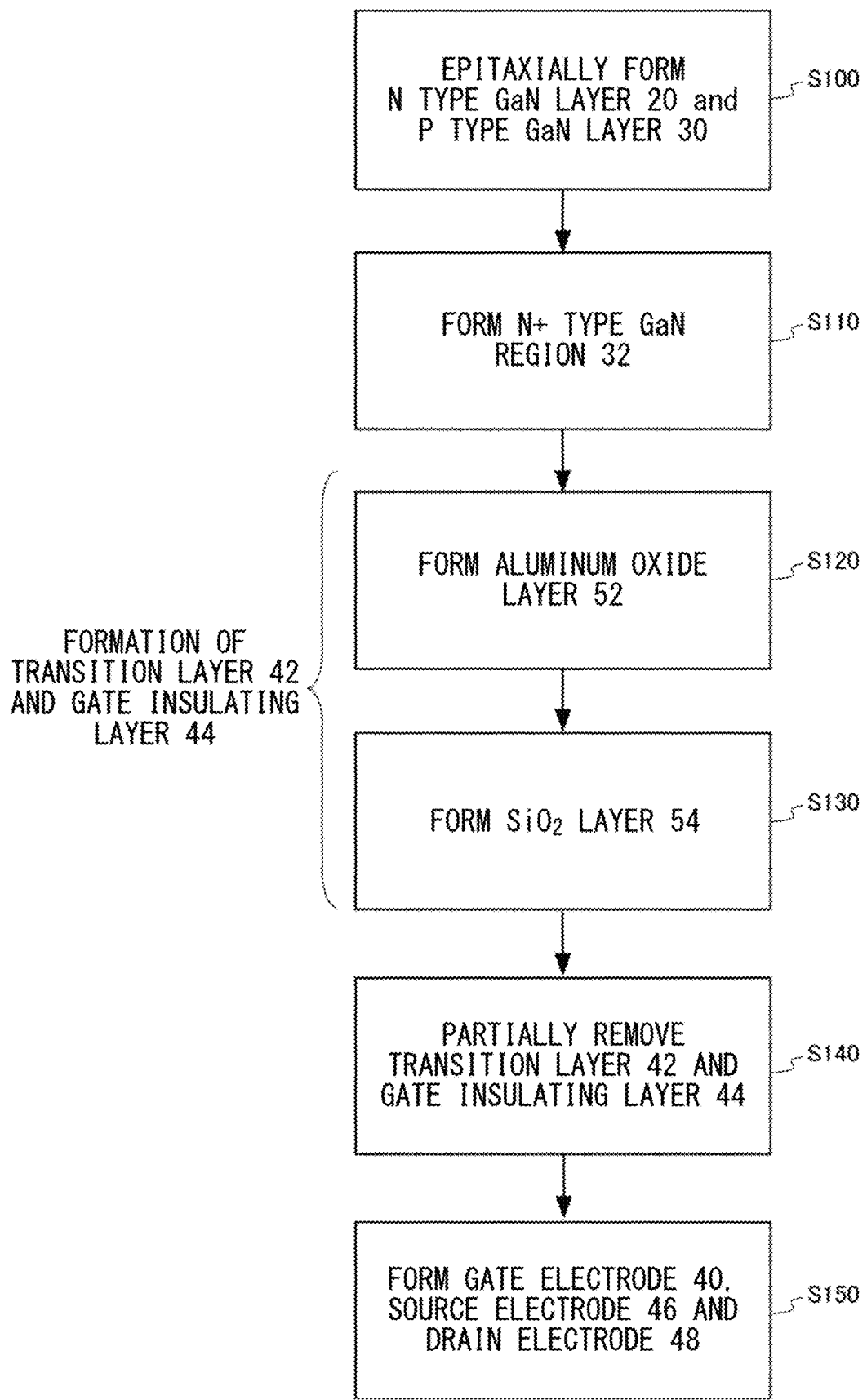
FIG. 7 is a flow chart showing a manufacturing method of the lateral MOSFET 100.

FIG. 7 is a flow chart showing a manufacturing method of the lateral MOSFET 100. In the present example, each step is carried out in an order from S100 to S150 (that is, in increasing order of the numbers). In the present example, the manufacturing method of the lateral MOSFET 100 corresponding to the above-described sample No. 1 is mainly described.

Figure 8:
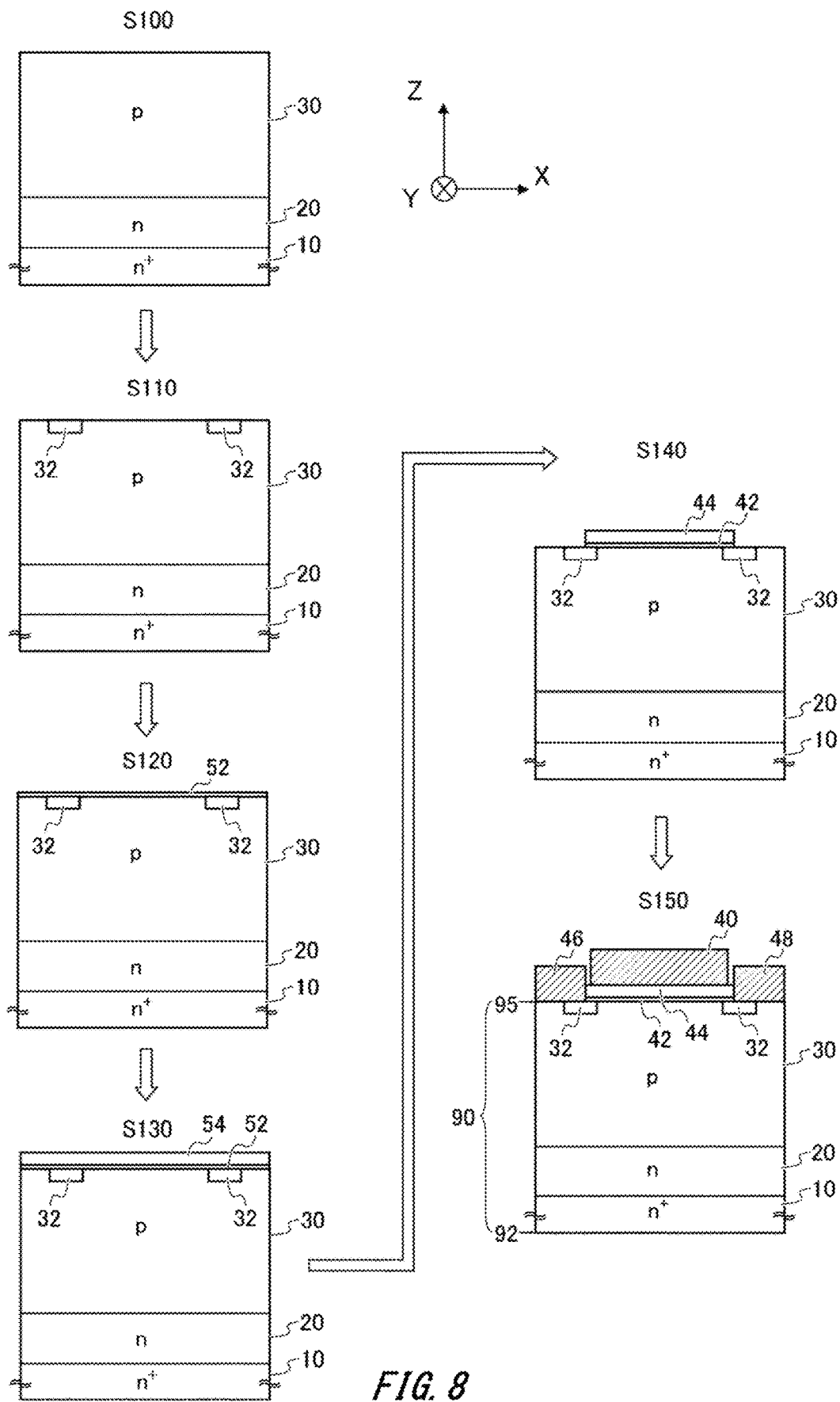
FIG. 8 shows each process of the manufacturing method of the lateral MOSFET 100.

FIG. 8 shows each process of the manufacturing method of the lateral MOSFET 100. S100 is a step of sequentially epitaxially forming the n type GaN layer 20 and the p type GaN layer 30 on the c-surface GaN substrate 10.

In the present example, raw material gas including trimethylgallium ($(CH_3)_3Ga$), hereinafter abbreviated as TMG), ammonia ($NH_3$) and monosilane ($SiH_4$), and pressing gas including nitrogen ($N_2$) and hydrogen ($H_2$) are made to flow on the GaN substrate 10. At this moment, the temperature of the GaN substrate 10 is set to 1100° C. Note that the Si element of monosilane may serve as the n type impurities in the n type GaN layer 20. Accordingly, the n type GaN layer 20 having a thickness of 1 μm and including Si element of $2E+16$ $cm^{-3}$ is formed.

After forming the n type GaN layer 20, the p type GaN layer 30 is formed. In the present example, raw material gas including TMG, ammonia and bis(cyclopentadienyl)magnesium ($Cp_2Mg$), and the pressing gas including nitrogen ($N_2$) and hydrogen ($H_2$) are made to flow on the GaN substrate 10. At this moment, the temperature of the n type GaN substrate 10 is set to 1050° C. Note that Mg of $Cp_2Mg$ may serve as the p type impurities in the p type GaN layer 30. Accordingly, the p type GaN layer 30 having a thickness of 4 μm and including Mg of $1E+17$ $cm^{-3}$ is formed.

After forming the n type GaN layer 20 and the p type GaN layer 30, the thermal treatment is performed to activate the impurities of the p type GaN layer 30. In the present example, the thermal treatment was performed on the GaN based semiconductor 90 for 30 minutes at 650° C. in nitrogen ($N_2$) gas atmosphere containing oxygen. Accordingly, S100 was finished.

S110 is a step of forming the $n^+$ type GaN region 32. In the present example, a resist mask having an aperture for forming the $n^+$ type GaN region 32 was formed, and via this resist mask, Si ions by a dosage of $3E+15$ [$cm^{-2}$] are implanted in the p type GaN layer 30 within a range of depth of approximately 0.1 μm from the front surface 95. Subsequently, to activate the impurities, the thermal treatment was performed on the GaN based semiconductor 90 for 10 minutes at 1000° C. in the nitrogen ($N_2$) gas atmosphere.

In the present example, after forming the $n^+$ type GaN region 32 at S110, before forming the aluminum oxide layer at S120, to remove the oxide layer from the front surface 95 of the p type GaN layer 30 or the $n^+$ type GaN region 32, the front surface 95 is etched by using dilute hydrofluoric acid.

S120 is a step of forming the aluminum oxide layer 52 on the p type GaN layer 30. The aluminum oxide layer 52 is one example of Al containing layer. At S120 of the present example, an Al metal layer having a thickness of 1.5 nm is formed, by vapor deposition method, on the p type GaN layer 30, and subsequently, the Al metal layer is oxidized in the atmosphere containing oxygen ($O_2$). At the step of oxidizing the Al metal layer, the thermal treatment may be performed for 30 minutes at 500° C. in an atmosphere containing oxygen ($O_2$) gas of 20% and nitrogen ($N_2$) gas of 80% in volume ratio, or instead of this, the Al metal layer may also be oxidized by being exposed to the air.

Note that in another example, at the step S120 of forming the aluminum oxide layer 52, the aluminum oxide may also be directly formed. For example, the aluminum oxide may be formed by plasma CVD method or atomic layer deposition method (ALD) by using trimethylaluminum (($CH_3)_3Al$, hereinafter abbreviated as TMA) and oxygen ($O_2$) gas or water ($H_2O$).

S130 is a step of forming the silicon oxide ($SiO_2$) layer 54 on the aluminum oxide layer 52. At S130 of the present example, the $SiO_2$ layer 54 having a thickness of 100 nm is formed by the plasma CVD method by using tetraethylorthosilicate (TEOS) and oxygen ($O_2$) gas. More specifically, after forming oxygen radical by the oxygen plasma, the $SiO_2$ layer 54 is formed by reacting the TEOS gas with the oxygen radical. When performing the $O_2$ plasma treatment, the TEOS gas was not made to flow and oxygen plasma discharge was performed for 10 minutes.

Note that in another example, the $SiO_2$ layer 54 may also be formed by the plasma CVD method by using TEOS and water ($H_2O$) or by using monosilane and oxygen ($O_2$) gas or water ($H_2O$). Note that instead of the plasma CVD method, the atomic layer deposition method (ALD) may also be used. Note that in the plasma CVD method and atomic layer deposition method, a raw material in a gas state may be used. That is, the water ($H_2O$) may be water vapor, and TEOS and monosilane may also be gas.

In this manner, the transition layer 42 and the gate insulating layer 44 which correspond to the above-described sample No. 1 are formed. Note that to form the transition layer 42 and the gate insulating layer 44 which are correspond to the above-described samples No. 2 to No. 4, the process of S120 may be omitted. Also, to form the transition layer 42 and the gate insulating layer 44 which are correspond to the above-described sample No. 3, the thermal treatment may be performed on the transition layer 42 and the gate insulating layer 44 for 30 minutes at 700° C. in the nitrogen ($N_2$) gas atmosphere.

S140 is a step of partially removing the laminate of the transition layer 42 and the gate insulating layer 44. At S140, by using a resist mask having an aperture in a region corresponding to the source electrode 46 and the drain electrode 48, the transition layer 42 and the gate insulating layer 44 are partially removed by etching.

S150 is a step of forming the gate electrode 40, the source electrode 46 and the drain electrode 48. In the present example, an Al electrode having a thickness of 200 nm is vapor deposited, and subsequently, each electrode is formed by appropriately etching.

Note that in another example, S120 may also be omitted. That is, to form the transition layer 42 and the gate insulating layer 44, the $SiO_2$ layer 54 only may be formed without forming the aluminum oxide layer 52.

Figure 9:
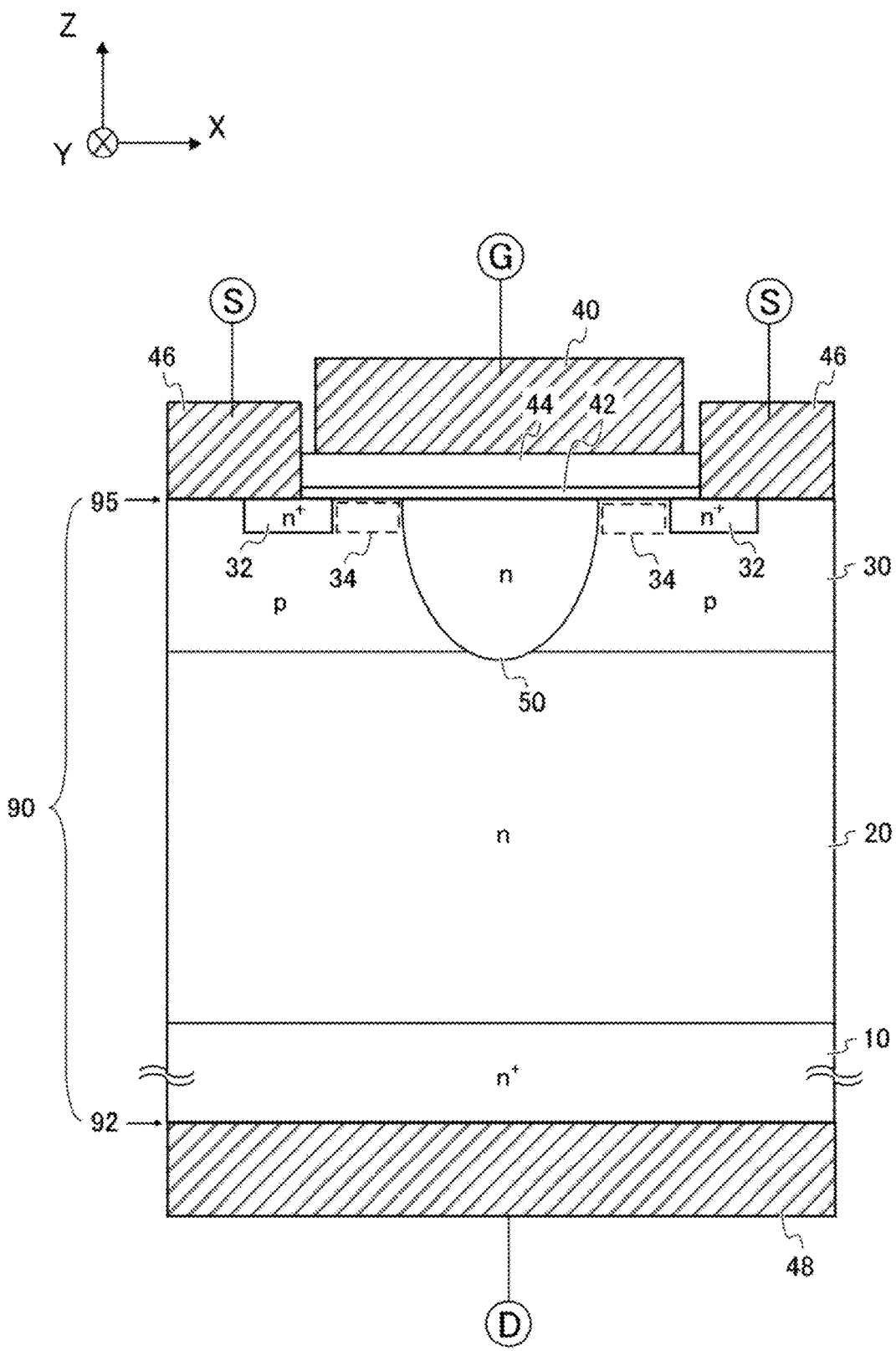
FIG. 9 shows a cross-section view of a vertical MOSFET 200 in a second embodiment.

FIG. 9 is a cross-section view of the vertical MOSFET 200 in a second embodiment. The vertical MOSFET 200 of the present example is planar gate type. In the vertical MOSFET 200 of the present example, electron current flows from the source electrode 46 on the front surface 95 toward the drain electrode 48 provided in contact with the back surface 92. Also, the vertical MOSFET 200 of the present example includes n type GaN layer region 50, whose bottom reaches the n type GaN layer 20, between a pair of the n+ type GaN regions 32. The n type GaN layer region 50 is spaced apart from the n+ type GaN regions 32 in the X-axis direction. Further, the n type GaN layer 20 is made thick compared to the p type GaN layer 30 so that a depletion layer can extend in the depth direction. The present example is different from the first embodiment mainly in this point.

Figure 10:
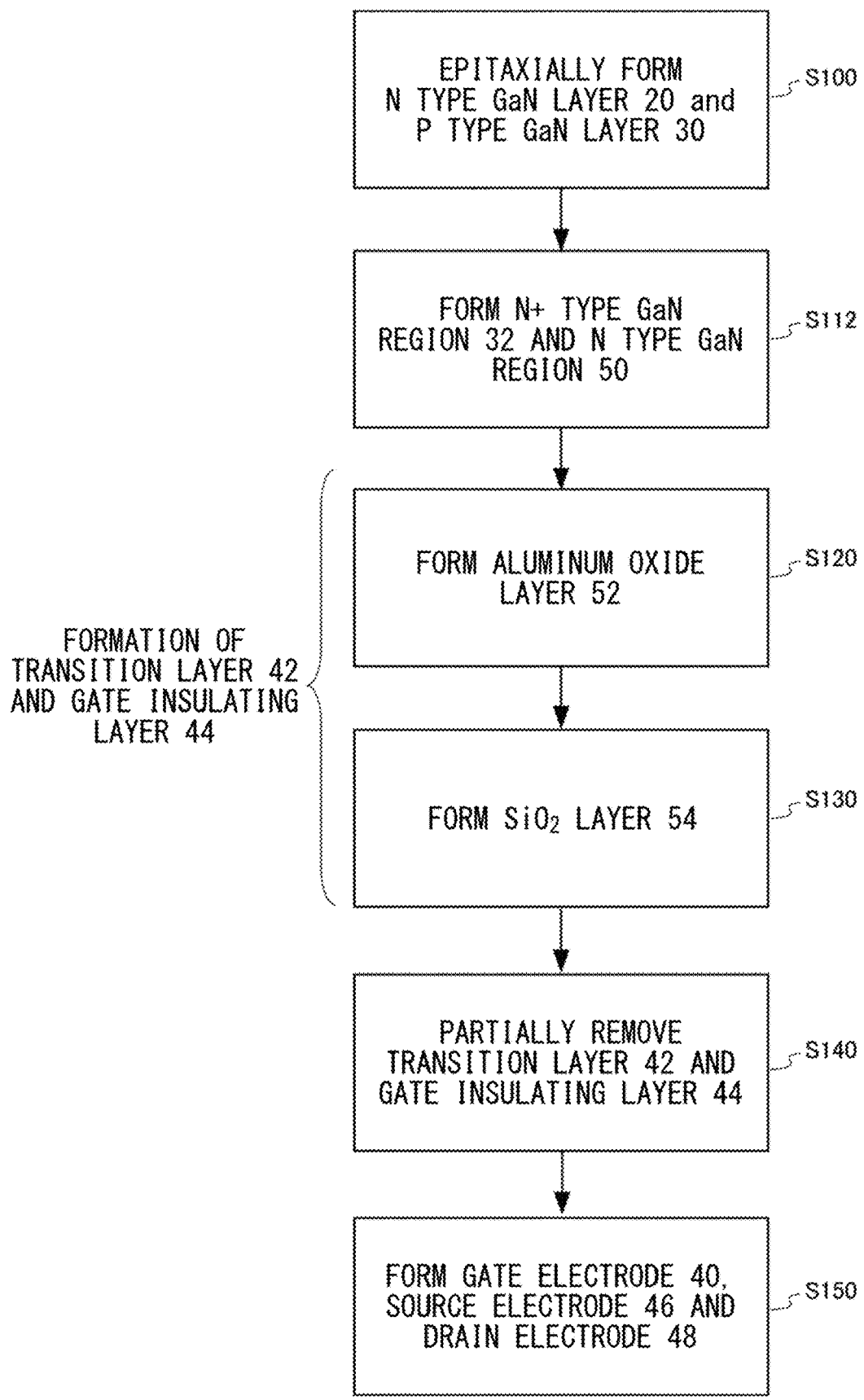
FIG. 10 is a flow chart showing a manufacturing method of the vertical MOSFET 200.

FIG. 10 is a flow chart showing a manufacturing method of the vertical MOSFET 200. In the present example as well, each step is performed in an order from S100 to S150 (that is, in increasing order of the numbers). The manufacturing method of the present example includes S112 that is different from S110 of the first embodiment.

Figure 11:
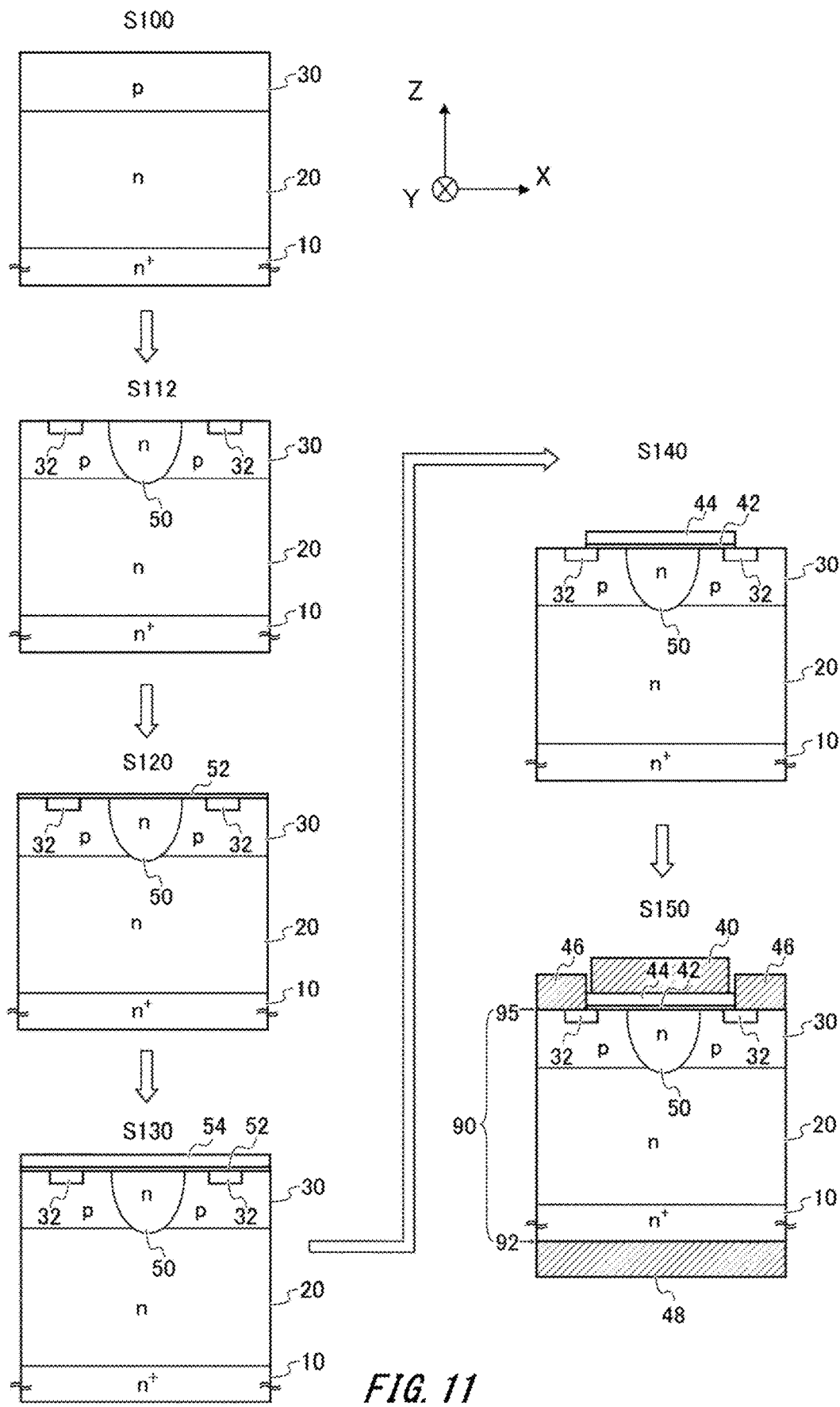
FIG. 11 shows each process of the manufacturing method of the vertical MOSFET 200.

FIG. 11 shows each process of the manufacturing method of the vertical MOSFET 200. S112 and S150 that are different from the first embodiment are described. S112 is a step of forming the n+ type GaN region 32 and the n type GaN layer region 50. S112 may include a first ion implantation step of implanting Si ions by using a first resist mask having an aperture for forming the n+ type GaN region 32, and a second ion implantation step of implanting the Si ions by using a second resist mask having an aperture for forming the n type GaN layer region 50. Instead of this, the Si ions may also be implanted by using one resist mask. In one example, the thickness of the resist mask may be made large in an order of: a region in which no ion implantation is performed, a region on which the n+ type GaN region 32 is to be formed and a region on which the n type GaN layer region 50 is to be formed, and then the Si ion implantation may also be performed. Note that the resist mask may not be provided to the region on which the n type GaN layer region 50 is to be formed.

A dosage for forming the n+ type GaN region 32 may be 3E+15 [cm$^{-2}$], and an implantation depth may be approximately 0.1 μm. A dosage for forming the n type GaN layer region 50 may be 3E+13 [cm$^{-2}$], and the implantation depth may be approximately 0.6 μm. Note that in the present example, the thickness of the p type GaN layer 30 was set to 0.4 μm. After implanting the Si ions therein, to activate the impurities, the thermal treatment may be performed on the GaN based semiconductor 90 for 10 minutes at 1000° C. in the nitrogen (N$_2$) gas atmosphere.

At S150, the source electrode 46 is formed in contact with the front surface 95. On the other hand, the drain electrode 48 is formed in contact with the back surface 92.

Note that in another example, S120 may also be omitted. That is, to form the transition layer 42 and the gate insulating layer 44, the SiO$_2$ layer 54 only may be formed without forming the aluminum oxide layer 52.

Figure 12:
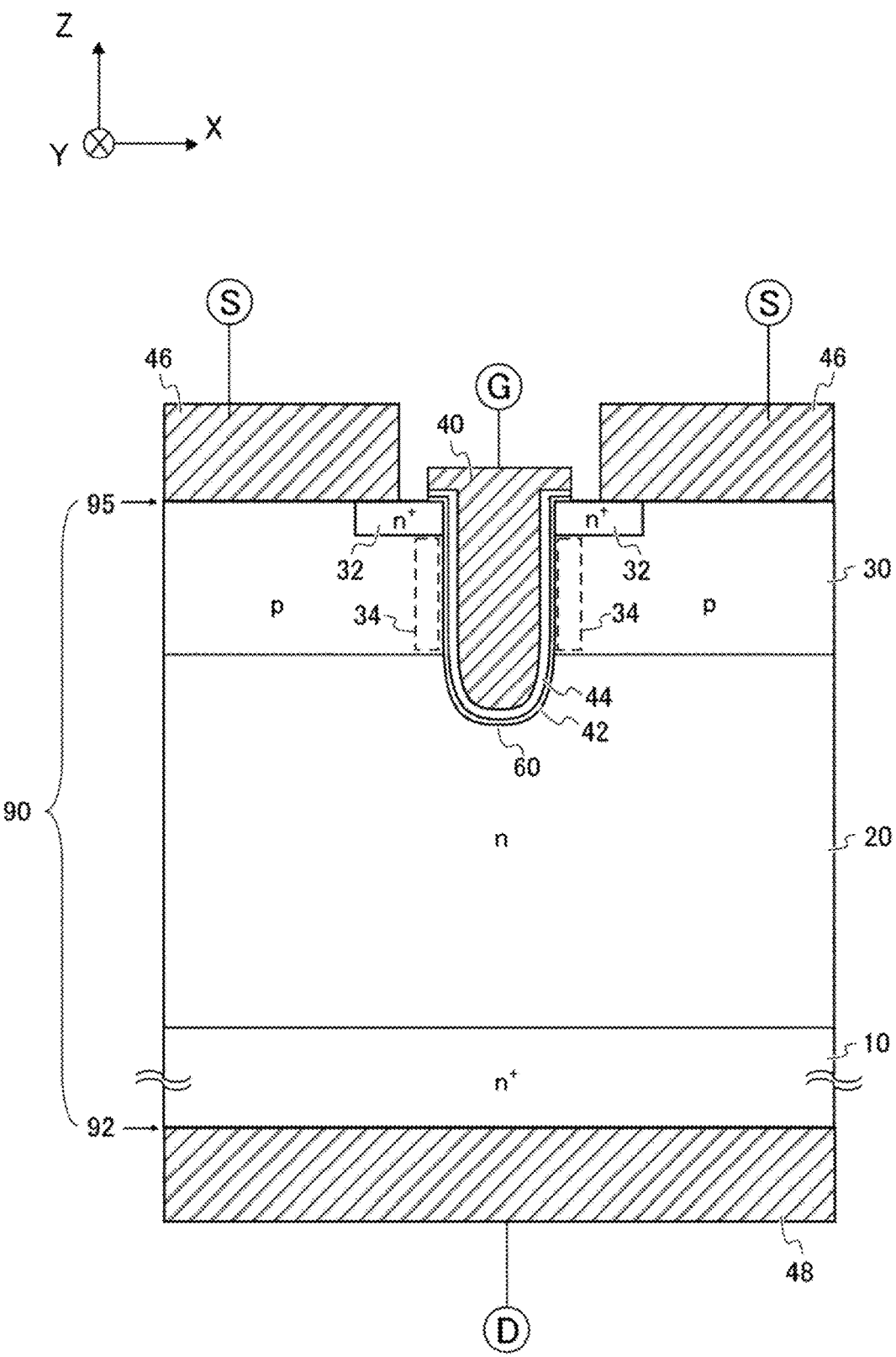
FIG. 12 shows a cross-section view of a vertical MOSFET 300 in the third embodiment.

FIG. 12 is a cross-section view of a vertical MOSFET 300 in a third embodiment. The vertical MOSFET 300 of the present example is trench gate type. In the vertical MOSFET 300 of the present example, electron current flows from the source electrode 46 on the front surface 95 toward the drain electrode 48 provided in contact with the back surface 92. Also, the vertical MOSFET 300 of the present example has a trench 60, whose bottom reaches the n type GaN layer 20, between a pair of the n+ type GaN regions 32. The aluminum oxide layer 52 is provided in contact with the bottom and a side surface of the trench 60, and the SiO$_2$ layer 54 is formed in contact with the aluminum oxide layer 52. Accordingly, the transition layer 42 and the gate insulating layer 44 are formed on an inner wall of the trench 60. In the inner portion of the trench 60, the gate electrode 40 is formed in contact with the gate insulating layer 44. Further, in the present example, the n type GaN layer 20 is made thick compared to the p type GaN layer 30 so that the depletion layer can extend in the depth direction. The present example is different from the first embodiment mainly in this point.

Figure 13:
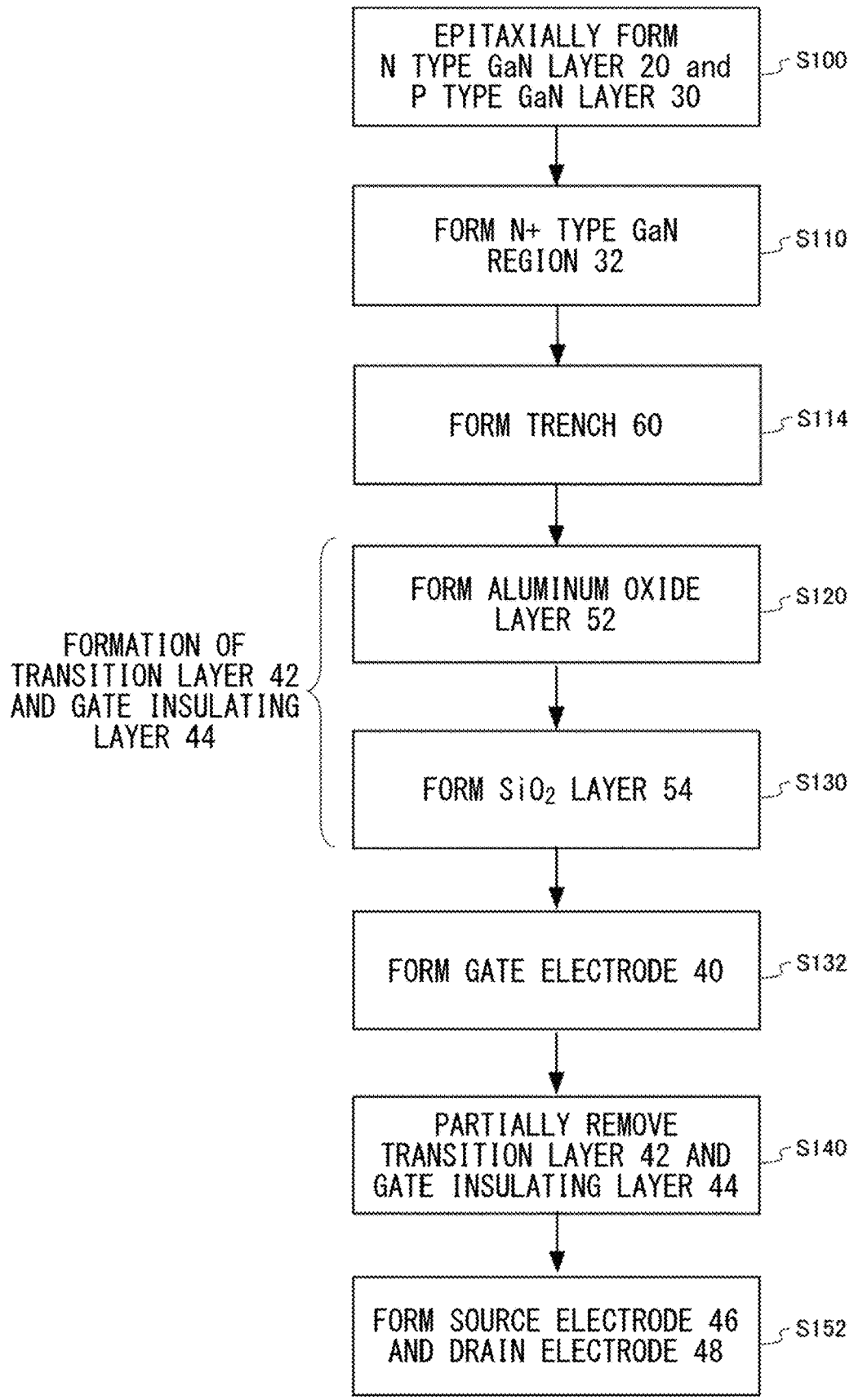
FIG. 13 is a flow chart showing a manufacturing method of the vertical MOSFET 300.

FIG. 13 is a flow chart showing a manufacturing method of the vertical MOSFET 300. In the present example as well, each step is performed in an order from S100 to S150 (that is, in increasing order of the numbers). The manufacturing method of the present example includes S114, S132 and S152, different from the first embodiment.

Figure 14:
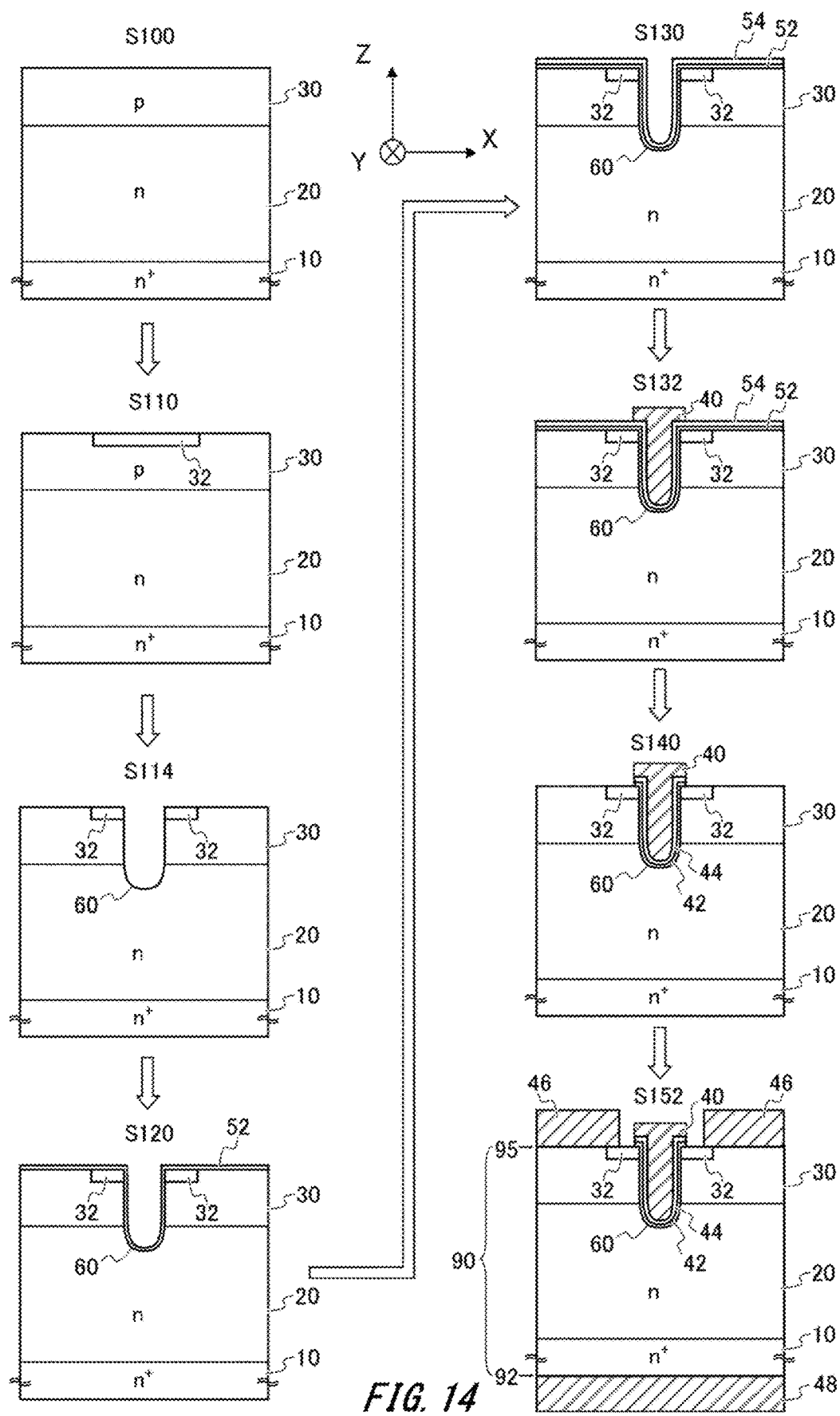
FIG. 14 shows each process of the manufacturing method of the vertical MOSFET 300.

FIG. 14 shows each process of the manufacturing method of the vertical MOSFET 300. S114, S132 and S152 which are different from the first embodiment are described. S114 is a step of forming the trench 60. In the present example, by partially etching the p type GaN layer 30 and the n type GaN layer 20, the trench 60 that divides the n+ type GaN region 32 in the x-axis direction and reaches the p type GaN layer 30 is formed.

S132 is a step of forming the gate electrode 40. The gate electrode 40 of the present example at least completely fills the inner portion of the trench 60. For example, after depositing the Al metal layer or the polycrystal Si layer, the Al metal layer or the polycrystal Si layer is patterned into a predetermined shape. S152 is a step of forming the source electrode 46 and the drain electrode 48. At S152, the source electrode 46 that is in contact with the front surface 95, and the drain electrode 48 that is in contact with the back surface 92 are formed. The source electrode 46 may be patterned into a predetermined shape after depositing the Al metal layer in contact with the front surface 95. On the other hand, the drain electrode 48 can be formed by depositing the Al metal layer in contact with the back surface 92.

Note that in another example, S120 may also be omitted. That is, to form the transition layer 42 and the gate insulating layer 44, the SiO$_2$ layer 54 only may be formed without forming the aluminum oxide layer 52.

In the above description, the gallium nitride based semiconductor layer of the first conductivity type was taken as the p type GaN layer and the semiconductor device was taken as the n channel FET. However, for the semiconductor, similar characteristics can be obtained regardless of the type of the majority carrier. Even when the gallium nitride based semiconductor layer of the first conductivity type is taken as the n type GaN layer and the semiconductor device is taken as the p channel FET, a similar result is obtained.

Figure 15:
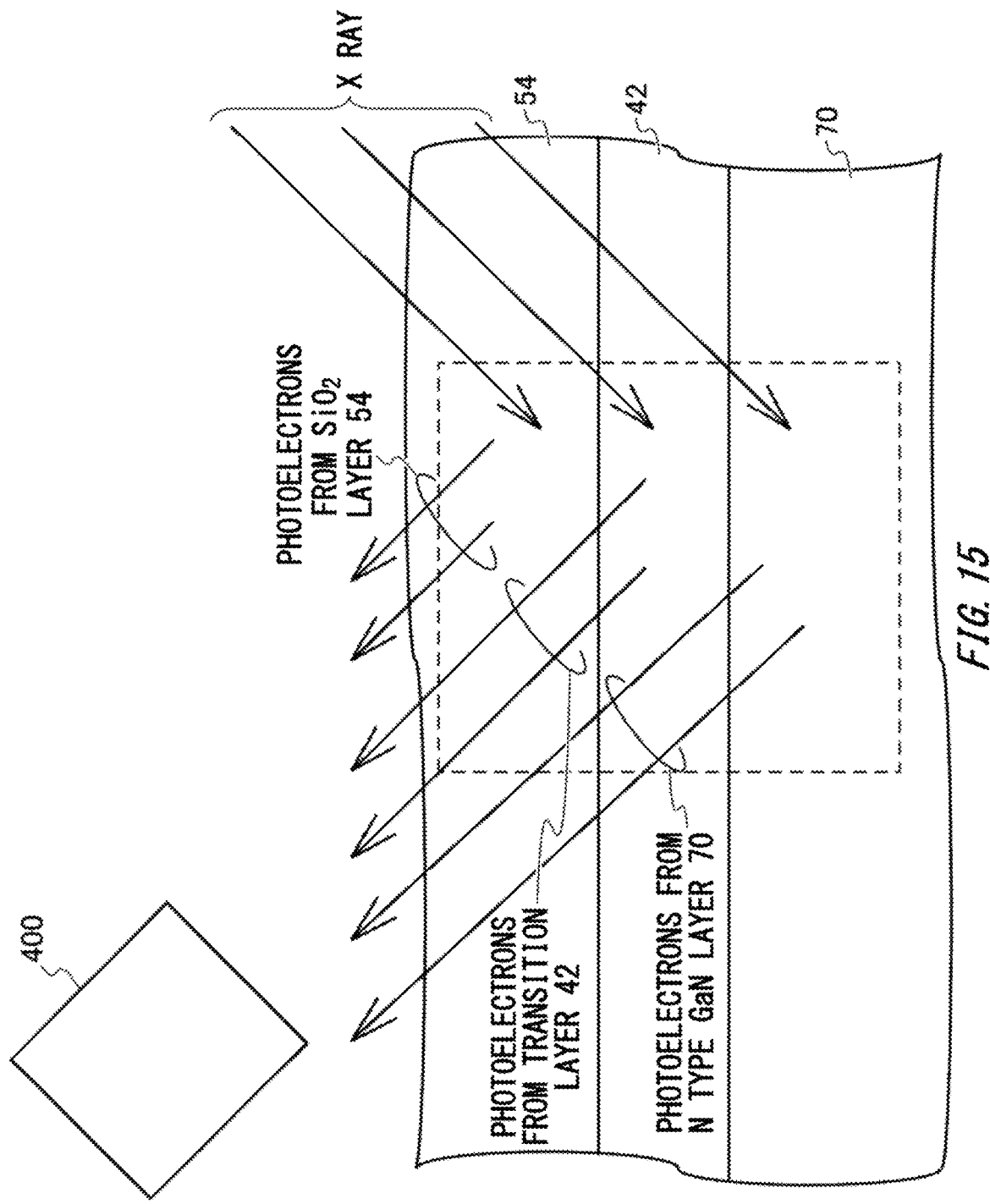
FIG. 15 describes a schematic diagram of an XPS analysis experiment.

FIG. 15 describes a summary of the X-ray Photoelectron Spectroscopy (XPS, that is, photoelectron spectroscopy) analysis experiment. An AlKα line is used as X ray. X ray has good transmission and is irradiated through all of the laminated structure of the n type GaN layer 70, the transition layer 42 and the SiO$_2$ layer 54. On the other hand, because an escape depth of photoelectrons excited by X ray is several nm, to enable the XPS analysis to be performed, the thickness of the SiO$_2$ layer 54 was set to 1 nm. As a result, photoelectrons emitted from the n type GaN layer 70, the SiO$_2$ layer 54 and an interface region therebetween (that is, the transition layer 42) are detected. Compared to the SiO$_2$ layer 54 and the transition layer 42, the n type GaN layer 70 is a sufficiently thick layer. For easy understanding, the region on which the photoelectrons are escaped is shown by dashed lines. Also, an angle formed by a direction in which the detector 400 captures the photoelectrons and a horizontal plane of a sample having the laminated structure was set to 45 degrees.

The n type GaN layer 70 mainly contains Ga—N bond. On the other hand, because the transition layer 42 contains gallium oxide, the transition layer 42 mainly contains Ga—O bond. Note that although the gallium oxide is, for example, $Ga_2O_3$, the gallium oxide may have a different composition ratio from this. The photoelectrons emitted from 2p orbital of Ga atom contains Ga—N bond component derived from the n type GaN layer 70 and Ga—O bond component derived from the transition layer 42. These binding energies respectively detected are slightly different from one another. Here, in the present XPS analysis, an intensity (the vertical axis) corresponding to the binding energy (the horizontal axis) of 2p orbital of Ga atom was measured. Note that in the present specification, the 2p orbital of Ga atom may be abbreviated as Ga 2p.

The Ga 2p peak intensity is obtained from the photoelectrons emitted from Ga of the n type GaN layer 70 and Ga of the transition layer 42. With the increase of the transition layer 42, a binding energy position corresponding to the Ga 2p peak intensity also changes from the Ga—N binding energy position to the Ga—O binding energy position. Also, the Ga—N bond component included in the Ga 2p peak intensity is decreased and the Ga—O bond component is increased. The thickness of the transition layer 42 can be calculated by using an intensity ratio of the Ga—N component to the Ga—O component by performing waveform separation of the Ga—N bond component and the Ga—O bond component (the detail is described below).

An intensity peak energy of a pure Ga—N bond can be obtained in advance by performing the XPS analysis on the n type GaN layer 70 having a clean front surface. Energy corresponding to the intensity peak of the Ga—N bond can be obtained by exposing a clean front surface by etching the front surface of the n type GaN layer 70 in high vacuum before performing the XPS analysis on the n type GaN layer 70 after the epitaxial growth. Energy corresponding to the intensity peak of the pure Ga—O bond can also be obtained in advance by performing the XPS analysis on the oxidized front surface of the n type GaN layer 70. Also, even if the oxidized front surface of the n type GaN layer 70 or the n type GaN layer 70 after the epitaxial growth cannot be a pure Ga—N bond phase or a pure Ga—O bond phase, the peak energy or the peak waveform can be obtained by the waveform separation. In the present experiment, the energy corresponding to the intensity peak of the Ga—N bond was 1117.4 eV, and the energy corresponding to the intensity peak of the Ga—O bond was 1118.2 eV. As described below, in the present experiment, a peak waveform of an actual measurement related to the Ga 2p was separated by utilizing the peak energies corresponding to the intensity peaks of the Ga—N bond and the Ga—O bond, and the waveforms corresponding to the intensity peaks. Note that in the present specification, the peak waveform actually measured relating to the Ga 2p may be abbreviated as Ga 2p.

Figure 16A:
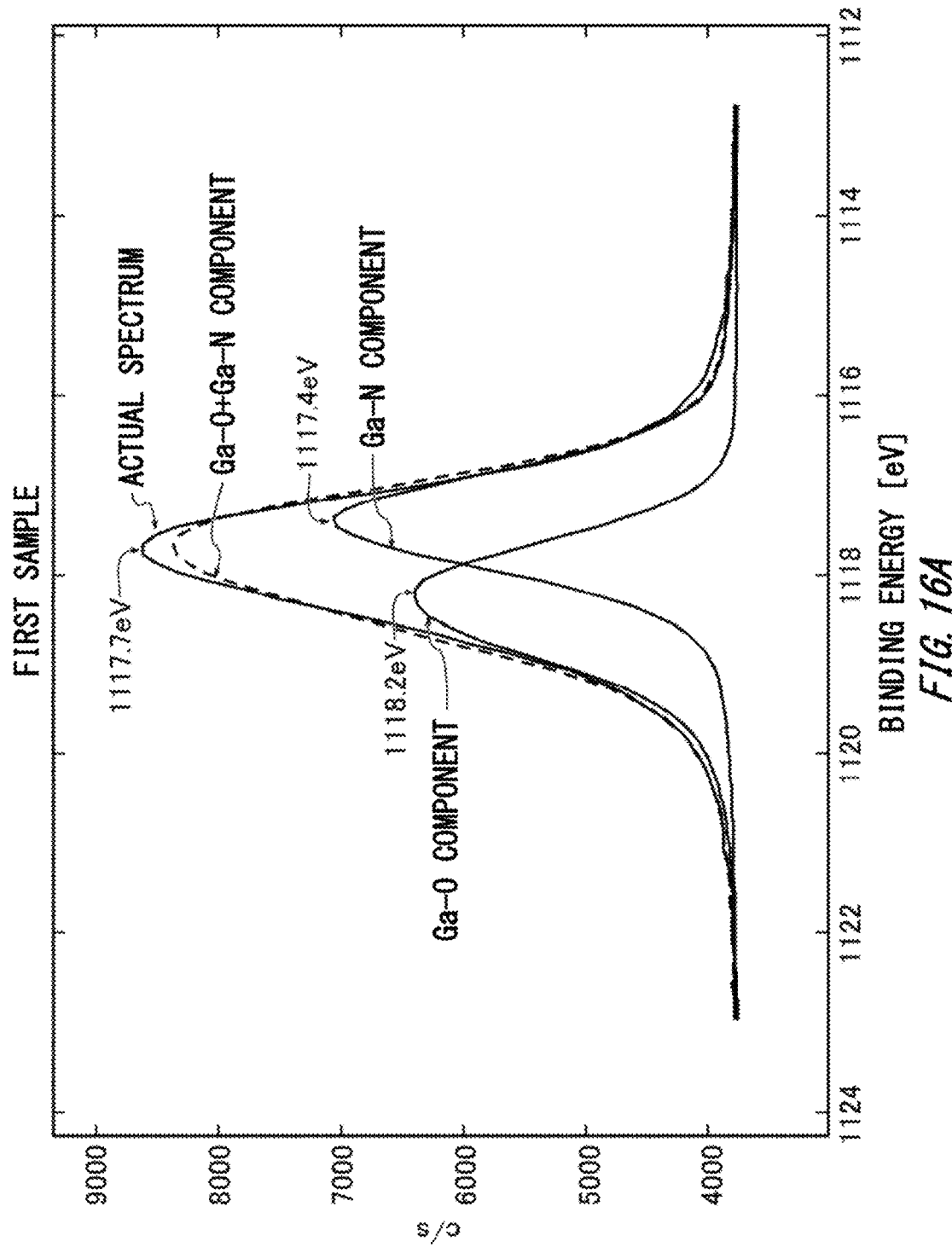
FIG. 16A shows a result of analyzing the Ga2p spectrum of the first sample.

FIG. 16A shows an XPS analysis result for a first sample. The vertical axis indicates an intensity (counts per second, abbreviated as c/s), and the horizontal axis indicates the binding energy [eV]. The curve having the highest intensity peak indicates actual measurement values obtained by measuring the 2p orbital of Ga atom. The term "Ga—N component" in FIG. 16A is the component of the Ga—N bond, and the peak energy is 1117.4 eV. Also, the term "Ga—O component" in FIG. 16A is the component of the Ga—O bond, and the peak energy is 1118.2 eV. The curve (the dashed line) having the second highest intensity peak indicates a combination of the component of the Ga—O bond and the component of the Ga—N bond (the Ga—O+Ga—N component in FIG. 16A).

In the present experiment, the waveform of the spectrum of the photoelectrons emitted from the Ga 2p (a peak-like waveform showing an intensity change of the photoelectrons relative to the binding energies) was separated into the "Ga—N component" and the "Ga—O component". Specifically, by using a waveform function of the "Ga—N component" and a waveform function of the "Ga—O component", their heights only are changed to fit the actual measurement.

In the first sample, the binding energy of the peak of the Ga 2p spectrum actually measured was 1117.7 eV. For that reason, a difference $\Delta_{Ga}$ between this energy 1117.7 eV and the binding energy 1117.4 eV of the Ga—N bond was 0.3 eV. In this manner, that the peak energy of the Ga 2p spectrum actually measured is higher than the peak energy of the spectrum of the "Ga—N component" indicates that the Ga—O bond component is contained.

It is clear, from an experimental result described below as well, that the larger the peak energy of the Ga 2p spectrum actually measured, the more Ga—O bonds the transition layer 42 contains. Because the energy position of the Ga—O bond may be considered to be fixed, it can be said that the larger the above-described energy difference $\Delta_{Ga}$, the more Ga—O bond amount the transition layer 42 contains. If the weight or quantity of the gallium oxide in the transition layer 42 is equal to or less than that of the gallium oxide in the transition layer 42 of the first sample, the energy difference $\Delta_{Ga}$ may be equal to or less than 0.3 eV.

In the present experiment, further, the spectrum was also measured for the photoelectrons emitted from 1s orbital of N atom of the Ga—N bond, and the binding energy of the peak was 397.0 eV. By utilizing the N 1s binding energy, the influence of adsorption of impurities contained in the air, surface charging or the like on the XPS analysis can be reduced. For example, the adsorption of impurities such as hydrocarbons on the sample surface results in a surface potential change. The photoelectrons emitted from the Ga atoms or N atoms in the inner portion of the sample are affected by the same surface potential. By using the N 1s binding energy, the influence of the surface potential on the binding energy difference between two atoms can be eliminated. In this manner, the N 1s binding energy may be an effective reference energy. Note that in the present specification, the 1s orbital of N atom may be abbreviated as N 1s.

Similar to the above-described energy difference $\Delta_{Ga}$, a difference $\Delta_{Ga-N}$ of the binding energies between the peak of the N 1s spectrum and the peak of the Ga 2p spectrum can be used. In the present experiment, the difference $\Delta_{Ga-N}$ of the binding energies between the peak binding energy 1117.7 eV of the Ga 2p spectrum actually measured and the peak binding energy 397.0 eV of the N 1s was 720.7 eV. The size of the energy difference $\Delta_{Ga-N}$ may show how many Ga—N bond components and Ga—O bond components the transition layer 42 contains. It can be said that the larger the energy difference $\Delta_{Ga-N}$, the more amounts of the Ga—O bonds the transition layer 42 contains. If the weight or quantity of the gallium oxide in the transition layer 42 is equal to or less than that of the gallium oxide in the transition layer 42 of the first sample, the energy difference $\Delta_{Ga-N}$ may be equal to or less than 720.7 eV.

Note that instead of the above-described energy differences $\Delta_{Ga}$ and $\Delta_{Ga-N}$, an intensity ratio of Ga—O component/Ga—N component obtained by separating the waveform of the Ga 2p spectrum into the "Ga—N component"

and the "Ga—O component" may also be used. In the first sample, the intensity ratio of Ga—O/Ga—N was 0.9. According to this, it can be learned that in the first sample, the amount of the Ga—N bond components are relatively large. Also, if the weight or quantity of the gallium oxide in the transition layer 42 is equal to or less than that of the gallium oxide in the transition layer 42 of the first sample, the intensity ratio of Ga—O/Ga—N may be equal to or less than 0.9. Further, in another example, the intensity ratio of Ga—O/Ga—N may also be equal to or less than 1.0.

Figure 16B:
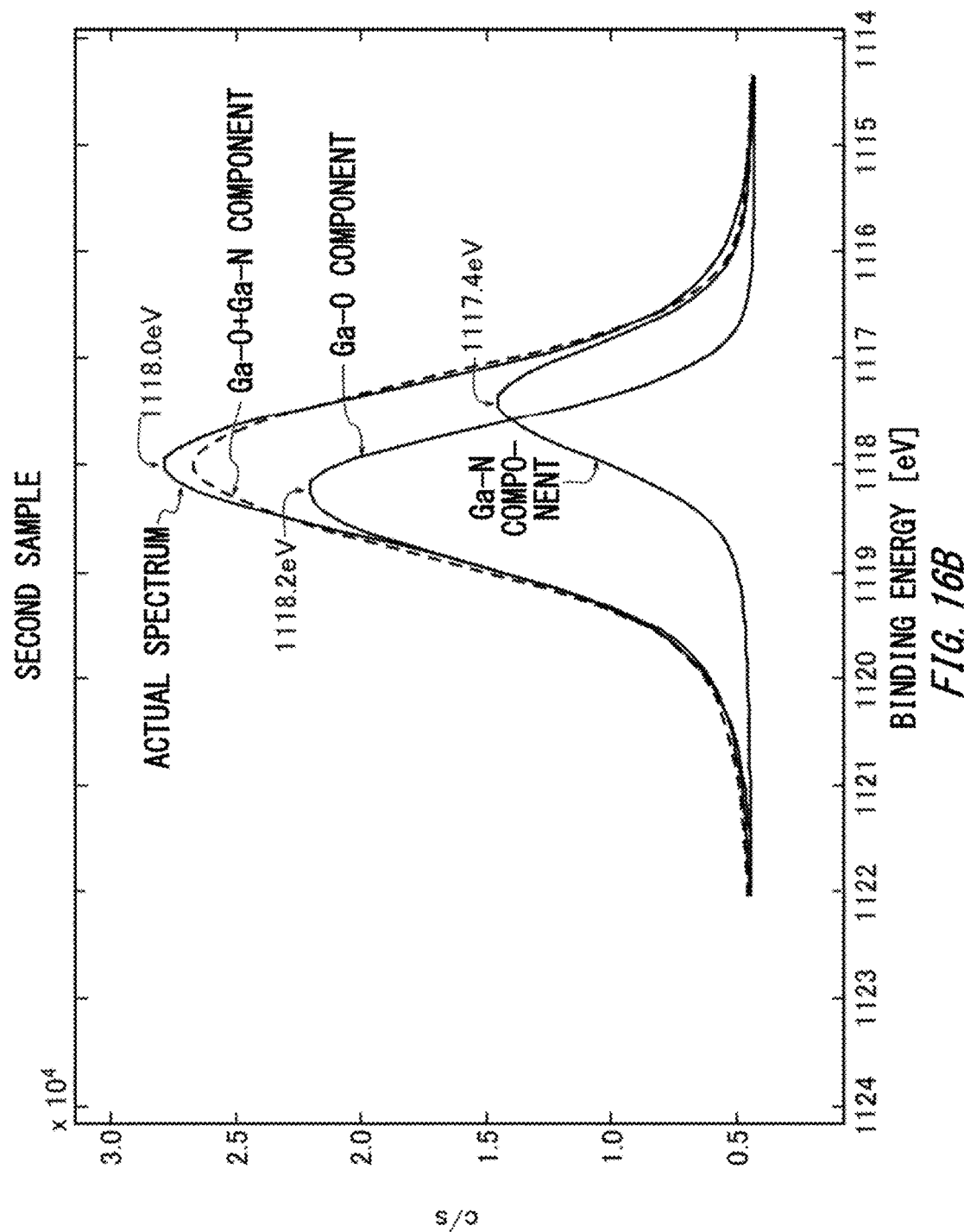
FIG. 16B shows a result of analyzing the Ga2p spectrum of the second sample.

FIG. 16B shows an XPS analysis result for a second sample. The vertical axis and the horizontal axis are the same as those of FIG. 16A. In FIG. 16B, the curve having the highest intensity peak is an actually-measured waveform of the 2p orbital of Ga atom obtained by performing the XPS analysis on the interface region, and the peak energy is 1118.0 eV. The "Ga—N component" in FIG. 16B is the component of the Ga—N bond, and the peak energy is 1117.4 eV. Also, the "Ga—O component" in FIG. 16B is the component of the Ga—O bond, and the peak energy is 1118.2 eV. Also, the "Ga—O+Ga—N component" waveform (the dashed line) positioned in a slightly lower portion than this actually-measured waveform is a combination of the component of the Ga—O bond and the component of the Ga—N bond.

In the second sample, the difference $\Delta_{Ga}$ between the peak binding energy 1118.0 eV in the Ga 2p spectrum actually measured and the Ga—N binding energy 1117.4 eV was 0.6 eV. Note that if the weight or quantity of the gallium oxide in the transition layer 42 of the second sample is equal to or less than that of the gallium oxide in the transition layer 42, the energy difference $\Delta_{Ga}$ may be equal to or less than 0.6 eV.

Also, the difference $\Delta_{Ga-N}$ between the peak binding energy 1118.0 eV of the Ga 2p spectrum and the peak binding energy 397.0 eV of the N is spectrum was 721.0 eV. Note that if the weight or quantity of the gallium oxide in the transition layer 42 of the second sample is equal to or less than that of the gallium oxide in the transition layer 42, the energy difference $\Delta_{Ga-N}$ may be equal to or less than 721.0 eV.

Further, for the Ga—N bond component and the Ga—O bond component that are obtained by separating the waveform of the actually measured Ga 2p spectrum into the "Ga—N component" and the "Ga—O component", a ratio of respective intensities (that is, the intensity ratio of Ga—O/Ga—N) was 1.9. If the weight or quantity of the gallium oxide in the transition layer 42 of the second sample is equal to or less than that of the gallium oxide in the transition layer 42, the intensity ratio of Ga—O/Ga—N may be equal to or less than 1.9. Further, in another example, the intensity ratio of Ga—O/Ga—N may also be equal to or less than 2.0.

Figure 16C:
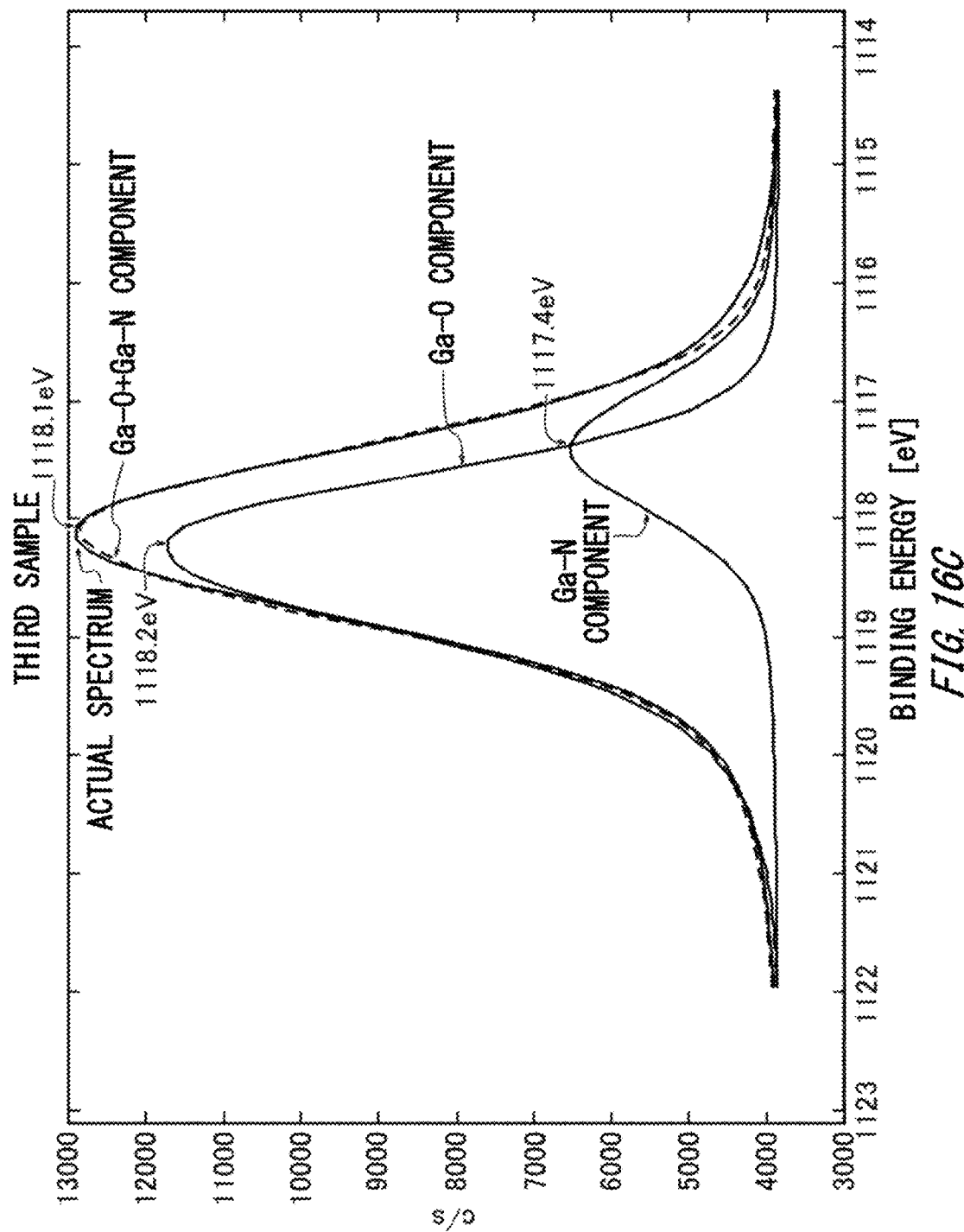
FIG. 16C shows a result of analyzing the Ga2p spectrum of the third sample.

FIG. 16C shows an XPS analysis result for a third sample. The vertical axis and the horizontal axis are the same as those of FIG. 16A and FIG. 16B. In FIG. 16C, the curve having the highest intensity peak is an actually measured peak of the Ga 2p obtained by performing the XPS analysis on the interface region, and the peak energy is 1118.1 eV. The third highest "Ga—O component" peak is the component of the Ga—O bond, and the peak energy is 1118.2 eV. The fourth highest "Ga—N component" is the component of the Ga—N bond, and the peak energy is 1117.4 eV. Also, the second highest "Ga—O+Ga—N component" peak (the dashed line) is a combination of the component of the Ga—O bond and the component of the Ga—N bond.

For the third sample, the difference $\Delta_{Ga}$ between the peak binding energy 1118.1 eV of the Ga 2p spectrum and the Ga—N binding energy 1117.4 eV was 0.7 eV. Note that if the weight or quantity of the gallium oxide in the transition layer 42 is equal to or less than that of the gallium oxide in the transition layer 42 of the third sample, the energy difference $\Delta_{Ga}$ may be equal to or less than 0.7 eV.

Also, the difference $\Delta_{Ga-N}$ between the peak binding energy 1118.1 eV of the Ga 2p spectrum and the peak binding energy 397.0 eV of the N is spectrum was 721.1 eV. Note that if the amount or quantity of the gallium oxide in the transition layer 42 is equal to or less than that of the gallium oxide in the transition layer 42 of the third sample, the energy difference $\Delta_{Ga-N}$ may be equal to or less than 721.1 eV.

Further, the ratio of the intensity of the Ga—O bond component to the intensity of the Ga—N bond component (that is, the intensity ratio of Ga—O/Ga—N) was 3.3. If the amount or quantity of the gallium oxide in the transition layer 42 is equal to or less than that of the gallium oxide in the transition layer 42 of the third sample, the intensity ratio of Ga—O/Ga—N may be equal to or less than 3.3, or may also be equal to or less than 3.0.

FIG. 17 shows a relation between the difference $\Delta_{Ga}$, which is between the peak binding energy of the Ga 2p spectrum and the binding energy of the Ga—N bond component, and the field effect mobility. The horizontal axis indicates the difference $\Delta_{Ga}$ [eV] between the peak binding energy of the Ga 2p spectrum and the binding energy of the Ga—N bond component in the XPS analysis. The vertical axis indicates the maximum field effect mobility [cm$^2$/V·s] of the MOS structure described above. If the horizontal axis is taken as X and the vertical axis is taken as Y, the first sample corresponds to (X, Y)=(0.3, 96). Also, the second sample corresponds to (X, Y)=(0.6, 48), and the third sample corresponds to (X, Y)=(0.7, 36).

If the energy difference $\Delta_{Ga}$ is equal to or less than 0.6 eV, the energy difference $\Delta_{Ga-N}$ is equal to or less than 721.0 eV or the intensity ratio of Ga—O/Ga—N is equal to or less than 1.9, the maximum field effect mobility of the MOS structure may be equal to or more than 48 cm$^2$/V·s. That is, if the gallium oxide in the transition layer 42 is less than that of the second sample, the lateral MOSFET 100 and the vertical MOSFETs 200 and 300 may have the maximum field effect mobility of equal to or more than 48 cm$^2$/V·s. Also, if the energy difference $\Delta_{Ga}$ is equal to or less than 0.3 eV, the energy difference $\Delta_{Ga-N}$ is equal to or less than 720.7 eV or the intensity ratio of Ga—O/Ga—N is equal to or less than 0.9, the maximum field effect mobility of the MOS structure may be equal to or more than 96 cm$^2$/V·s. Similarly, if the gallium oxide in the transition layer 42 is less than that of the first sample, the lateral MOSFET 100 and the vertical MOSFETs 200 and 300 may have the maximum field effect mobility of equal to or more than 96 cm$^2$/V·s.

Table 3 described below shows the results of the first to third samples used in the XPS analysis experiments. On the first sample, the O$_2$ plasma treatment was not performed before forming the SiO$_2$ layer 54, and the thermal treatment was not performed after forming the SiO$_2$ layer 54. On the other hand, on the second sample, although the O$_2$ plasma treatment formed on the front surface of the n type GaN layer 70 before forming the SiO$_2$ layer 54, the thermal treatment was not performed on the SiO$_2$ layer 54. On the third sample, the O$_2$ plasma treatment was formed on the front surface of n type GaN layer 70 before forming the SiO$_2$ layer 54, and the thermal treatment was performed on the SiO₂ layer 54 at the temperature of 700° C. in the nitrogen (N₂) gas atmosphere after forming the SiO₂ layer 54.

Also, items (A) to (E) for the first to third samples are shown together in Table 3.

(A) actually-measured peak binding energy of Ga 2p spectrum;

(B) difference $\Delta_{Ga}$ between actually-measured peak binding energy of Ga 2p spectrum and binding energy of Ga—N component;

(C) difference $\Delta_{Ga-N}$ between actually-measured peak binding energy of Ga 2p spectrum and peak binding energy of N 1s spectrum;

(D) intensity ratio of Ga—O/Ga—N of Ga 2p spectrum; and (E) maximum value of field effect mobility of MOSFET transition layer 42 obtained from the XPS analysis are in a one-to-one correspondence relation. Note that when extrapolating an approximately straight line, if the horizontal axis is zero, the vertical axis is not zero and is approximately 0.3 nm. This thickness is approximately 1 atomic layer, and it is considered that the state in which the O atoms are adsorbed on the GaN front surface cannot be evaluated from the STEM image.

The thickness d of the transition layer 42 obtained from the XPS analysis was calculated by the intensity ratio $I_{OX}/I_{GaN}$ of the Ga—O bond component and the Ga—N bond component by using the following expression (1). Note that in the expression (1), "x" means multiplication.

$$d = \lambda_{OX} \times \cos\theta \times \ln[(\lambda_{GAN}N_{GAN})/(\lambda_{OX}N_{OX}) \times (I_{OX}/I_{GAN}) + 1] \quad (1)$$

TABLE 3

| SAMPLE | O₂ PLASMA TREATMENT BEFORE FORMING SiO₂ LAYER 54 | THERMAL TREATMENT AFTER FORMING SiO₂ LAYER 54 | (A) ACTUALLY MEASURED PEAK BINDING ENERGY OF Ga 2p SPECTRUM [eV] | (B) DIFFERENCE $\Delta_{Ga}$ [eV] | (C) DIFFERENCE $\Delta_{Ga-N}$ [eV] | (D) INTENSITY RATIO OF Ga—O/Ga—N | (E) MAXIMUM VALUE OF FIELD EFFECT MOBILITY [cm²/V · s] |
|---|---|---|---|---|---|---|---|
| FIRST | NO | NO | 1117.7 | 0.3 | 720.7 | 0.9 | 96 |
| SECOND | YES | NO | 1118.0 | 0.6 | 721.0 | 1.9 | 48 |
| THIRD | YES | YES | 1118.1 | 0.7 | 721.1 | 3.3 | 36 |

Figure 18:
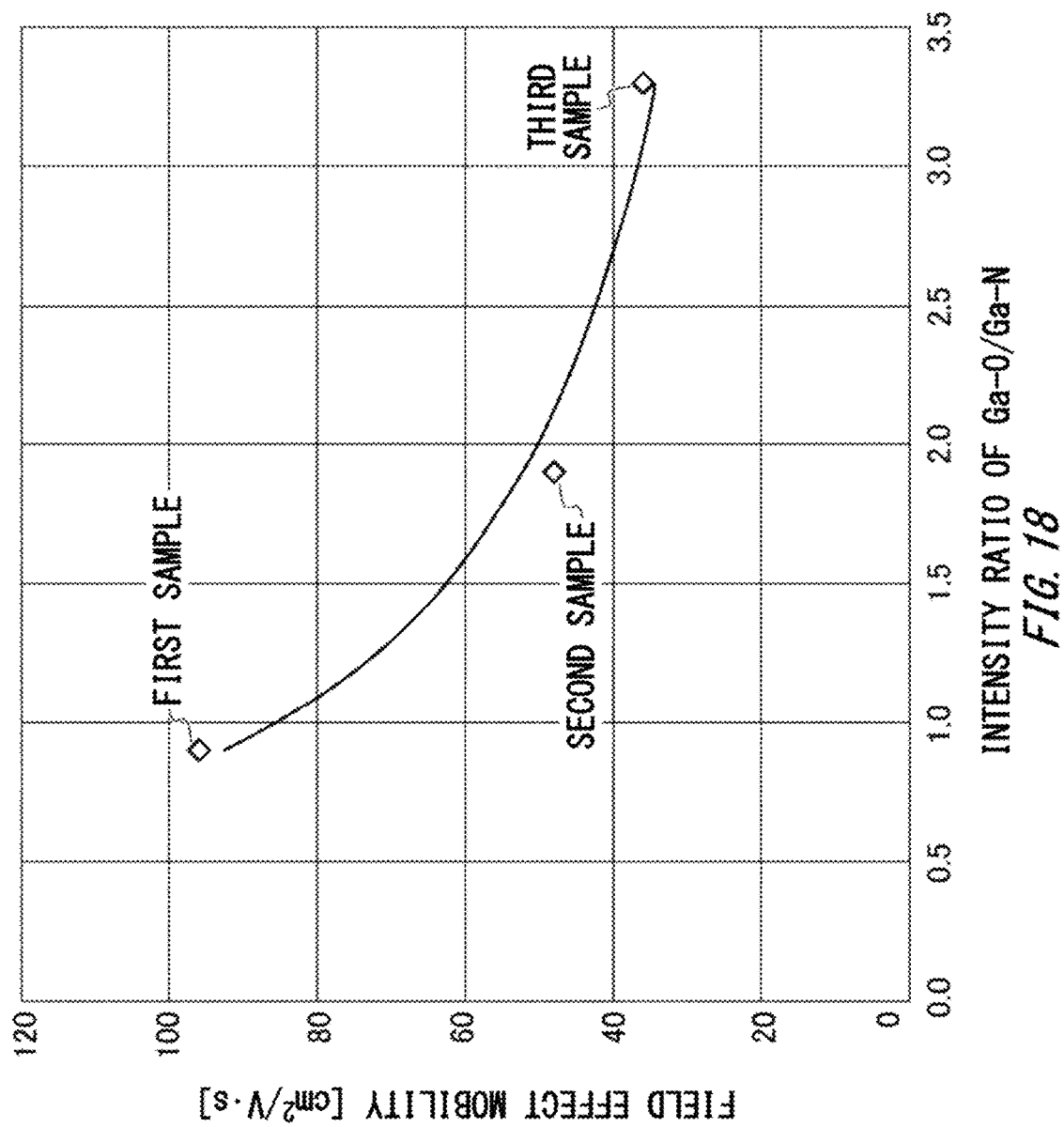
FIG. 18 shows a relation between an intensity ratio of Ga—O component/Ga—N component in the Ga 2p spectrum, and the field effect mobility.

FIG. 18 shows a relation between the intensity ratio of Ga—O component/Ga—N component in the Ga 2p spectrum and the field effect mobility. The horizontal axis is the intensity ratio of Ga—O component/Ga—N component, and the vertical axis is the maximum field effect mobility of MOSFET. If the horizontal axis is taken as X and the vertical axis is taken as Y, the first sample corresponds to (X, Y)=(0.9, 96). Also, the second sample corresponds to (X, Y)=(1.9, 48), and the third sample corresponds to (X, Y)=(3.3, 36). FIG. 18 shows that the field effect mobility rises in response to the reduction of the gallium oxide, and the tendency approximately matches FIG. 17.

Figure 19:
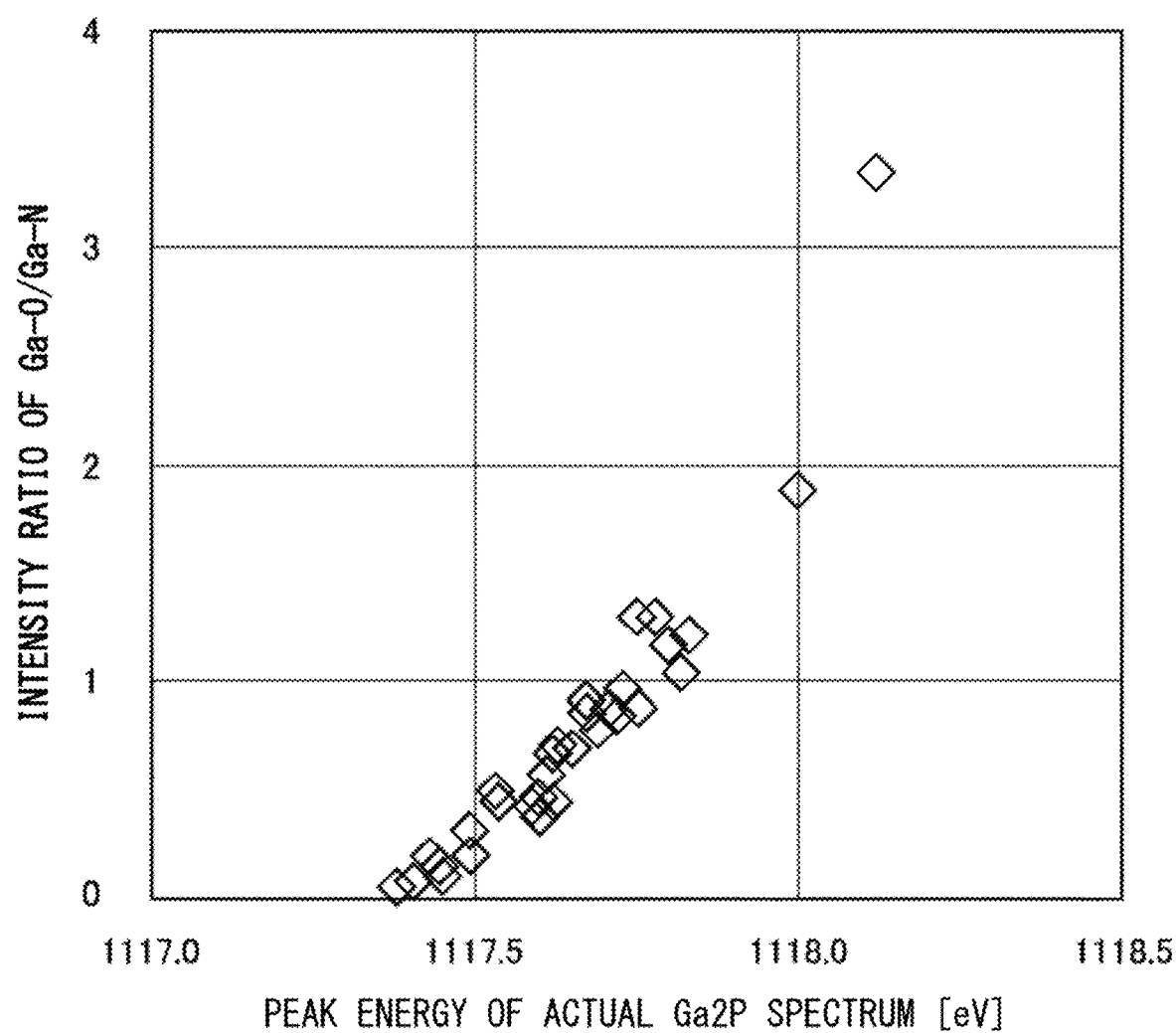
FIG. 19 shows a relation between the peak binding energy of the Ga 2p spectrum, and the intensity ratio of Ga—O component/Ga—N component.

FIG. 19 shows a relation between the peak binding energy of the Ga 2p spectrum and the intensity ratio of Ga—O component/Ga—N component in the XPS analysis. The horizontal axis indicates the actually measured peak binding energy [eV] in the XPS analysis. The vertical axis indicates the intensity ratio of Ga—O component/Ga—N component. In addition to the above-described first to third samples, FIG. 19 further shows the XPS analysis results for a plurality of samples. According to the results of FIG. 19, it can be understood that as the energy of intensity peak of the actual measurement value increases, the gallium oxide in the transition layer 42 tends to increase.

Figure 20:
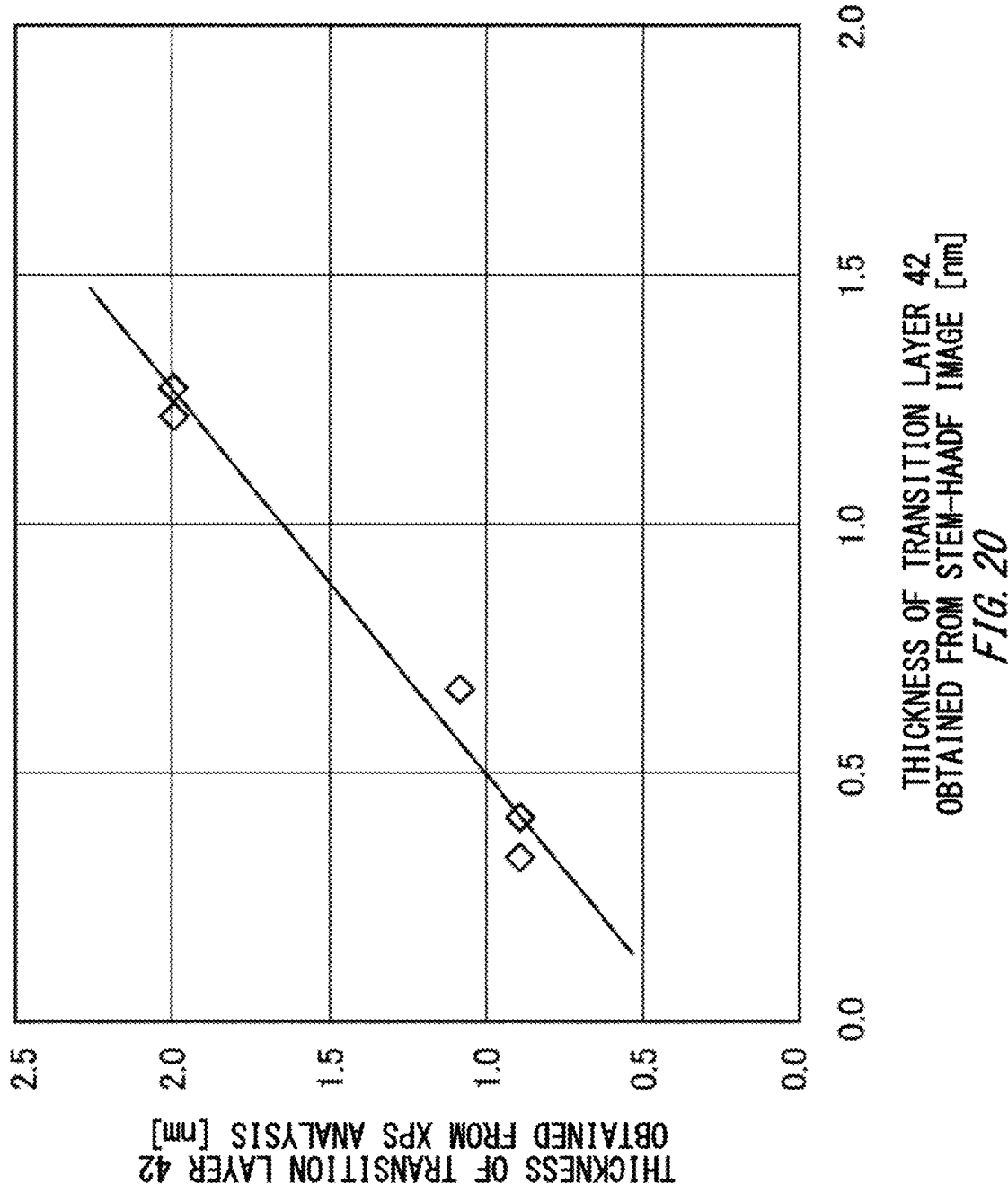
FIG. 20 shows a relation between the thickness of the transition layer 42 obtained from the STEM-HAADF image and the thickness of the transition layer 42 analyzed by XPS.

FIG. 20 shows a relation between the thickness of the transition layer 42 obtained from the STEM-HAADF image and the thickness of the transition layer 42 obtained from the XPS analysis. The horizontal axis indicates the thickness [nm] of the transition layer 42 obtained from the STEM-HAADF image. The vertical axis indicates the thickness [nm] of the transition layer 42 obtained from the XPS analysis, and the deriving method is shown as below. Because a linear relation was obtained as shown in FIG. 20, it can be said that the thickness of the transition layer 42 utilizing the STEM-HAADF image and the thickness of the Herein, θ is a photoelectron extraction angle, $N_{GaN}$ and $N_{OX}$ are respectively the Ga atom densities in the GaN layer and the Ga oxide layer. $\lambda_{GAN}$ and $X_{OX}$ are respectively escape depths of Ga 2p electrons in the GaN layer and the Ga oxide layer, and were calculated by the semiempirical formula described in [Non-Patent Document 1]. The electron escape depth λ (nm) relative to the compound is represented by the following expression (2), where E indicates energy of photoelectron (eV) and a indicates a thickness of a single atomic layer (nm).

$$\lambda(\text{nm}) = 538aE^{-2} + 0.72(a^{3/2}E^{1/2}) \quad (2)$$

[Non-Patent Document 1] Takaharu ONISHI, Yasuhiro HORIIKE, Kazuhiro YOSHIHARA (Apr. 20, 1995), Solid Surface Analysis I, first impression, Kodansha Ltd., p. 28

Note that even if the transition layer 42 does not exist or the thickness of the transition layer 42 is within the above-described range, if there is a roughness on an interface 94 of the p type GaN layer 30 (refer to FIG. 21), a variation in the field effect mobility of the interface 94 of the p type GaN layer 30 may occur. In the present specification, if the transition layer 42 does not exist, a boundary of the p type GaN layer in a region on which the gate insulating layer 44 was laminated on the p type GaN layer 30 is taken as the interface 94. Also, if the transition layer 42 exists, a boundary between the gate insulating layer 44 and the transition layer 42 is taken as the interface 94. The followings describe the case where the transition layer 42 does not exist.

A relation between the roughness on the interface 94 of the p type GaN layer 30 and the field effect mobility is described using samples No. 5 and No. 6. The sample No. 5 is a sample on which the thermal treatment was performed after forming the gate insulating layer 44, and the sample No. 6 was is a sample on which no thermal treatment was performed after forming the gate insulating layer 44. The other manufacturing conditions of the sample No. 5 are the same as those of the sample No. 6.

Figure 21:
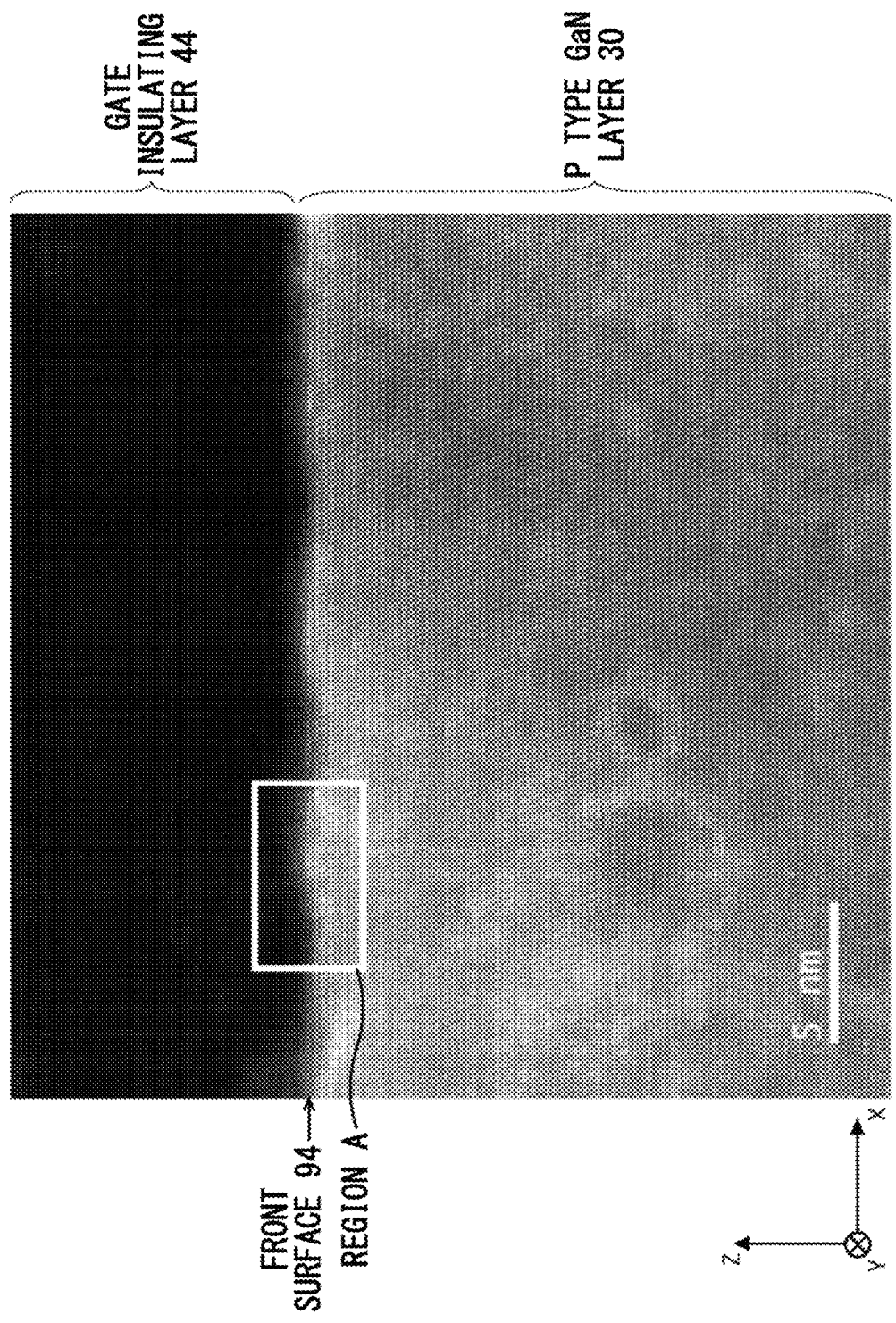
FIG. 21 shows a STEM-HAADF image of a cross section of sample No. 5 observed with a transmission electron microscope of a high resolution.

FIG. 21 shows a STEM-HAADF image of a cross section of the sample No. 5 observed with a transmission electron microscope of high resolution. In the sample No. 5, a clear transition layer 42 is not observed on the boundary between the p type GaN layer 30 and the gate insulating layer 44. However, the crystal surface on which atoms of elements constituting the p type GaN layer on the interface 94 are regularly arranged has the roughness in the Z-axis direction.

Figure 22:
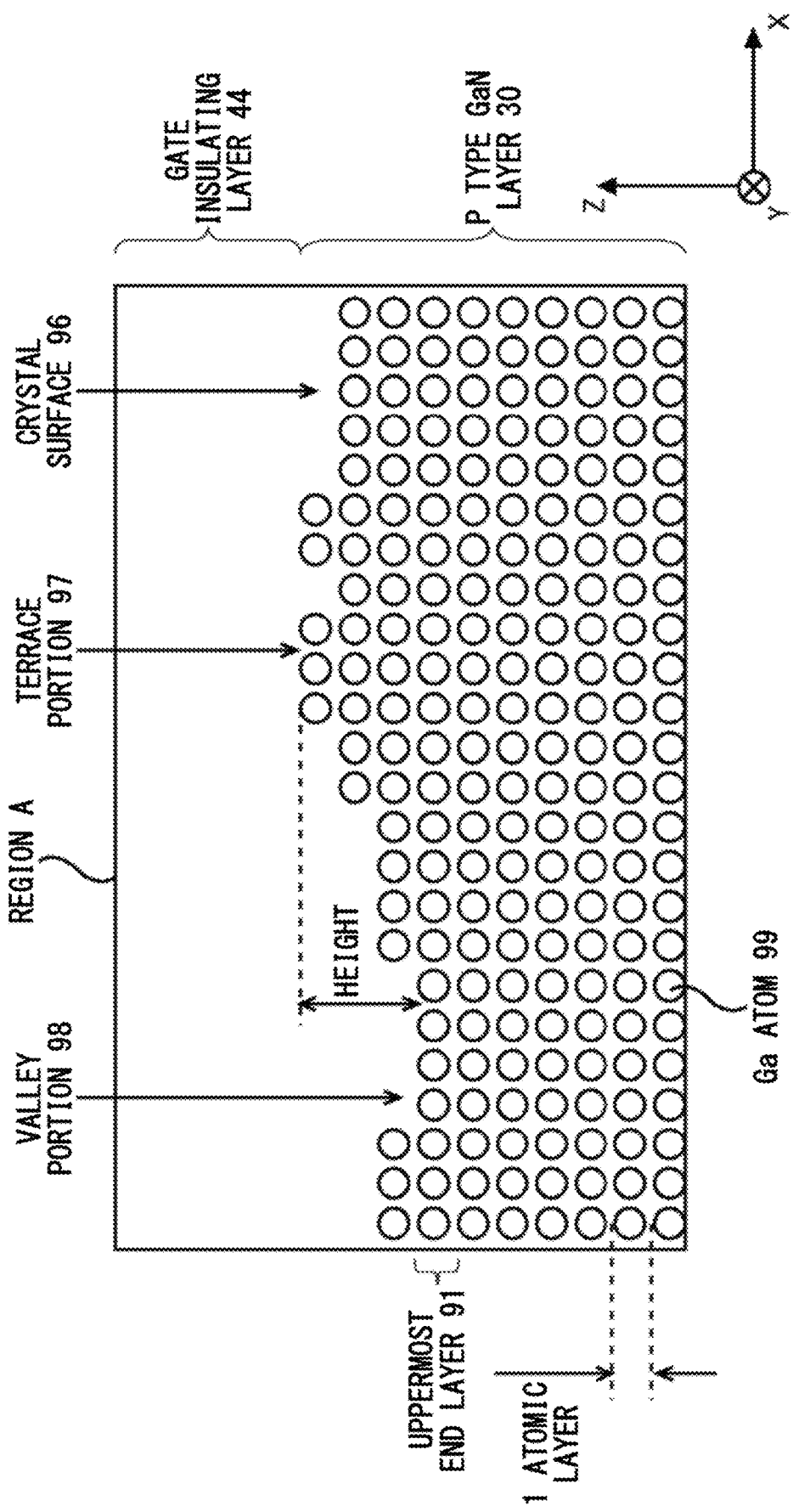
FIG. 22 shows an enlarged schematic diagram of the region A in FIG. 21.

FIG. 22 is an enlarged schematic diagram of the region A in FIG. 21. In FIG. 22, the particulate Ga atoms in FIG. 21 are schematically shown as Ga atoms 99 in circular marks. A crystal surface 96 in the present example has the roughness in the Z-axis direction. The crystal surface 96 indicates a surface on which the Ga atoms 99 are arranged in a lattice-like form in a certain period.

In the present specification, a surface on which the atoms are connected to one another within a predetermined measurement region (a region having a length of 30 nm in a predetermined direction such as the X-axis direction, for example) of the p type GaN layer 30 may be taken as an uppermost end layer 91 and a height of a projection portion from the uppermost end layer 91 may be represented by a width in the Z-axis direction or the number of atomic layers in the Z-axis direction. The uppermost end layer 91 is, as one example, a Ga layer on the uppermost side among the Ga layers on which no Ga atom 99 is missed within the above-described measured region. Also, the height of the roughness or a projection portion indicates a distance in the Z-axis direction between the crystal surface 96 existing on the most end on the positive side in the Z-axis direction, and the crystal surface 96 existing on the most end on the negative side in the Z-axis direction within the predetermined measurement region. In the example of FIG. 22, the height of the projection portion is 3 atomic layers.

Also, in a region on the positive side in the z-axis direction from a surface (the uppermost end layer 91) in which the atoms are connected to one another within the predetermined measurement region of the p type GaN layer 30, a region in which three or more Ga atoms 99 were continuously arranged in a direction parallel to the interface 94 of the p type GaN layer 30 is taken as a terrace portion 97. A distance in the Z-axis direction between the terrace portion 97 existing on the most end on the positive side in the Z-axis direction and a valley portion 98 existing on the most end on the negative side in the Z-axis direction within a predetermined measurement region may also be used as the height of the roughness of the crystal surface 96. The valley portion 98 is a region sandwiched by the terrace portions 97 in a direction parallel to the interface 94 of the p type GaN layer 30, and is a region in which three or more Ga atoms 99 are continuously missed on the uppermost end layer 91. That is, in the valley portion 98, the Ga atoms 99 are not regularly arranged.

Note that the STEM-HAADF image of the sample No. 5 was obtained under the following conditions. The sample was thinned, and the thickness of the sample in a direction perpendicular to an observation direction was set to 20 nm. An acceleration voltage of electrons in the transmission electron microscope was set to 200 kV, a magnification of an observation range was set to 5 million times, and a region having a width of at least equal to or more than 30 nm was observed. The obtained STEM-HAADF images were binarized based on the contrast to determine the presence or absence of the Ga atoms 99 at the respective positions. In the STEM-HAADF images, a position at which the Ga atom 99 exists was in white, and a position at which the Ga atom 99 does not exist was in black. On the interface 94 of the p type GaN layer 30, relative to the maximum contrast, it was determined that the Ga atom 99 exists at a position having a contrast of equal to or more than 50%. In the present specification, the height of the unevenness of the crystal surface 96 may be determined based on the STEM-HAADF images obtained under the above-described conditions. The above-described conditions may also have an error within 10%.

Figure 23:
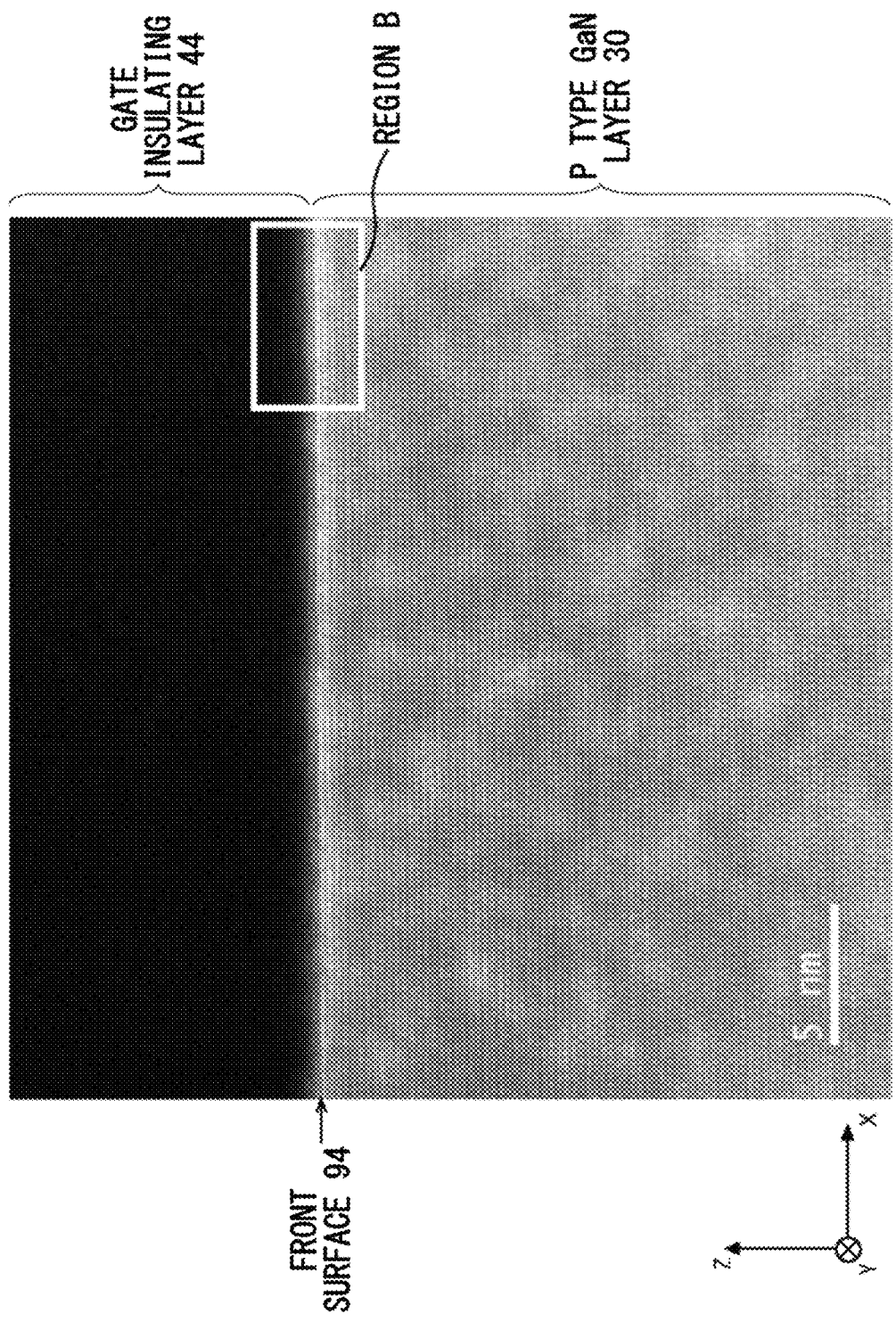
FIG. 23 shows a STEM-HAADF image of a cross section of sample No. 6 observed with a transmission electron microscope of a high resolution.

FIG. 23 shows a STEM-HAADF image of a cross section of the sample No. 6 observed with a transmission electron microscope of high resolution. In the sample No. 6, no clear transition layer 42 was observed on the boundary between the p type GaN layer 30 and the gate insulating layer 44, either. Also, the roughness in the Z-axis direction is hardly generated on the crystal surface on which the atoms of the elements constituting the p type GaN layer on the interface 94 are regularly arranged.

Figure 24:
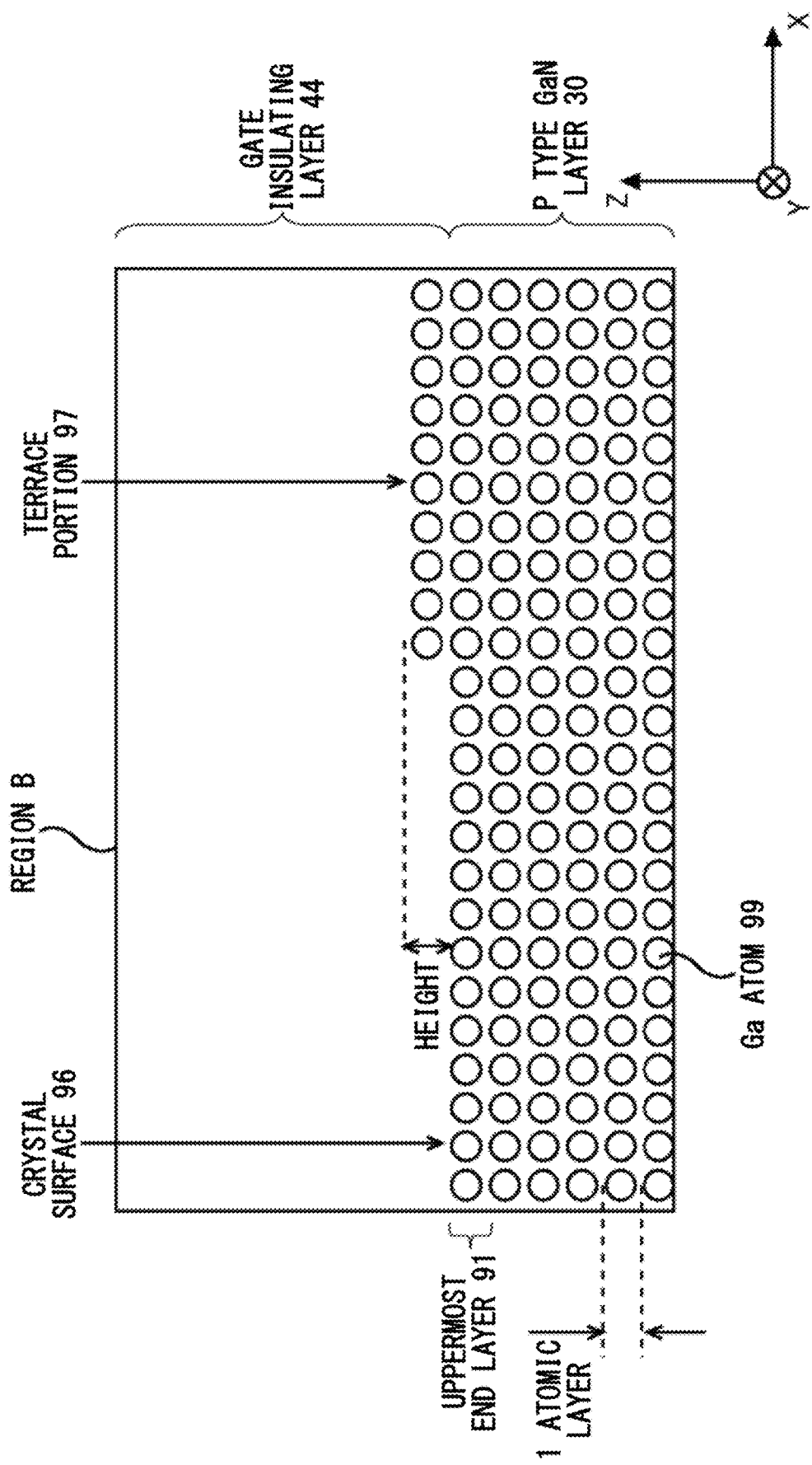
FIG. 24 is an enlarged schematic diagram of the region B in FIG. 22.

FIG. 24 is an enlarged schematic diagram of the region B in FIG. 22. As shown in FIG. 24, the unevenness on the crystal surface 96 of the sample No. 6 is 1 atomic layer. The sample No. 6 had a higher field effect mobility on the front surface of the p type GaN layer 30 than that of the sample No. 5. It is considered that this is because the electron scattering caused by the roughness on the crystal surface 96 is low in the sample No. 6.

Figure 25:
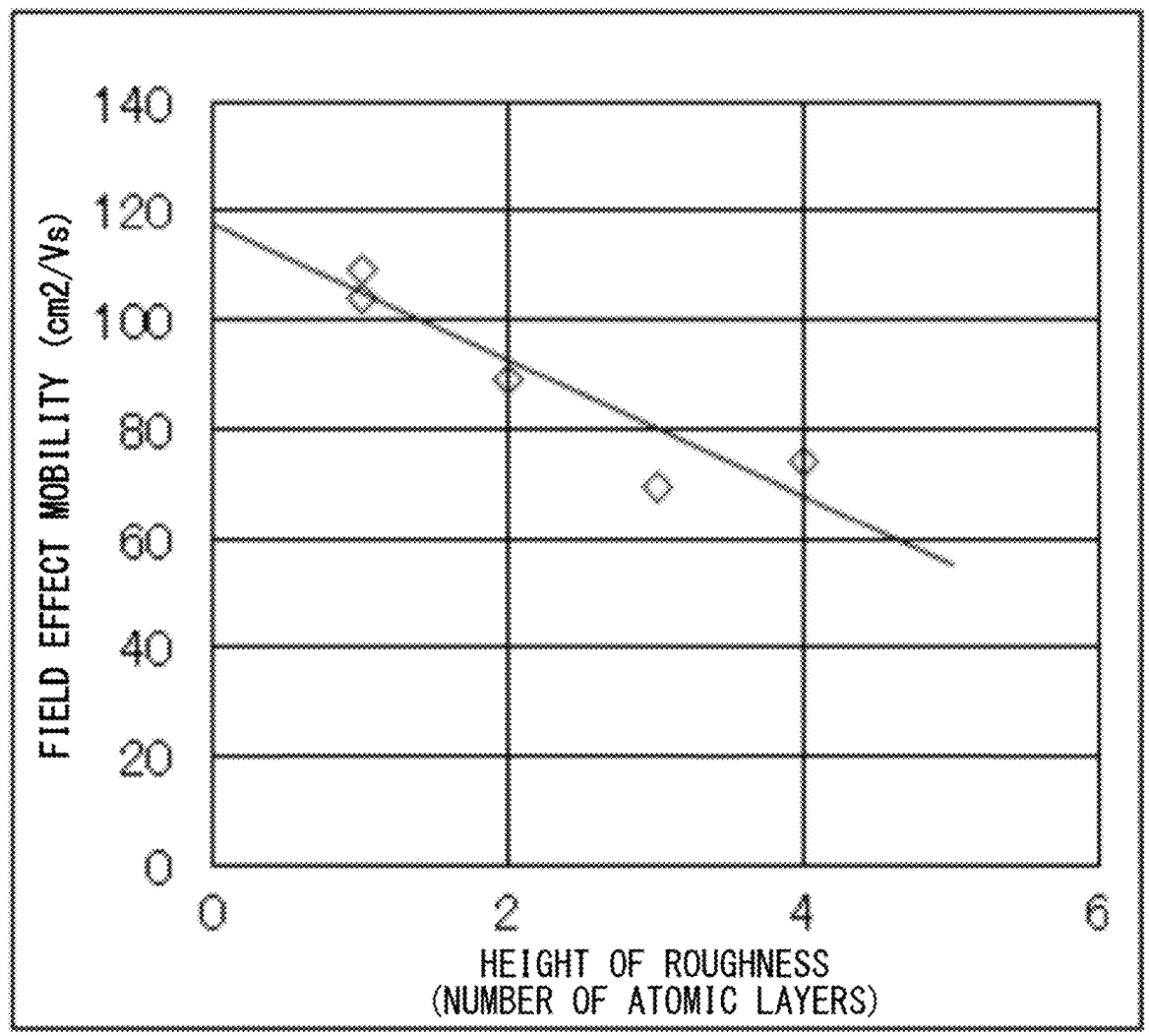
FIG. 25 shows a relation between the height of the roughness on the front surface of the p type GaN layer 30 and the field effect mobility.

FIG. 25 is a graph showing a relation between the height of the roughness on the front surface of the p type GaN layer 30 and the field effect mobility. In the present example, in addition to the samples No. 5 and No. 6, another sample on which the height of the roughness was changed was also measured. No transition layer 42 was observed on each sample.

The horizontal axis in FIG. 25 indicates the height of the roughness by a number of layers of the atomic layers. Also, the height of the roughness indicates the maximum height in an observation range in a direction parallel to the p type GaN layer 30 (in the present example, a range of 30 nm). For the height of the roughness, an average value in the observation range may also be used, an RMS value may also be used, or a value processed by another method may also be used. Note that in the present example, the uneven height was determined by using the terrace portion 97 and the valley portion 98.

As shown in FIG. 25, the greater the roughness, the lower the field effect mobility. As described above, it is considered that if the roughness becomes greater, the electron scattering occurs on the crystal surface 96 and the mobility is lowered.

Figure 26:
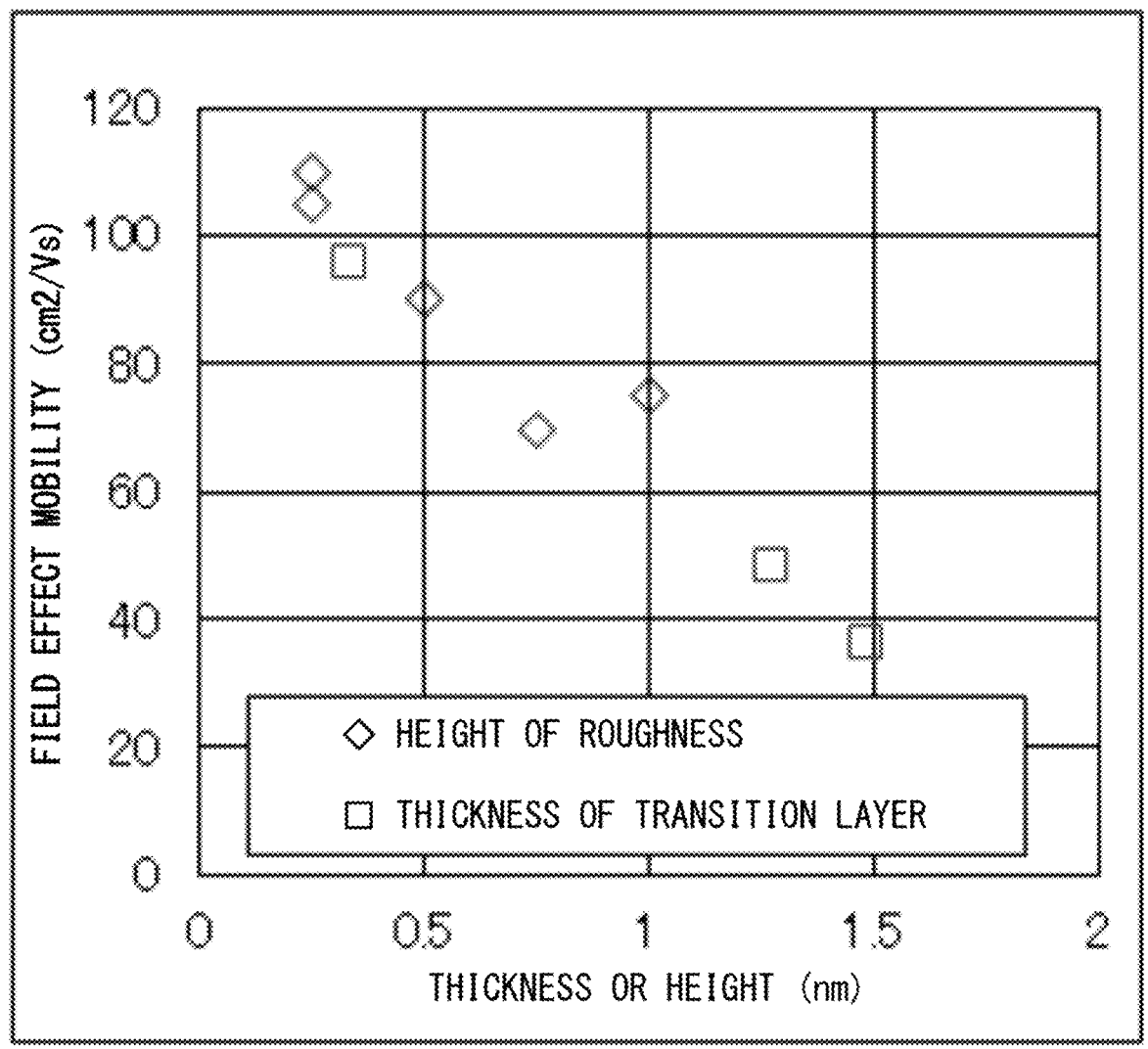
FIG. 26 is a graph obtained by superposing the graph shown in FIG. 25 and the graph shown in FIG. 5.

FIG. 26 is a graph obtained by superposing the graph shown in FIG. 25 and the graph shown in FIG. 5. Note that the sample in FIG. 5 and the sample in FIG. 25 are different samples. As shown in FIG. 26, the influence of the height of the roughness on the field effect mobility and the influence of the thickness of the transition layer 42 on the field effect mobility have a similar tendency.

In the measurement region having the length of 30 nm in the measurement direction parallel to the interface of the p type GaN layer 30, the height of the roughness in the depth direction perpendicular to the interface of the p type GaN layer 30 may be equal to or less than 6 atomic layers. Accordingly, a degradation of the field effect mobility caused by the roughness can be made to the same level as that of a degradation of the field effect mobility cause by the transition layer 42 having the thickness of equal to or less than 1.5 nm. The height of the roughness may also be equal to or less than 1.5 nm. Also, as described above, in the measurement region having the length of 30 nm, the height from the upper end of the terrace portion 97 to the lower end of the valley portion 98 may also be equal to or less than 6 atomic layers or equal to or less than 1.5 nm.

The height of the roughness may be less than the thickness of the transition layer 42. Accordingly, the degradation of the field effect mobility caused by the unevenness can be less than the degradation of the field effect mobility cause by the transition layer 42. Also, the uneven height may be equal to or less than 3 atomic layers (equal to or less than 0.75 nm), may be equal to or less than 2 atomic layers (equal to or less than 0.5 nm) or may also be equal to or less than 1 atomic layer (equal to or less than 0.25 nm).

Note that a manufacturing condition of the sample No. 6 is as the followings. The gate insulating layer 44 is set to a single layer of silicon dioxide. Specifically, discharge was performed in a state in which TEOS and oxygen gas flow by using a remote plasma CVD device to form the gate insulating layer 44 having the thickness of 100 nm on the front surface of the p type GaN layer 30. Because as the $GaO_x$ layer is formed on the front surface of the p type GaN layer 30, the field effect mobility tends to become small, the gate insulating layer 44 was formed, without performing the $O_2$ plasma treatment to stabilize the plasma. After forming the gate insulating layer 44, the thermal treatment was not performed on the gate insulating layer 44.

Although the manufacturing condition of the sample No. 5 is similar to that of the sample No. 6, the thermal treatment was performed for 30 minutes at 700° C. in the nitrogen atmosphere after forming the gate insulating layer 44.

Figure 27:
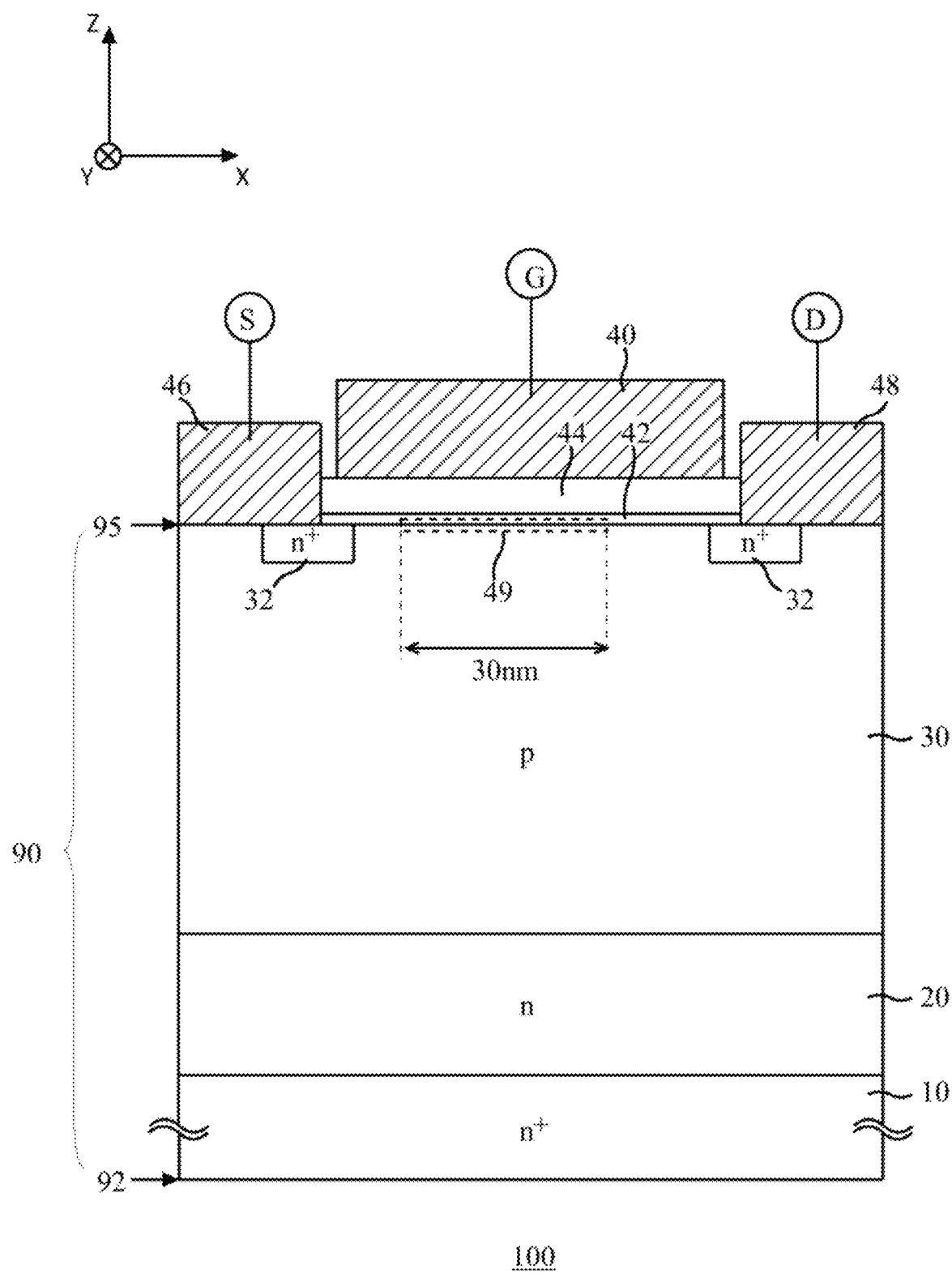
FIG. 27 shows one example of the region 49 for measuring the roughness.

FIG. 27 shows one example of the measurement region 49 for measuring the roughness. In the present example, the vicinity of the front surface of the p type GaN layer 30 in the lateral MOSFET 100 shown in FIG. 1 was taken as the measurement region 49. The measurement region 49 is a region including the front surface of the p type GaN layer 30 and has a width of 30 nm in the direction parallel to the front surface of the p type GaN layer 30. The measurement region 49 of the present example has a width of 30 nm in a direction in which electrons flow when the lateral MOSFET 100 is turned on. The measurement region 49 of the present example has a width of 30 nm in a direction (the X-axis direction) connecting the source electrode 46 and the drain electrode 48 under the gate electrode 40. The lateral MOSFET 100 has the roughness height of equal to or less than 6 atomic layers or equal to or less than 1.5 nm in a range of 30 nm of the measurement region 49. The measurement region 49 may be arranged in the middle between the source electrode 46 and the drain electrode 48.

In the descriptions from FIG. 15 to FIG. 27, the n type GaN layer being the gallium nitride based semiconductor layer of the second conductivity type was used. However, a similar characteristic is obtained regardless of the type of the majority carrier in the semiconductor. For that reason, a similar result is also obtained even if the gallium nitride based semiconductor layer of the second conductivity type is taken as the p type GaN layer.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A gallium nitride based semiconductor device, comprising:
   a gallium nitride based semiconductor layer of a first conductivity type that includes a substantially uniform concentration of nitrogen;
   an insulating layer that is provided on the gallium nitride based semiconductor layer and includes two or more kinds of metal elements, wherein a first metal element includes a substantially uniform concentration; and
   a transition layer that is provided in a vicinity of a boundary between the gallium nitride based semiconductor layer and the insulating layer and is constituted of elements of the gallium nitride based semiconductor layer and of the insulating layer, wherein
   a thickness of the transition layer is less than 0.75 nm,
   in the insulating layer, a second metal element has a concentration that is lower than the substantially uniform concentration of the first metal element,
   in the transition layer, a first ratio of a number of nitrogen atoms to a number of gallium atoms is smaller than a second ratio of a number of nitrogen atoms to a number of gallium atoms in the gallium nitride based semiconductor layer, and
   (a) when the concentration of the second metal element included in the insulating layer forms a peak with respect to a depth distribution of the second metal element in the insulating layer, and the concentration of the second metal element on either side of the peak decreases as a distance from the peak increases, then a first ratio of a number of oxygen atoms to a number of atoms of the second metal element in the transition layer is larger than a second ratio of a number of oxygen atoms to a number of atoms of the second metal element at a position of the peak; or
   (b) when the concentration of the second metal element included in the insulating layer does not form the peak with respect to the depth distribution of the second metal element in the insulating layer, then a third ratio of a number of oxygen atoms to a number of atoms of the first metal element in the transition layer is larger than a fourth ratio of a number of oxygen atoms to a number of atoms of the first metal element in the insulating layer.

2. The gallium nitride based semiconductor device according to claim 1, wherein
   the insulating layer is a metal oxide layer, and
   the metal oxide layer includes at least any one of a silicon oxide layer and an aluminum oxide layer.

3. The gallium nitride based semiconductor device according to claim 2, wherein
   the metal oxide layer includes:
   the aluminum oxide layer; and
   the silicon oxide layer that is at least partially positioned on the aluminum oxide layer.

4. The gallium nitride based semiconductor device according to claim 1, wherein a thickness of the transition layer is equal to or less than 0.5 nm.

5. The gallium nitride based semiconductor device according to claim 1, wherein
on an interface of the gallium nitride based semiconductor layer on which the insulating layer is laminated, a crystal surface in which atoms of elements included in the gallium nitride based semiconductor layer are regularly arranged has a roughness in a depth direction perpendicular to the interface of the gallium nitride based semiconductor layer, and
a height of the roughness in a measurement region that has a length of 30 nm in a direction parallel to the interface of the gallium nitride based semiconductor layer is equal to or less than 6 atomic layers.

6. The gallium nitride based semiconductor device according to claim 5, wherein
the crystal surface of the gallium nitride based semiconductor layer on the interface has terrace portions in which a plurality of atoms of elements included in the gallium nitride based semiconductor layer are continuously regularly arranged and valley portions in which atoms of elements included in the gallium nitride based semiconductor layer are not regularly arranged, and
in the measurement region, a height from an upper end of the terrace portions to a lower end of the valley portions is equal to or less than 6 atomic layers.

7. The gallium nitride based semiconductor device according to claim 5, wherein
the height of the roughness is equal to or less than 1.5 nm.

8. The gallium nitride based semiconductor device according to claim 2, wherein
the gallium nitride based semiconductor device further includes a gate electrode in contact with the metal oxide layer on the metal oxide layer, and
the gallium nitride based semiconductor device is a MOSFET having a MOS structure that includes the gate electrode, the metal oxide layer, the transition layer and the gallium nitride based semiconductor layer.

9. The gallium nitride based semiconductor device according to claim 8, wherein
a maximum field effect mobility of the MOS structure is equal to or more than 48 cm$^2$/V·s.

10. The gallium nitride based semiconductor device according to claim 8, wherein
a maximum field effect mobility of the MOS structure is equal to or more than 96 cm$^2$/V·s.

11. A gallium nitride based semiconductor device, comprising:
a gallium nitride based semiconductor layer of a first conductivity type that includes a substantially uniform concentration of nitrogen;
an insulating layer that is provided on the gallium nitride based semiconductor layer and includes a substantially uniform concentration of a first metal element; and
a transition layer that is provided in the vicinity of a boundary between the gallium nitride based semiconductor layer and the insulating layer and is constituted of elements of the gallium nitride based semiconductor layer and of the insulating layer, wherein
a thickness of the transition layer is less than 0.75 nm, wherein the thickness of the transition layer is defined as a distance between (i) a depth position where a concentration of nitrogen in the gallium nitride based semiconductor layer is half of the substantially uniform concentration of nitrogen and (ii) a depth position where a concentration of the first metal element in the insulating layer is half of the substantially uniform concentration of the first metal element.

12. A gallium nitride based semiconductor device, comprising:
a gallium nitride based semiconductor layer of a first conductivity type that includes a substantially uniform concentration of nitrogen;
an insulating layer that is provided on the gallium nitride based semiconductor layer and includes a substantially uniform concentration of a first metal element; and
a transition layer that is provided in the vicinity of a boundary between the gallium nitride based semiconductor layer and the insulating layer and is constituted of elements of the gallium nitride based semiconductor layer and of the insulating layer, and
a second metal element provided between the gallium nitride based semiconductor layer and the insulating layer;
wherein
a thickness of the transition layer is less than 0.75 nm, and
the thickness of the transition layer is defined as a distance between (i) a depth position where a concentration of nitrogen in the gallium nitride based semiconductor layer is half of the substantially uniform concentration of nitrogen and (ii) a depth position where a concentration of the second metal element is half of a highest concentration of the second metal element on a side of the depth position of the highest concentration of the second metal element that is towards the gallium nitride based semiconductor layer.

13. The gallium nitride based semiconductor device according to claim 11, wherein concentrations for purposes of determining depth positions are based on atomic composition distributions fit by an arctan function.

14. The gallium nitride based semiconductor device according to claim 1, further comprising:
a gate electrode in contact with the insulating layer, wherein
the insulating layer is provided on a surface of the gallium nitride layer,
the transition layer is provided in the vicinity of a boundary between the surface of the gallium nitride based semiconductor layer and the insulating layer, and
the gallium nitride based semiconductor layer includes a channel region extending along the surface of the gallium nitride based semiconductor layer, the channel region in contact with the transition layer.

15. The gallium nitride based semiconductor device according to claim 1, further comprising:
a trench provided in the gallium nitride based semiconductor layer, the insulating layer further provided on an inner wall of the trench; and
a gate electrode in contact with the insulating layer, wherein
the transition layer is provided in the vicinity of a boundary between the gallium nitride based semiconductor layer and the insulating layer provided on the inner wall of the trench, and
the gallium nitride based semiconductor layer includes a channel region extending along the inner wall of the trench, the channel region in contact with the transition layer.

16. A gallium nitride based semiconductor device, comprising:
- a gallium nitride based semiconductor layer of a first conductivity type that includes a substantially uniform concentration of nitrogen;
- an insulating layer that is provided on the gallium nitride based semiconductor layer and includes a substantially uniform concentration of a first metal element; and
- a transition layer that is provided in the vicinity of a boundary between the gallium nitride based semiconductor layer and the insulating layer and is constituted of elements of the gallium nitride based semiconductor layer and of the insulating layer, wherein
- a thickness of the transition layer is less than 0.75 nm
- the insulating layer is a metal oxide layer including an aluminum oxide layer and a silicon oxide layer that is at least partially positioned on the aluminum oxide layer.

17. A manufacturing method of a gallium nitride based semiconductor device, comprising:
- forming a gallium nitride based semiconductor layer of a first conductivity type;
- forming a layer containing two or more kinds of metal elements on the gallium nitride based semiconductor layer as an insulating layer; and
- forming a silicon oxide layer on the metal element containing layer, thereby a transition layer is formed in a vicinity of a boundary between the gallium nitride based semiconductor layer and the insulating layer, the transition layer being constituted of elements of the gallium nitride based semiconductor layer and of the insulating layer, wherein
- a thickness of the transition layer is less than 0.75 nm: and wherein
- in the insulating layer, a first metal element has a substantially uniform concentration;
- in the insulating layer, a second metal element has a concentration that is lower than the substantially uniform concentration of the first metal element,
- in the transition layer, a first ratio of a number of nitrogen atoms to a number of gallium atoms is smaller than a second ratio of a number of nitrogen atoms to a number of gallium atoms in the gallium nitride based semiconductor layer, and
- (a) when the concentration of the second metal element included in the insulating layer forms a peak with respect to a depth distribution of the second metal element in the insulating layer, and the concentration of the second metal element on either side of the peak decreases as a distance from the peak increases, then a first ratio of a number of oxygen atoms to a number of atoms of the second metal element in the transition layer is larger than a second ratio of a number of oxygen atoms to a number of atoms of the second metal element at a position of the peak; or
- (b) when the concentration of the second metal element included in the insulating layer does not form the peak with respect to the depth distribution of the second metal element in the insulating layer, then a third ratio of a number of oxygen atoms to a number of atoms of the first metal element in the transition layer is larger than a fourth ratio of a number of oxygen atoms to a number of atoms of the first metal element in the insulating layer.

18. The manufacturing method of the gallium nitride based semiconductor device according to claim 17, wherein the forming the metal element containing layer includes:
- forming a metal layer; and
- oxidizing the metal layer in an atmosphere containing oxygen.

19. The manufacturing method of the gallium nitride based semiconductor device according to claim 17, wherein the metal element is selected from the group consisting of typical metal elements, Si, Ge, Sn, Pb, Al, Ga, In, Tl, and transition metal elements.

* * * * *